United States Patent
Lu

(10) Patent No.: US 12,082,400 B2
(45) Date of Patent: Sep. 3, 2024

(54) MEMORY CELL STRUCTURE WITH CAPACITOR OVER TRANSISTOR

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 304 days.

(21) Appl. No.: 17/308,071

(22) Filed: May 5, 2021

(65) Prior Publication Data

US 2021/0358918 A1 Nov. 18, 2021

Related U.S. Application Data

(60) Provisional application No. 63/023,878, filed on May 13, 2020.

(51) Int. Cl.
*H10B 12/00* (2023.01)
(52) U.S. Cl.
CPC ................... *H10B 12/373* (2023.02)

(58) Field of Classification Search
CPC .. H10B 12/033; H10B 12/0335; H10B 12/05; H10B 12/30; H10B 12/315; H10B 12/373; H10B 12/482
See application file for complete search history.

(56) References Cited

U.S. PATENT DOCUMENTS

| | | | | |
|---|---|---|---|---|
| 6,031,260 | A  * | 2/2000 | Sunouchi | H10B 12/31 257/E21.654 |
| 6,180,453 | B1 * | 1/2001 | Sung | H10B 12/485 257/E21.654 |
| 2009/0073361 | A1 * | 3/2009 | Yagi | G02F 1/133707 349/124 |
| 2021/0201960 | A1 * | 7/2021 | Lu | H10B 12/053 |

* cited by examiner

*Primary Examiner* — Britt D Hanley
*Assistant Examiner* — Kevin Quinto
(74) *Attorney, Agent, or Firm* — Winston Hsu

(57) ABSTRACT

A memory cell structure includes a silicon substrate, a transistor, a bit line, and a capacitor. The silicon substrate has a silicon surface. The transistor is coupled to the silicon surface, wherein the transistor includes a gate structure, a first conductive region, and a second conductive region. The bit line is electrically coupled to the first conductive region of the transistor and positioned under the silicon surface. The capacitor is over the transistor and electrically coupled to the second conductive region of the transistor.

20 Claims, 73 Drawing Sheets

(a)

(b)

(a)

(b)

(a)

(b)

(a)

(b)

(a)

(b)

MEMORY CELL STRUCTURE WITH CAPACITOR OVER TRANSISTOR

CROSS REFERENCE TO RELATED APPLICATIONS

This application claims the benefit of U.S. Provisional Application No. 63/023,878, filed on May 13, 2020 and entitled "DRAM Cell of a Vertically Integrated 1C-over-1T Structure by Self-Alignment Processes", the contents of which are incorporated herein by reference.

BACKGROUND OF THE INVENTION

1. Field of the Invention

The present invention relates to a memory cell structure with capacitor over transistor, and particularly to a memory cell structure that has denser structure, smaller area, lower leakage currents, higher capacitance, and so on.

2. Description of the Prior Art

One of the most important volatile-memory integrated circuits is the DRAM (Dynamic Random Access Memory) using the 1T1C memory cell, which not only provides the best cost-performance function as main memory and/or buffer memory for computing and communication applications but also has acted as the best driver for technology scaling-down to sustain the Moore's Law from minimum feature size on the silicon from several micrometers down to twenty nanometers or so. Recently the logic technology which continues using embedded SRAM (Static Random Access Memory) as its scaling-down driver reveals the claim of achieving the most advanced technology-node near 5 nanometers into manufacturing. In comparison, the best claim of the technology-node of DRAM is still above 10 to 12 nanometers. The major problem is that a structure of the 1T1C memory cell is very hard to be further scaled down by even using very aggressive design rules which scales down the access transistor (i.e. 1T) and three-dimensional storage capacitor (i.e. 1C) such as a stacked capacitor over part of the access transistor and isolation areas or a very deep trench capacitor which may be positioned lower than the access transistor.

The difficulties for the 1T1C memory Cell are elaborated here though they are well-known problems even under huge financial, and research and development investments on technology, design and equipments. To give a few examples of the difficulties: (1) the structure of the access transistor suffers unavoidable but more serious current leakage problem to degrade the 1T1C memory cell storage functions such as reducing the DRAM refresh time; (2) the complexities of arranging the word lines, bit lines and storage capacitors on their geometric and topographic structures and connections among the word lines, the bit lines, the storage capacitors, and the gates, sources and drains of the access transistors are getting much worse for scaling down; (3) the trench capacitor suffers too large aspect ratio of the depth versus opening size and is almost halted at the 14nm node; (4) the stacked capacitor suffers the worsen topography and there is almost no space for the contact spaces between the storage electrode to the source of the access transistor after twisting the active region from 20 degree to over 50 degree, etc. In addition, the allowable space for the bit line contact to the drain of the access transistor is getting so small but a self-aligned feature must still be struggled to maintain; (5) the worsen leakage current problem demands enhancing the capacitance of the stacked capacitor and keeping increasing the height of the stacked capacitor to have a larger capacitance area unless a much high-K dielectric insulator material which is used for getting the higher storage capacitance can be discovered; (6) because all increasing demands on better reliability, quality and resilience of DRAM chips under increasingly demanding higher density/capacity and performance are getting harder to be met, and so on.

State-of-the-art has no technology breakthroughs of solving the above difficulties. Therefore, how to design a new structure of the 1T1C memory cell to solve the above difficulties has become an important issue for a designer of the 1T1C memory cell.

SUMMARY OF THE INVENTION

The present invention provides a new memory cell structure applied to DRAM, wherein the memory cell structure vertically integrates a storage capacitor (1C) directly over an access transistor (1T). The memory cell structure utilizing a 3D (three-dimensional) elevated source electrode with well-designed graded doping concentration with self alignment to a gate structure of the access transistor can significantly reduce leakage currents down to a range of femto-Amperes, wherein the leakage currents include the most difficult leakage source such as GIDL (Gate Induced Drain Leakage) and the junction leakages. Since the leakage currents are significantly reduced, capacitance of the storage capacitor can be maintained at a reasonable scale as the technology must be scaled down for reducing parasitic capacitance of the memory cell structure. The 3D elevated source electrode is also extended by a self-alignment technology to be connected to the signal storage node of the storage capacitor. Since the 1C is further being formed in a self-alignment way directly over the access transistor like an electric Tower over a residence, the memory cell structure is named as Tower capacitor over access Transistor, ToT Cell. Moreover, the present invention also provides a new Counter-electrode Plate of the storage capacitor, wherein the Counter-electrode Plate uses a metal material to cover over a high-K-dielectric-Insulator almost down to a surface of an active region of the access transistor and up to a top surface of the storage capacitor as a very solid (i.e. extremely low impedance and low noise) Constant-voltage Plane (usually biased at Half-VCC voltage level) for the storage capacitor. An underground bit line of the memory cell structure is used to reduce topography of the memory cell structure and self aligned to be connected to the drain region of the access transistor, those giving a well-designed orthogonal structure to the word line with much reduced coupling effect between the underground bit line and the word line. In addition, both parasitic capacitance and resistor-capacitor (RC) time constant in association with the underground bit line are reduced to allow more bits to be connected to the underground bit line or to enlarge the sensing signal which is a ratio of the capacitance of the storage capacitor to the bit line capacitance. The vertically constructed Counter-electrode Plate can also create a flat surface of the ToT Cell covered well by the metal material. This should give a better distribution of the electric fields inside the memory cell structure and a better thermal dissipation effect. The structure of the word line which is different from the state-of-the-art buried word-line structure has its invention to be self-aligned to the gate structure of the access transistor. Since most of the word line, the underground bit line, the source region, and the drain regions, the signal electrode, the counter-electrode plate, and all their related connections are formed by self-alignment processing techniques, the ToT Cell size is more controllable as the technology is scaled, which gives the solution of extending the 1T1C memory cell to be scaled down below 10 nanometers.

An embodiment of the present invention provides a memory cell structure. The memory cell structure includes a silicon substrate, a transistor, a bit line, and a capacitor. The silicon substrate has a silicon surface. The transistor is coupled to the silicon surface, wherein the transistor includes a gate structure, a first conductive region, and a second conductive region. The bit line is electrically coupled to the first conductive region of the transistor and positioned under the silicon surface. The capacitor is over the transistor and electrically coupled to the second conductive region of the transistor.

According to another aspect of the invention, the capacitor encompasses at least a top side and a sidewall of the transistor.

According to another aspect of the invention, the bit line is electrically coupled to the first conductive region of the transistor through a bridge contact, the bridge contact is positioned under the silicon surface and a first sidewall of the bridge contact is aligned with an edge of the bit line, and the bridge contact includes an upper portion and a lower portion, the upper portion of the bridge contact abuts against the silicon substrate, and the lower portion of the bridge contact is separated from the silicon substrate by a first isolating layer.

According to another aspect of the invention, the memory cell structure further includes a word line, wherein the word line is extended beyond the transistor and coupled to the gate structure of the transistor, wherein the word line includes an upper portion which is above the silicon surface, and a sidewall of the upper portion of the word line is aligned with a sidewall of the gate structure.

According to another aspect of the invention, the transistor further includes a dielectric layer encompassing the word line and the gate structure.

According to another aspect of the invention, at least part of the gate structure extends downward from the silicon surface.

According to another aspect of the invention, the memory cell structure further includes a first spacer and a second spacer, wherein the first spacer covers a first side of the gate structure and positioned above the silicon surface, and the second spacer covers a second side of the gate structure and positioned above the silicon surface; wherein the first conductive region of the transistor extends upward from the silicon surface and abuts against the first spacer, and the second conductive region of the transistor extends upward from the silicon surface and abuts against the second spacer.

Another embodiment of the present invention provides a memory cell structure. The memory cell structure includes a silicon substrate, a transistor, a bit line, and a capacitor. The silicon substrate has a silicon surface. The transistor is coupled to the silicon surface, wherein the transistor includes a gate structure, a first conductive region, and a second conductive region. The bit line is electrically coupled to the first conductive region of the transistor. The capacitor is electrically coupled to the second conductive region of the transistor and encompassing the transistor.

According to another aspect of the invention, the capacitor includes a first portion vertically stacked above a top side of the transistor and second portion abutted against a sidewall of the transistor.

According to another aspect of the invention, the bit line is positioned under the silicon surface and electrically coupled to the first conductive region of the transistor through a bridge contact.

According to another aspect of the invention, the bridge contact is positioned under the silicon surface and a first sidewall of the bridge contact is aligned with an edge of the bit line.

According to another aspect of the invention, the bridge contact includes an upper portion and a lower portion, the upper portion of the bridge contact abuts against the silicon substrate, and the lower portion of the bridge contact is separated from the silicon substrate by a first isolating layer.

According to another aspect of the invention, the first isolating layer at least covers a first sidewall, a second sidewall and a bottom of the lower portion of the bridge contact.

According to another aspect of the invention, the upper portion of the bridge contact includes a metal region and a doped semiconductor region surrounding the metal region, and the doped semiconductor region abuts against the silicon substrate.

According to another aspect of the invention, the bridge contact is positioned under the silicon surface and a first dielectric cap covers a top surface of the bridge contact.

According to another aspect of the invention, the transistor further comprises a first spacer and a second spacer, the first spacer covers a first side of the gate structure and positioned above the silicon surface, and the second spacer covers a second side of the gate structure and positioned above the silicon surface; wherein the first conductive region of the transistor extends upward from the silicon surface and abuts against the first spacer, and the second conductive region of the transistor extends upward from the silicon surface and abuts against the second spacer.

According to another aspect of the invention, the memory cell structure further includes a second dielectric cap covering a top surface of the first conductive region of the transistor.

Another embodiment of the present invention provides a memory cell structure. The memory cell structure includes a silicon substrate, a transistor, and a capacitor. The silicon substrate has a silicon surface. The transistor is coupled to the silicon surface, wherein the transistor includes a gate structure, a first conductive region, and a second conductive region. The capacitor is over the transistor and coupled to the second conductive region of the transistor. A planar size of the memory cell structure is smaller than 10 times Lamda$^2$ ($\lambda^2$), wherein Lamda ($\lambda$) is the minimum feature size of the manufacture process technology.

According to another aspect of the invention, the transistor further includes a dielectric cap vertically stacked on the gate structure and a spacer covering a side wall of the gate structure; wherein the second conductive region of the transistor extends upward from the silicon surface and abuts against the spacer; wherein the capacitor includes a first portion and a second portion, the first portion of the capacitor is vertically positioned on the dielectric cap and second portion of the capacitor abuts against the second conductive region.

Another embodiment of the present invention provides a memory cell structure. The memory cell structure includes a silicon substrate, a transistor, and a capacitor. The silicon substrate has a silicon surface. The transistor is coupled to the silicon surface, wherein the transistor includes a gate structure, a first conductive region, and a second conductive region. The capacitor is over the transistor and coupled to the second conductive region of the transistor. The capacitor includes a metal electrode encompasses the transistor.

According to another aspect of the invention, the capacitor further includes a dielectric layer encompassed by the metal electrode, and the dielectric layer encompasses the transistor.

According to another aspect of the invention, the capacitor further includes a semiconductor electrode encompassed by the dielectric layer.

Another embodiment of the present invention provides a memory cell structure formed between a bridge contact and an isolation trench, the bridge contact and at least a portion of the isolation trench being under a silicon surface of a silicon substrate, and the memory cell structure coupled to a word line and a bit line. The memory cell structure includes a transistor and a capacitor. The transistor is coupled to the silicon surface, wherein the transistor includes a gate structure, a first conductive region, and a second conductive region. The capacitor is over the transistor and coupled to the second conductive region of the transistor. The bit line is disposed under the silicon surface and a lower portion of the bridge contact abuts against the bit line, an upper portion of the bridge contact abuts against portion of the silicon substrate under the first conductive region.

According to another aspect of the invention, the word line extends beyond the transistor and coupled to the gate structure of the transistor, the word line includes an upper portion which is above the silicon surface and a sidewall of an upper portion of an interconnection line is aligned with a sidewall of the gate structure.

According to another aspect of the invention, the capacitor further includes a metal electrode, a first portion of the metal electrode is vertically positioned on the isolation trench.

According to another aspect of the invention, the capacitor further includes a dielectric layer encompassed by the metal electrode, a first portion of the dielectric layer abuts against the second conductive region and the first portion of the metal electrode.

According to another aspect of the invention, an extension direction of the first portion of the metal electrode is parallel to a normal direction of the silicon substrate, an extension direction of the first portion of the dielectric layer is parallel to the normal direction of the silicon substrate, and an extension direction of the second conductive region is parallel to the normal direction of the silicon substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
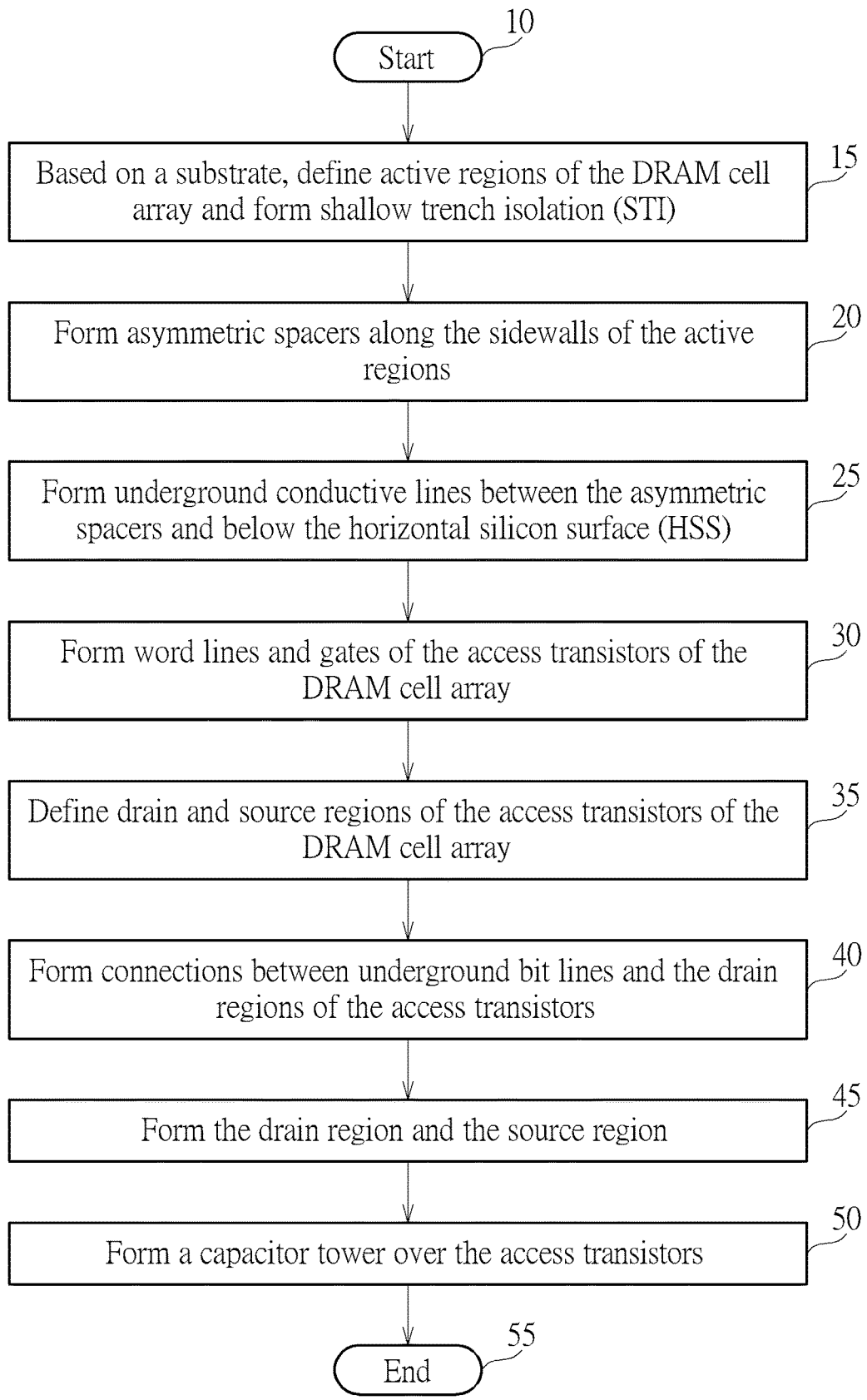
FIG. 1A is a flowchart illustrating a manufacturing method of a DRAM cell (1T1C cell) array according to an embodiment of the present invention.

Please refer to FIGS. 1A-1F, wherein FIG. 1A is a flowchart illustrating a manufacturing method of a DRAM cell (1T1C cell) array according to an embodiment of the present invention.

Step 10: Start.

Step 15: based on a substrate (such as, a p-type silicon substrate), define active regions of the DRAM cell array and form shallow trench isolation (STI).

Step 20: Form asymmetric spacers along the sidewalls of the active regions.

Step 25: Form underground conductive lines (such as bit lines) between the asymmetric spacers and below the horizontal silicon surface (HSS).

Step 30: Form word lines and gates of the access transistors of the DRAM cell array.

Step 35: Define drain (i.e. first conductive regions) and source regions (i.e. second conductive regions) of the access transistors of the DRAM cell array.

Step 40: Form connections between underground bit lines and the drain regions of the access transistors.

Step 45: Form the drain region and the source region.

Step 50: Forma capacitor tower over the access transistors.

Step 55: End.

Figure 1B:
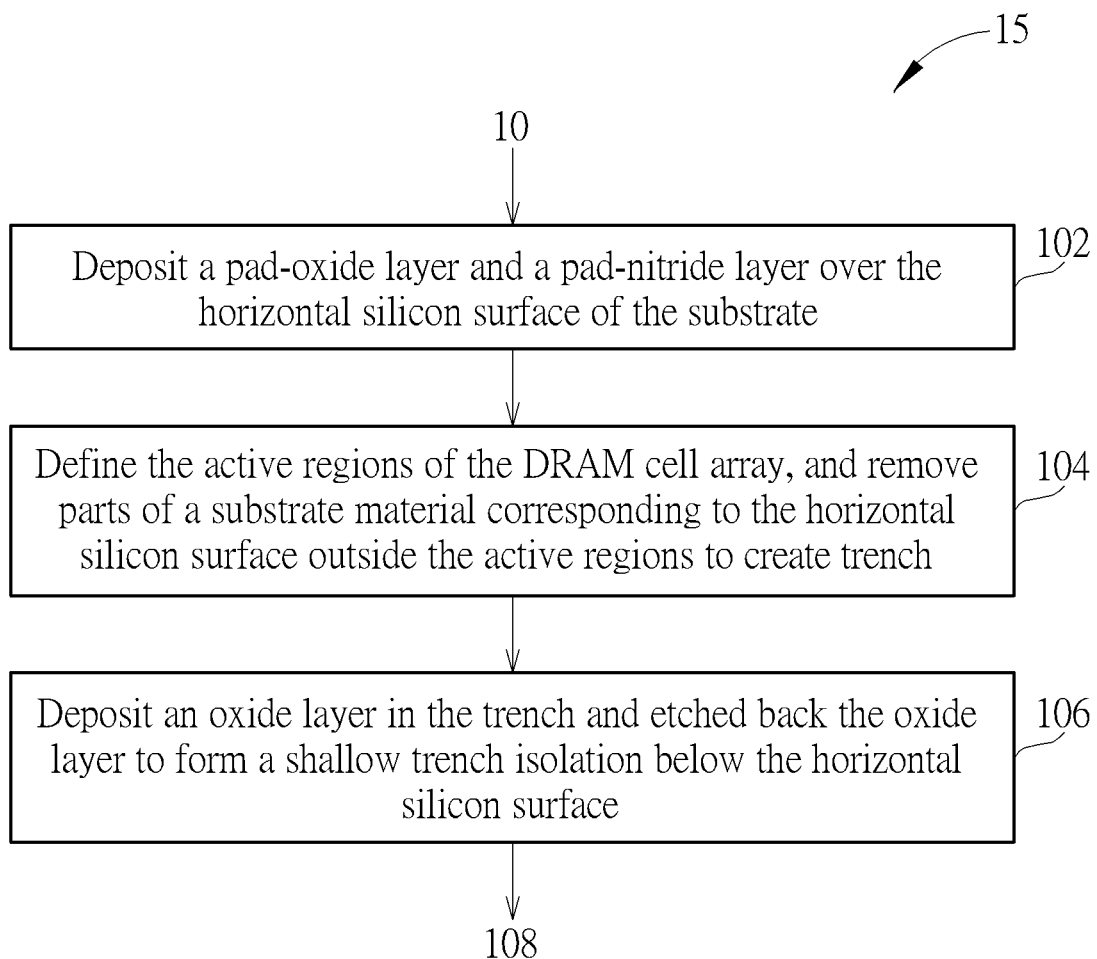
FIGS. 1B-1J are diagrams illustrating FIG. 1A.
Figure 1C:
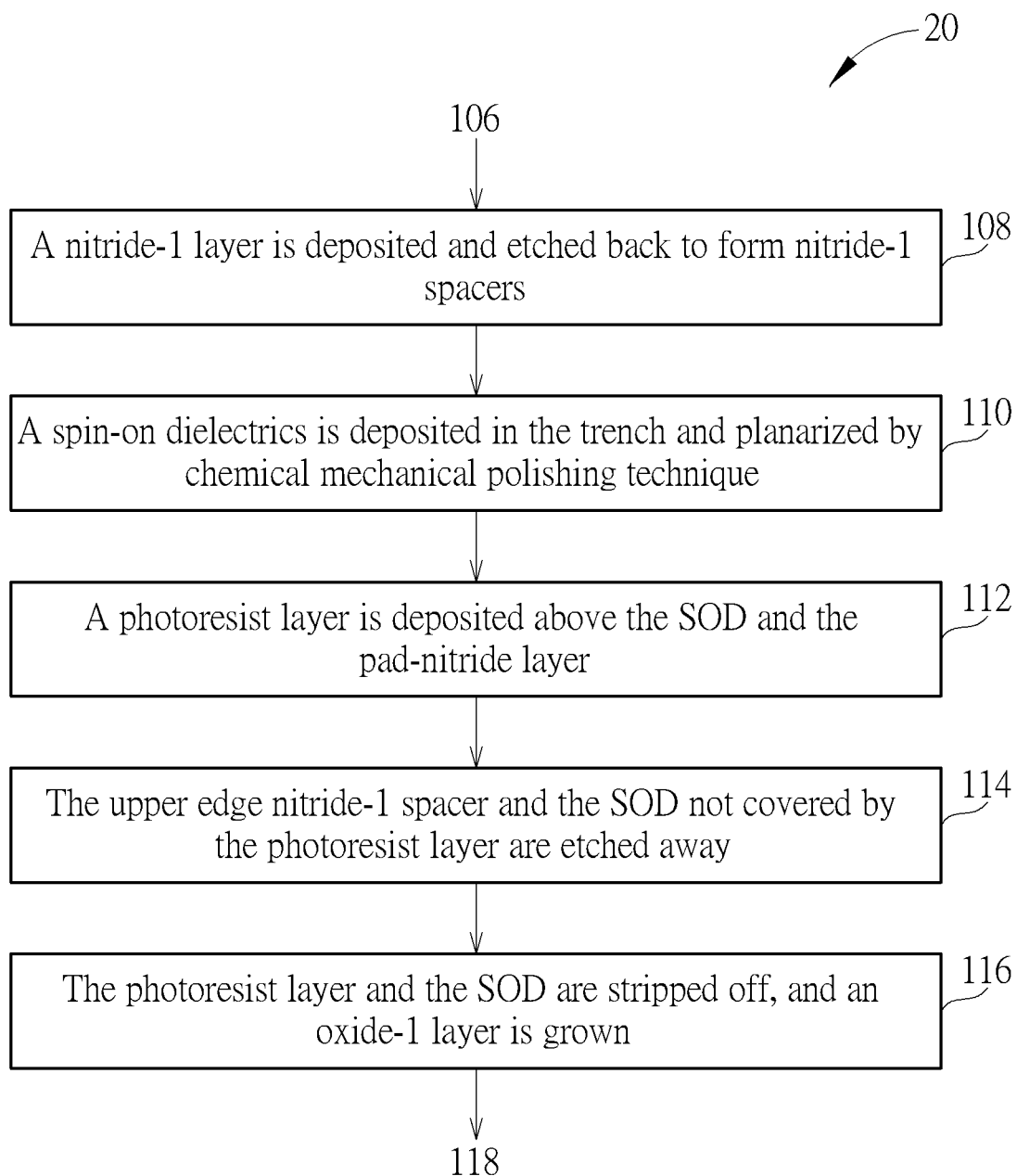
Figure 1D:
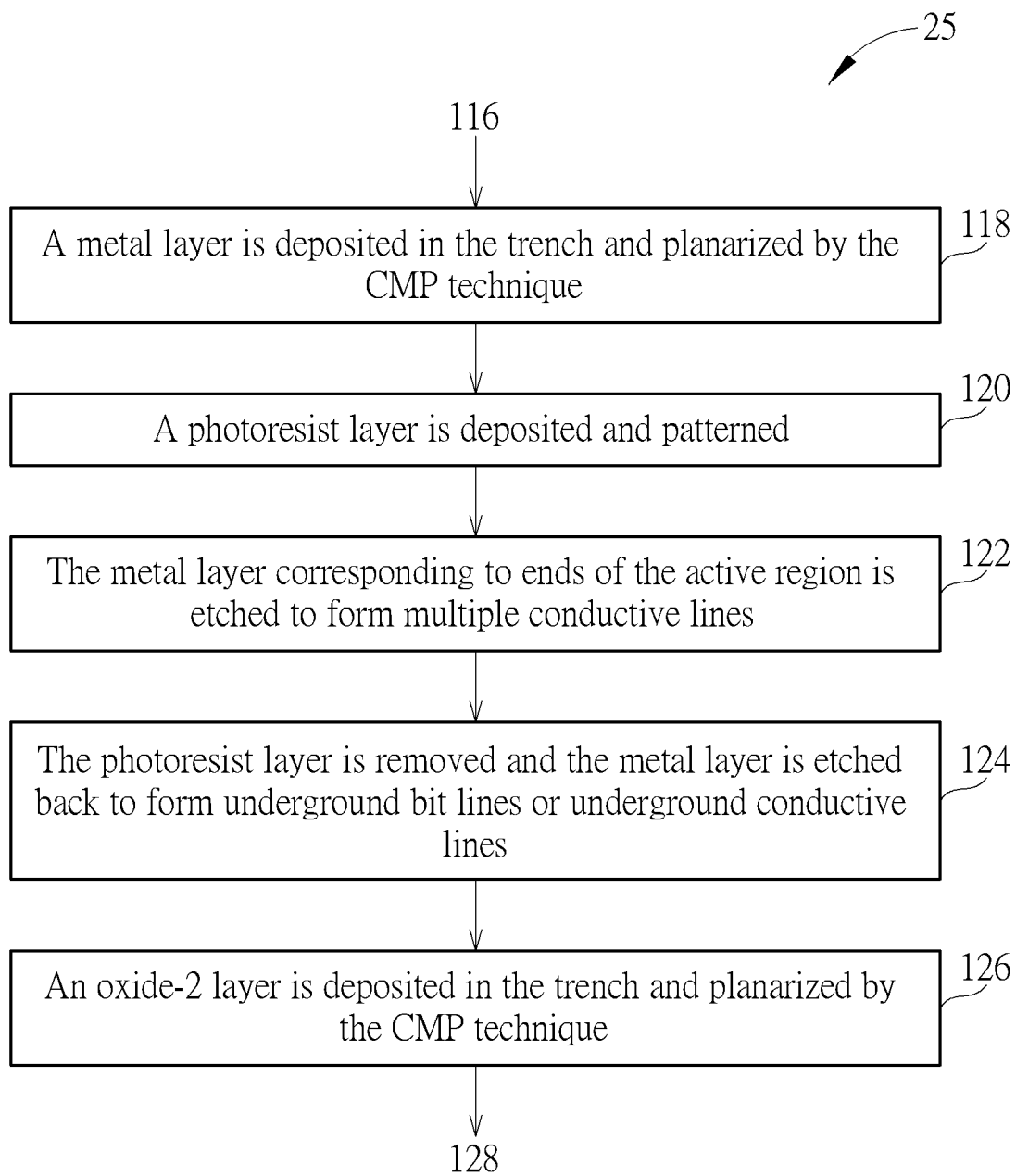
Figure 1E:
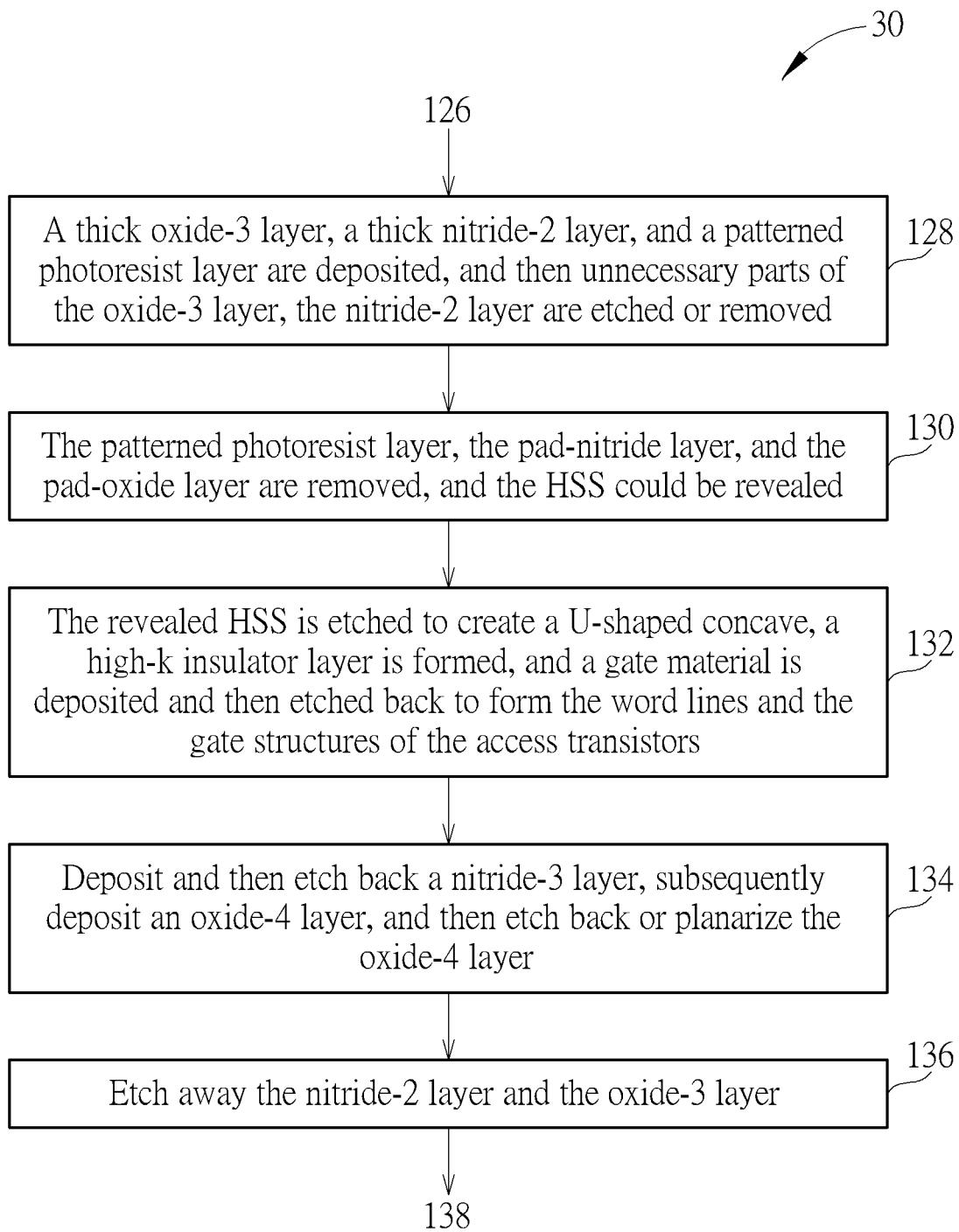
Figure 1F:
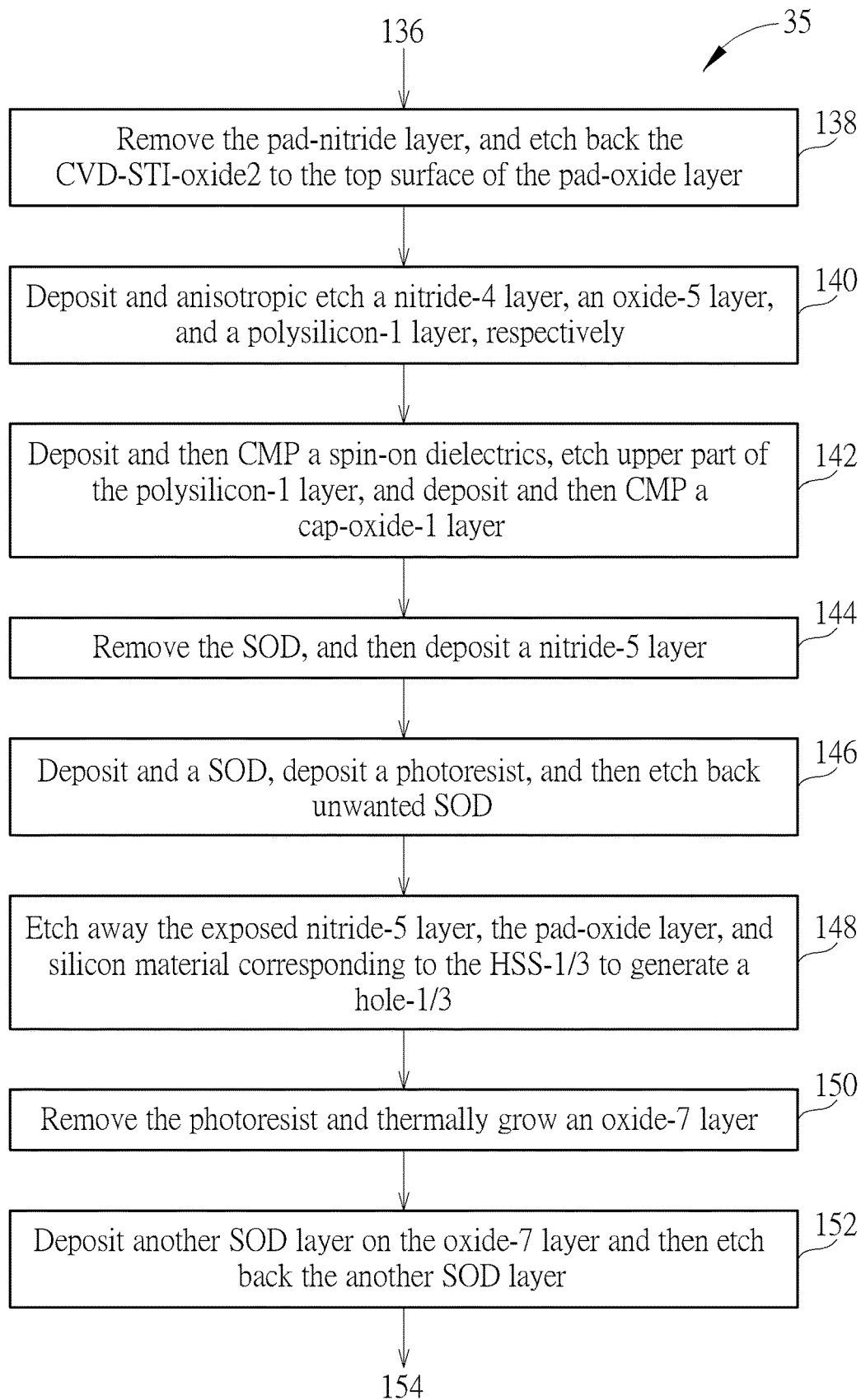
Figure 1G:
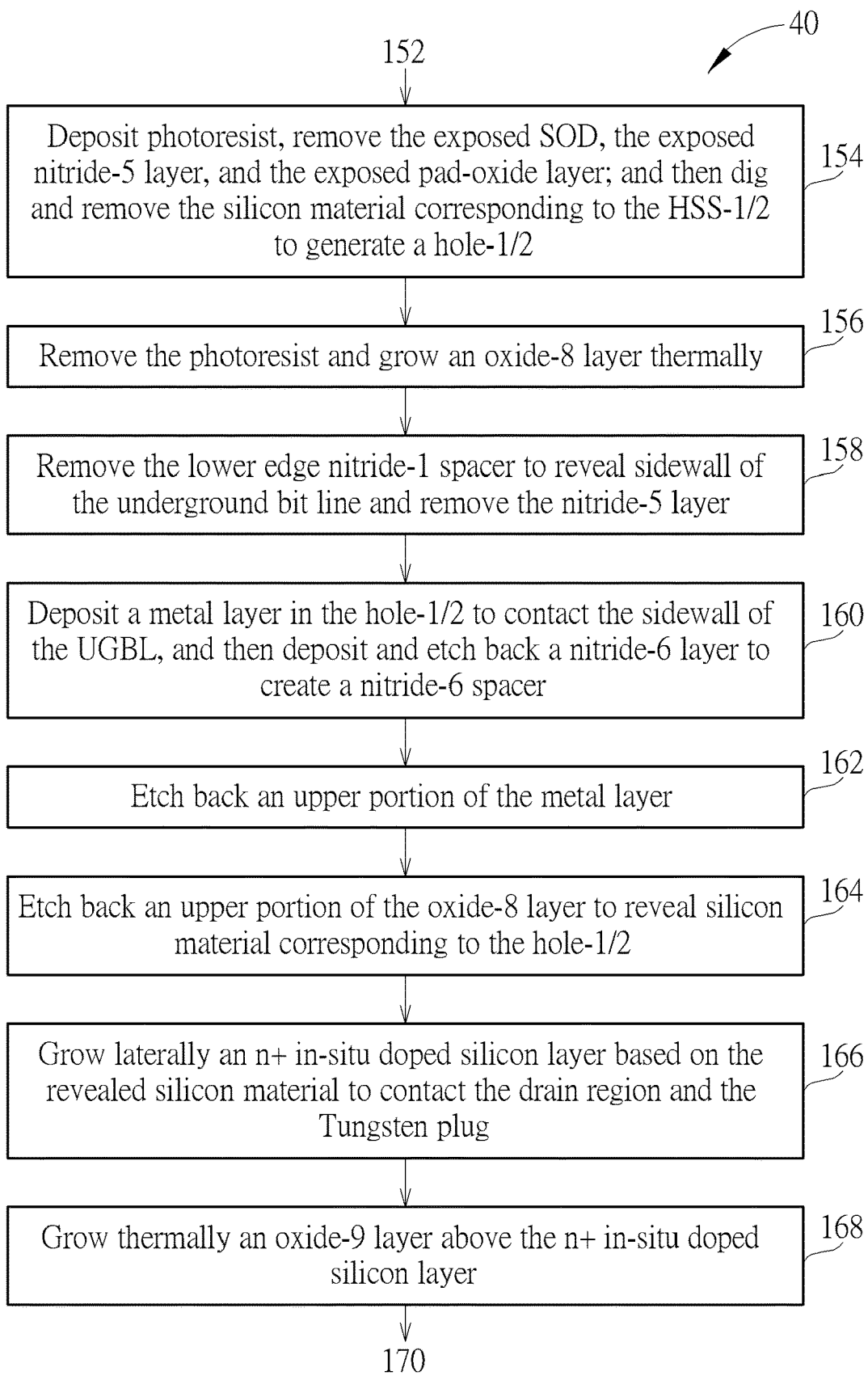
Figure 1H:
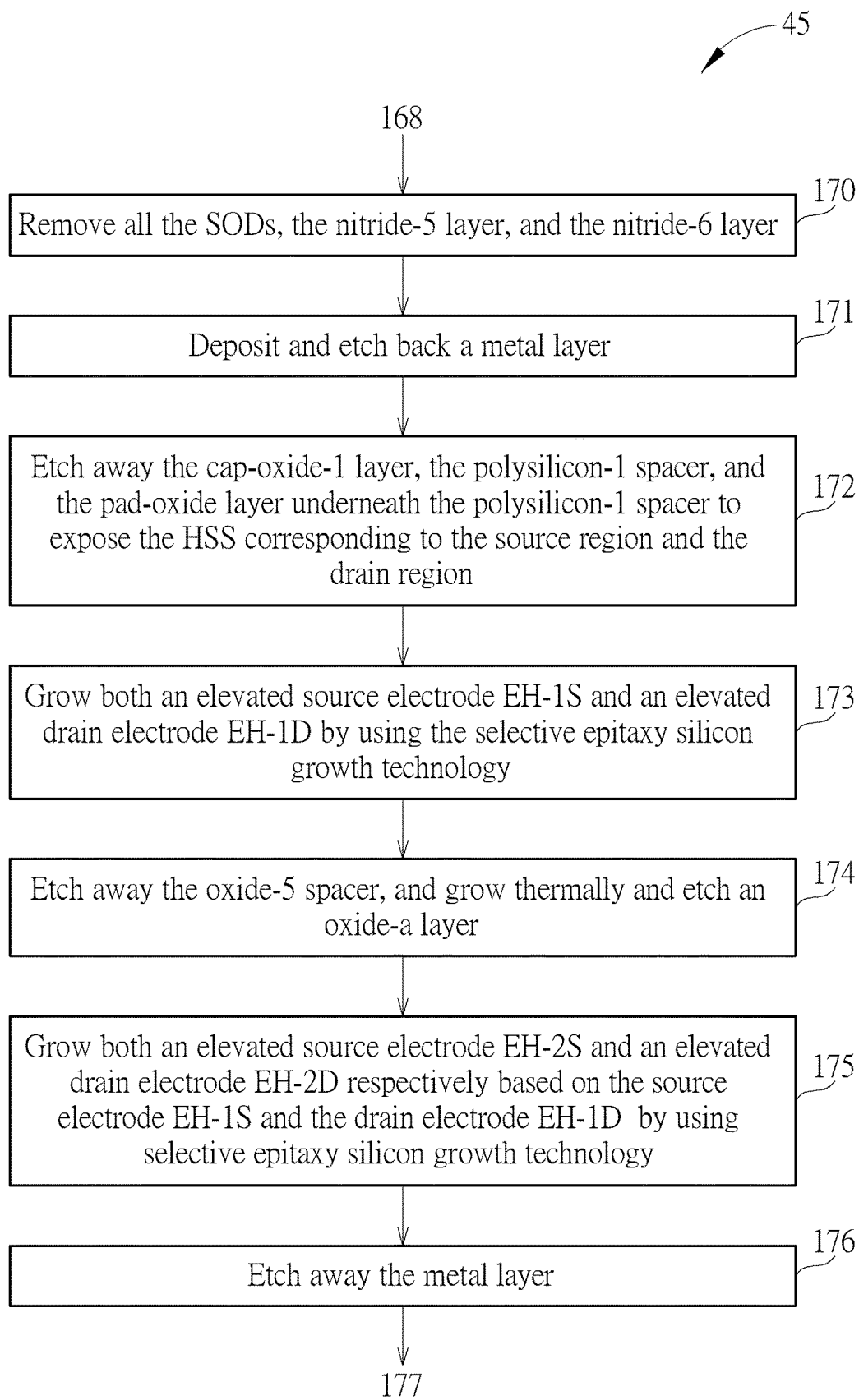
Figure 1I:
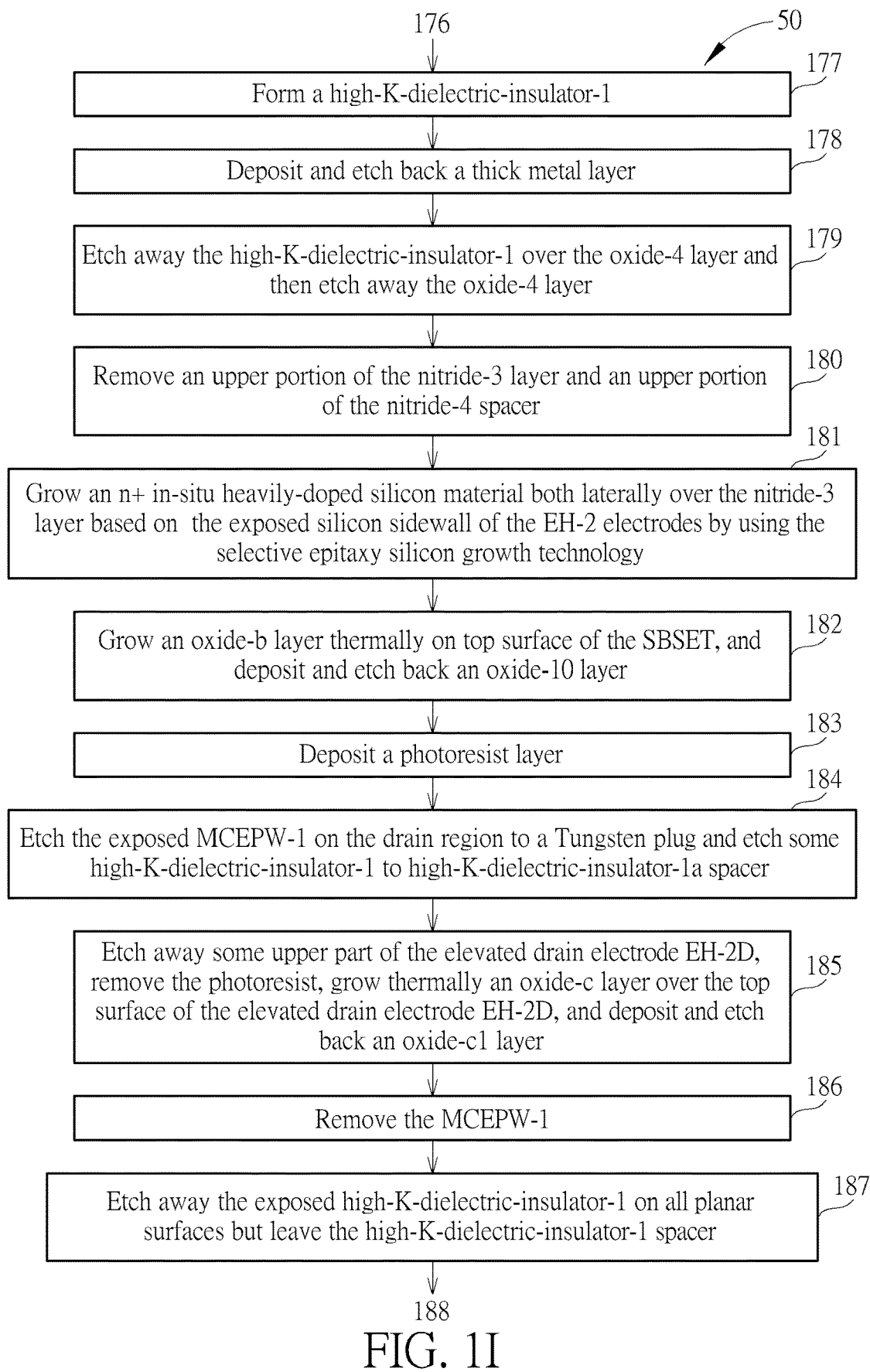
Figure 1J:
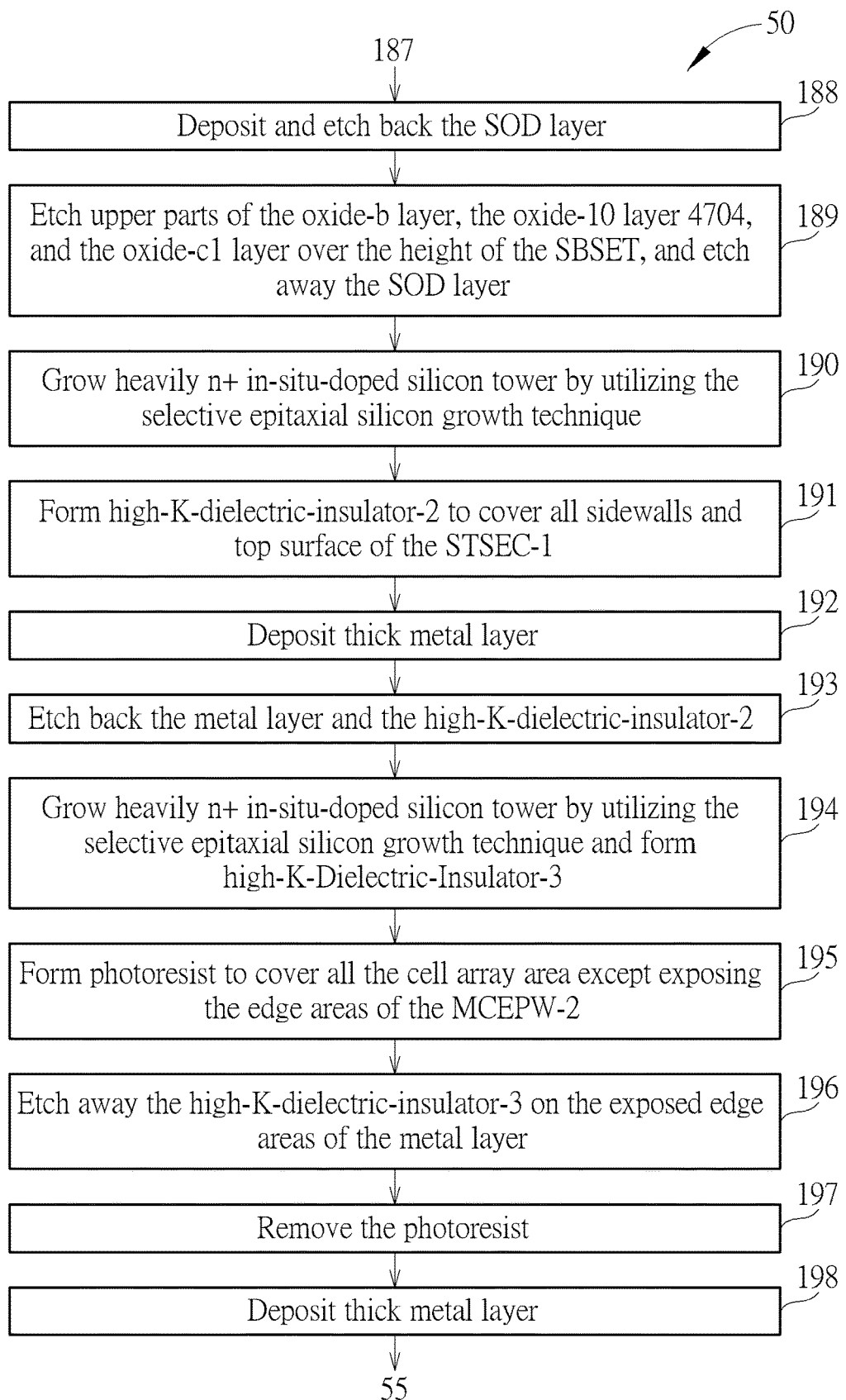
Figure 2:
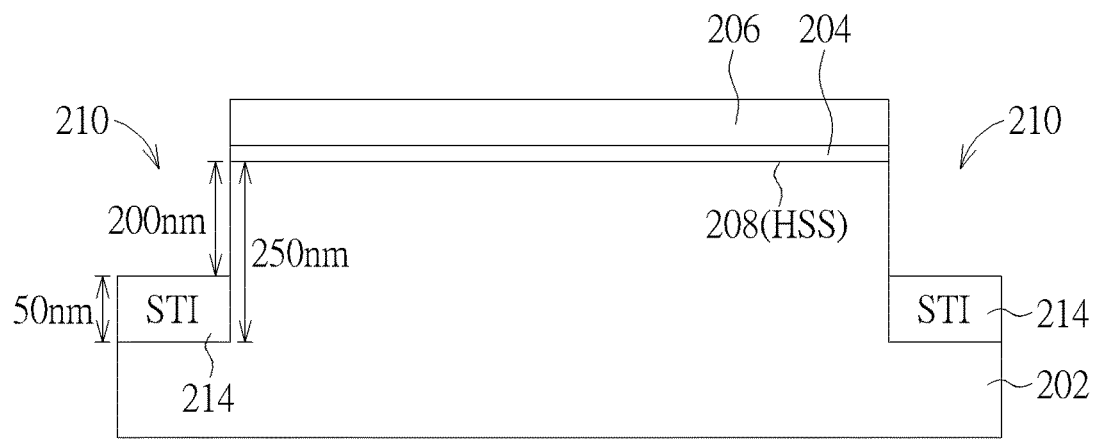
FIG. 2 is a diagram illustrating a top view and a cross-section view along an X direction after the pad-nitride layer and the pad-Oxide layer are deposited and the STI is formed.
Figure 2:
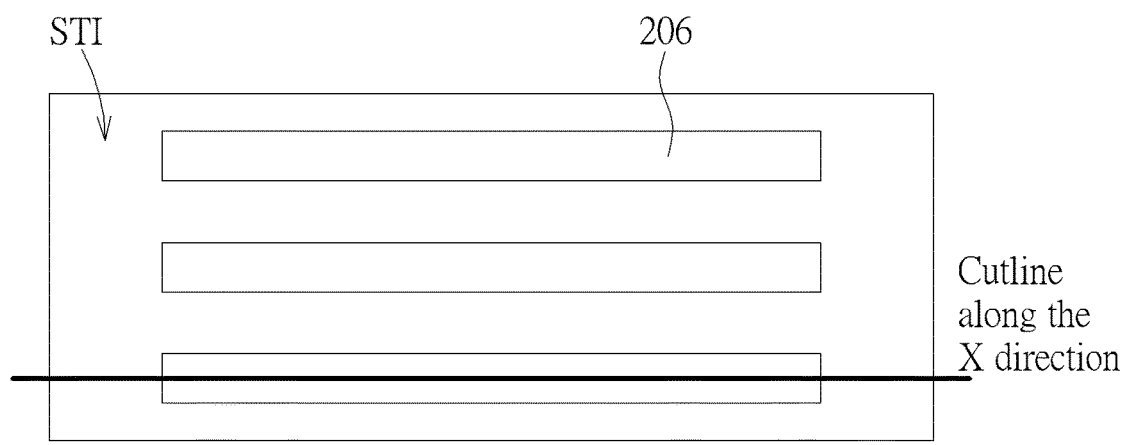

Please refer to FIG. 1B and FIG. 2. Step 15 could include:

Step 102: Deposit a pad-oxide layer 204 and a pad-nitride layer 206 over the horizontal silicon surface (hereinafter, "HSS") 208 of the substrate.

Step 104: Define the active regions of the DRAM cell array, and remove parts of a substrate material (such as silicon material) corresponding to the horizontal silicon surface 208 outside the active regions to create trench 210.

Step 106: Deposit an oxide layer 214 in the trench 210 and etched back the oxide layer 214 to form a shallow trench isolation (STI) below the horizontal silicon surface 208.

Figure 3:
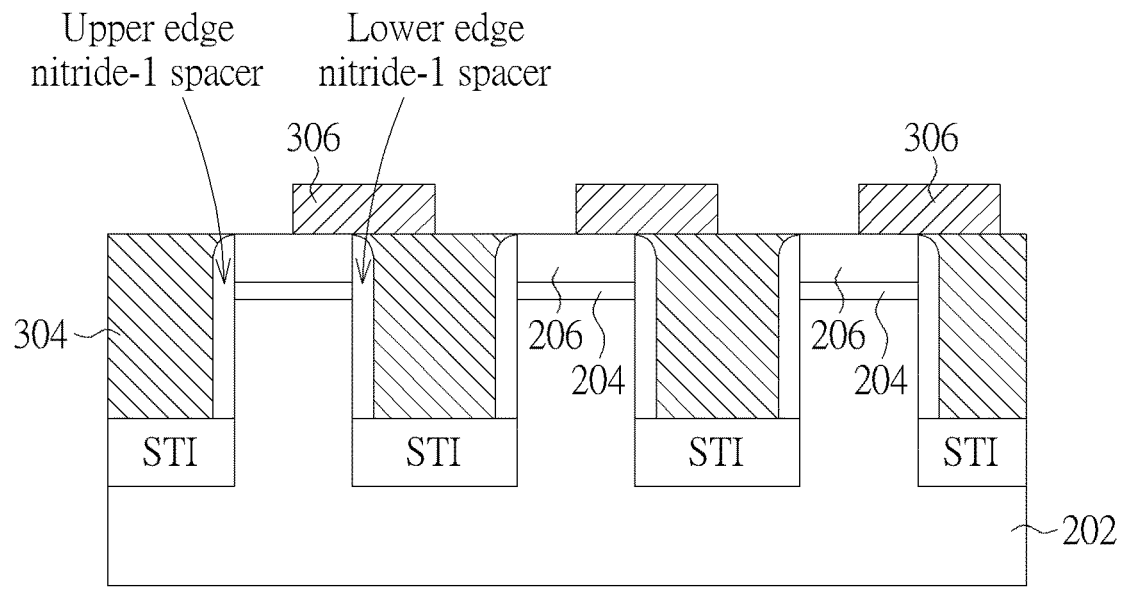
FIG. 3 is a diagram illustrating depositing and etching back the nitride-1 layer to form nitride-1 spacers, and depositing the SOD and the photoresist layer.
Figure 3:
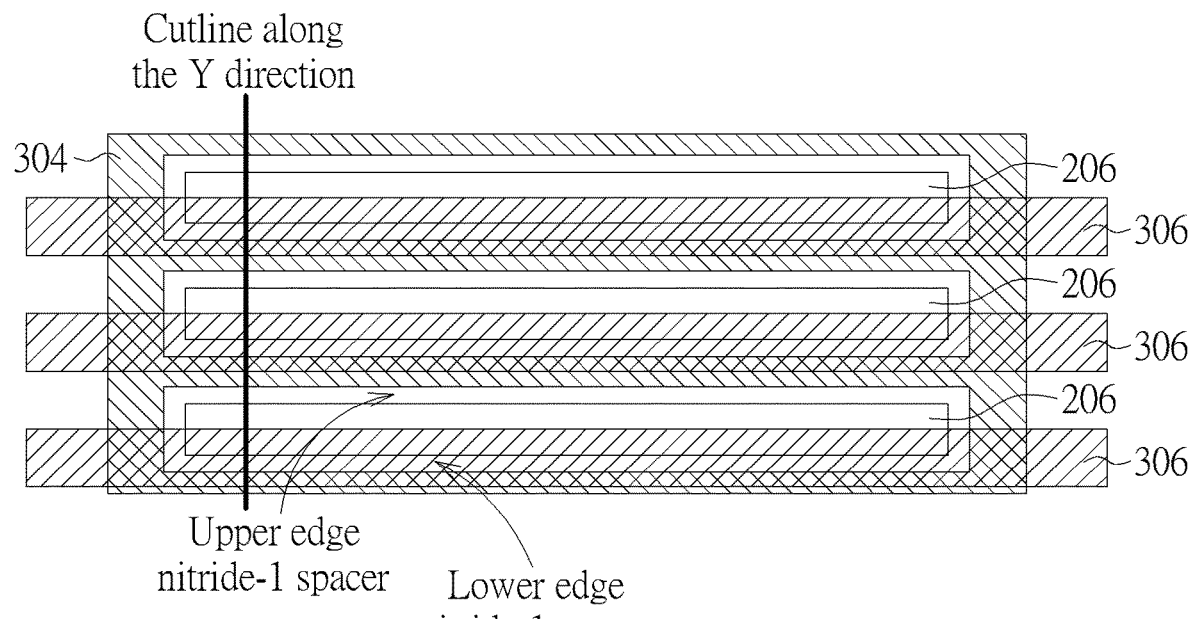

Please refer to FIG. 1C and FIGS. 3-5. Step 20 could include:

Step 108: A nitride-1 layer is deposited and etched back to form nitride-1 spacers (FIG. 3).

Step 110: A spin-on dielectrics (SOD) 304 is deposited in the trench 210 and planarized by chemical mechanical polishing (CMP) technique (FIG. 3).

Step 112: A photoresist layer 306 is deposited above the SOD 304 and the pad-nitride layer 206 (FIG. 3).

Figure 4:
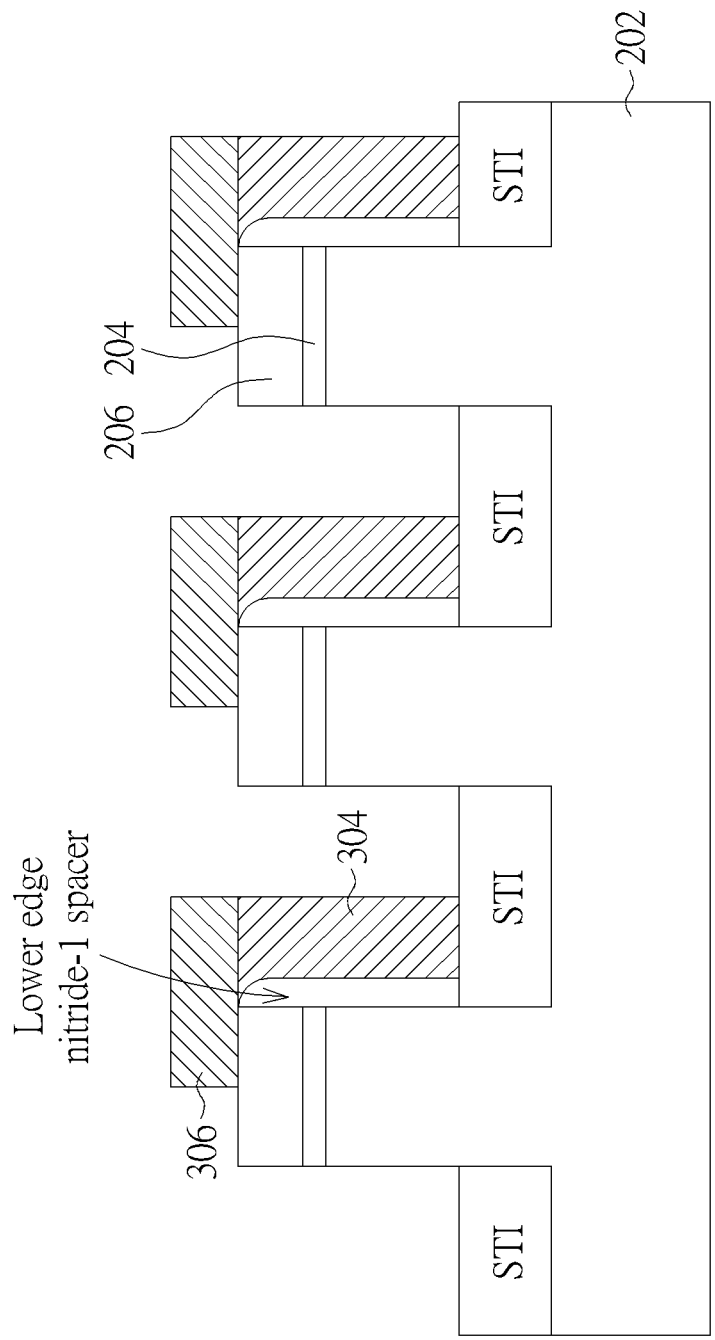
FIG. 4 is a diagram illustrating etching away the upper edge nitride-1 spacer and the SOD not covered by the photoresist layer.

Step 114: The upper edge nitride-1 spacer and the SOD 304 not covered by the photoresist layer 306 are etched away (FIG. 4).

Figure 5:
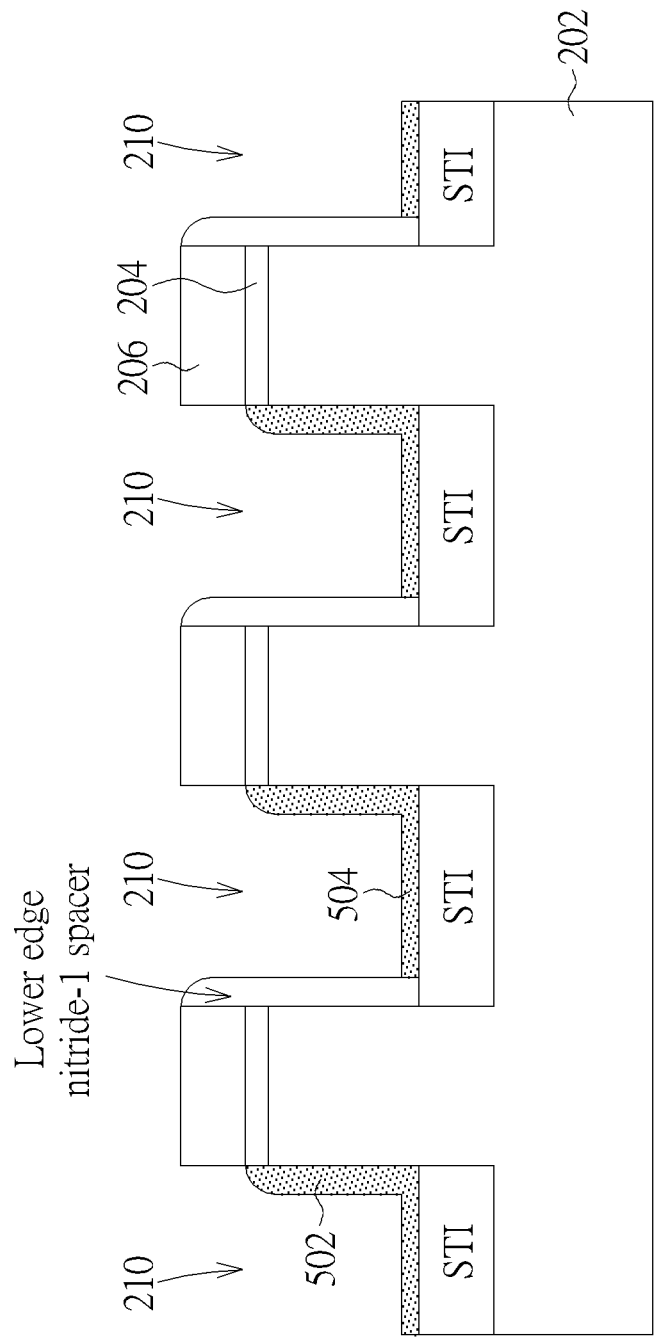
FIG. 5 is a diagram illustrating stripping off the photoresist layer and the SOD, and growing the oxide-1 layer.

Step 116: The photoresist layer 306 and the SOD 304 are stripped off, and an oxide-1 layer 502 is grown, such as thermal growth (FIG. 5).

Figure 6:
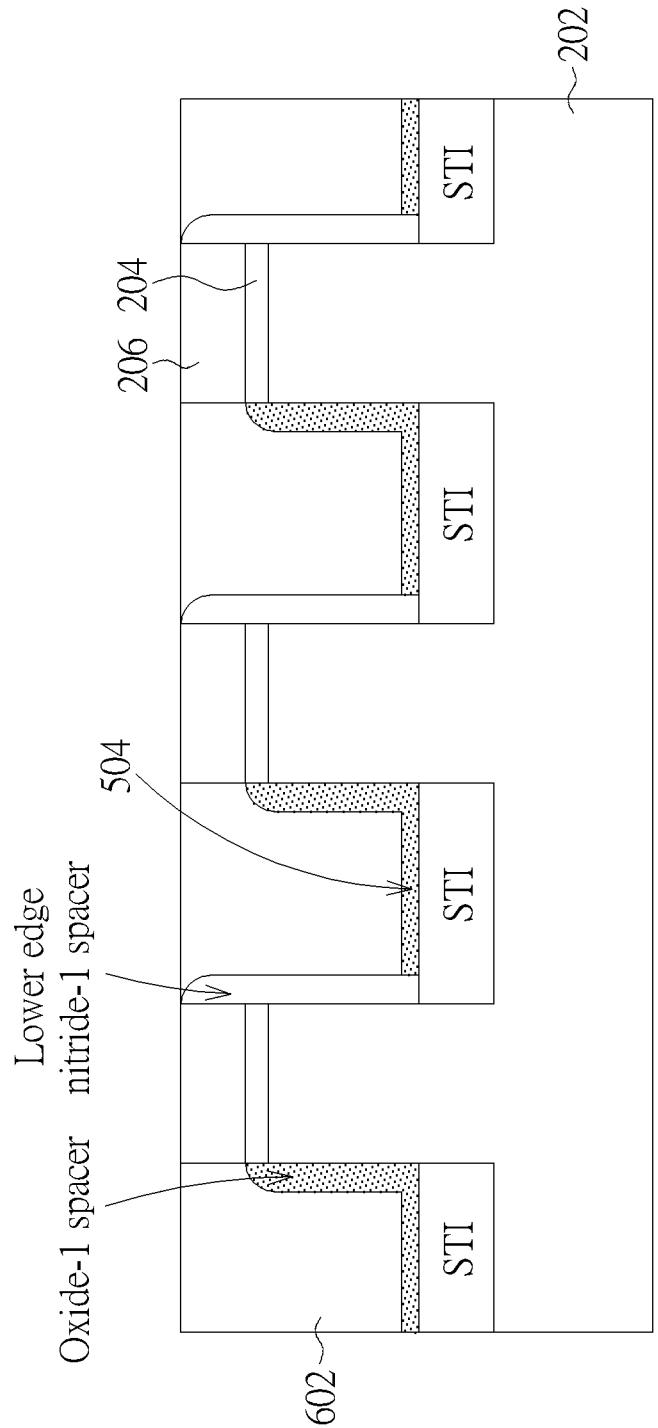
FIG. 6 is a diagram illustrating the metal layer being deposited in the trench and planarized by the CMP technique.

Please refer to FIG. 1D and FIGS. 6-10. Step 25 could include:

Step 118: A metal layer 602 is deposited in the trench 210 and planarized by the CMP technique (FIG. 6).

Figure 7:
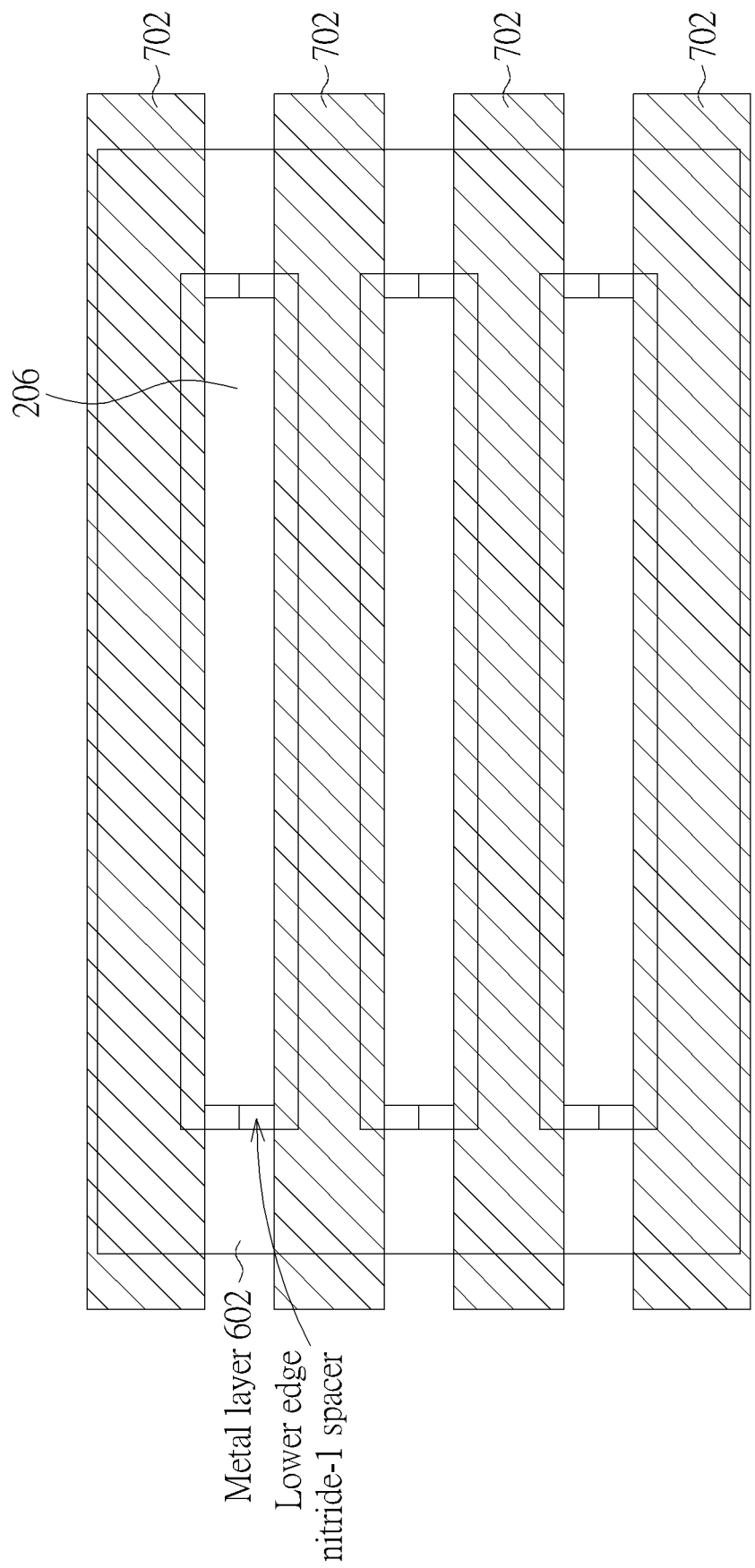
FIG. 7 is a diagram illustrating the photoresist layer being deposited.

Step 120: A photoresist layer 702 is deposited and patterned (FIG. 7).

Figure 8:
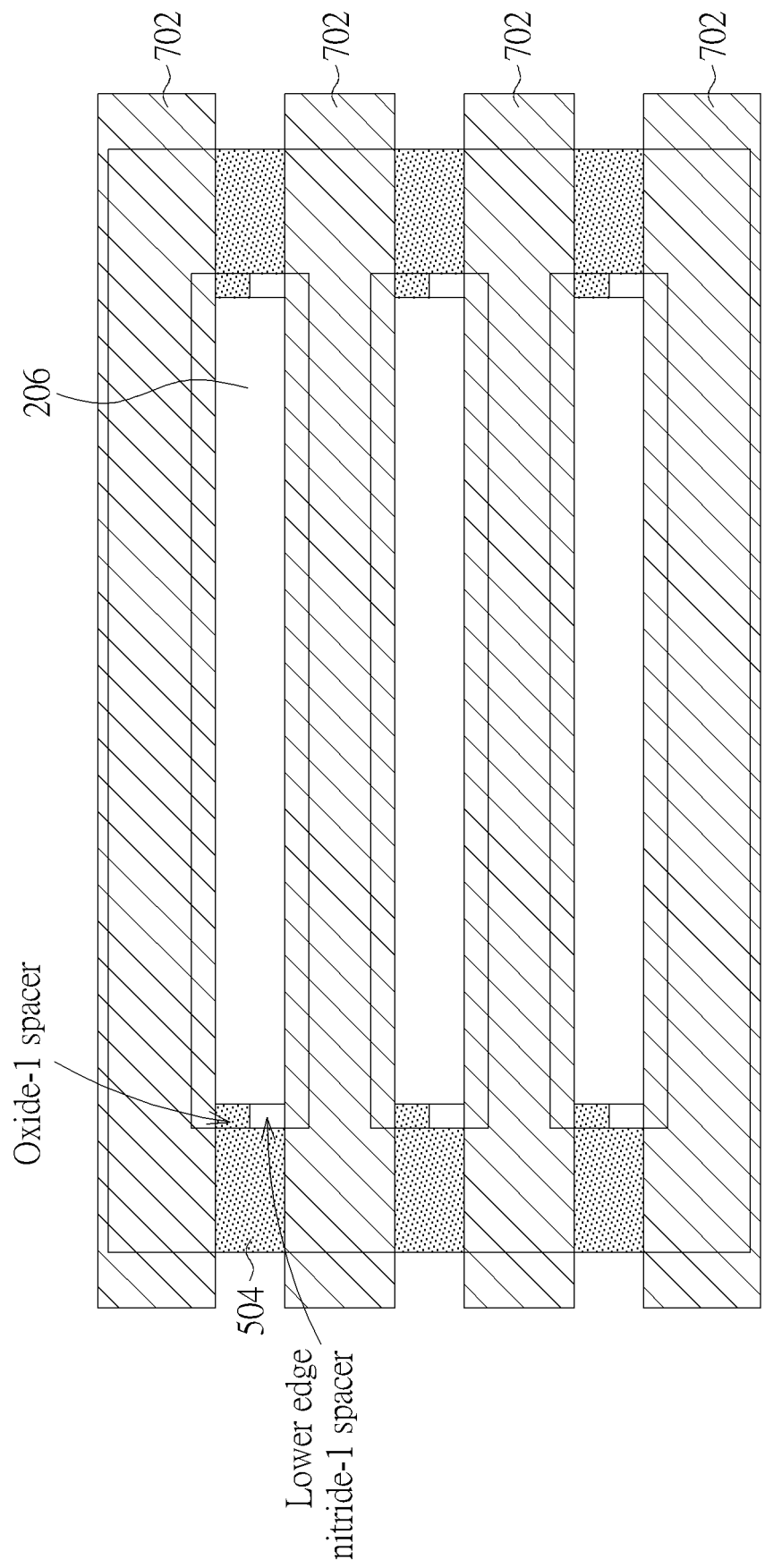
FIG. 8 is a diagram illustrating the metal layer corresponding to ends of the active region being etched.

Step 122: The metal layer 602 corresponding to ends of the active region is etched to form multiple conductive lines (FIG. 8).

Figure 9:
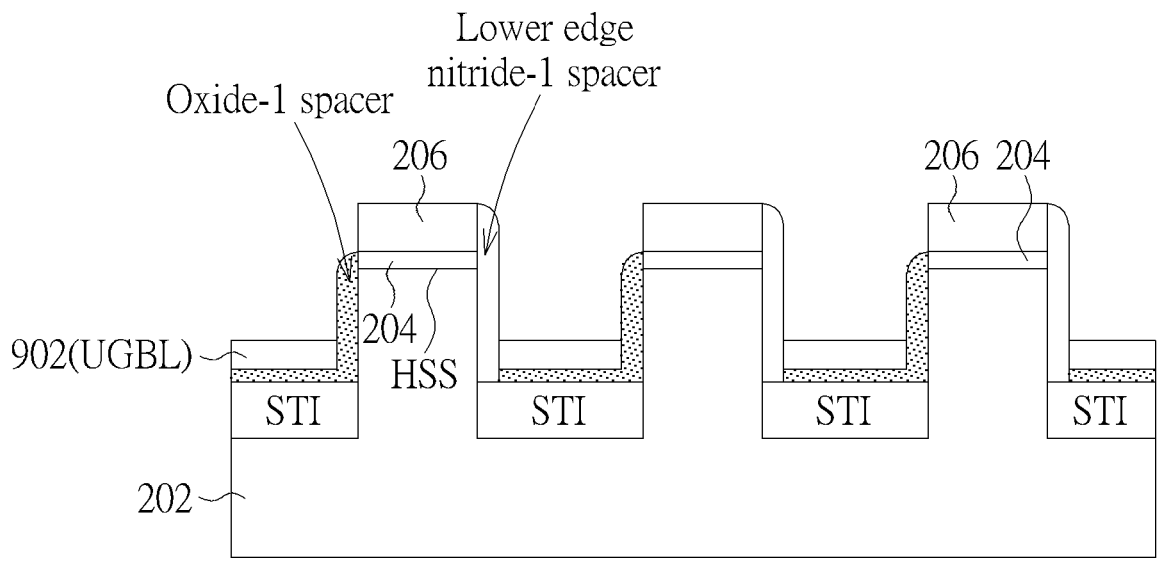
FIG. 9 is a diagram illustrating the photoresist layer being removed and the metal layer being etched back to form underground bit line.
Figure 9:
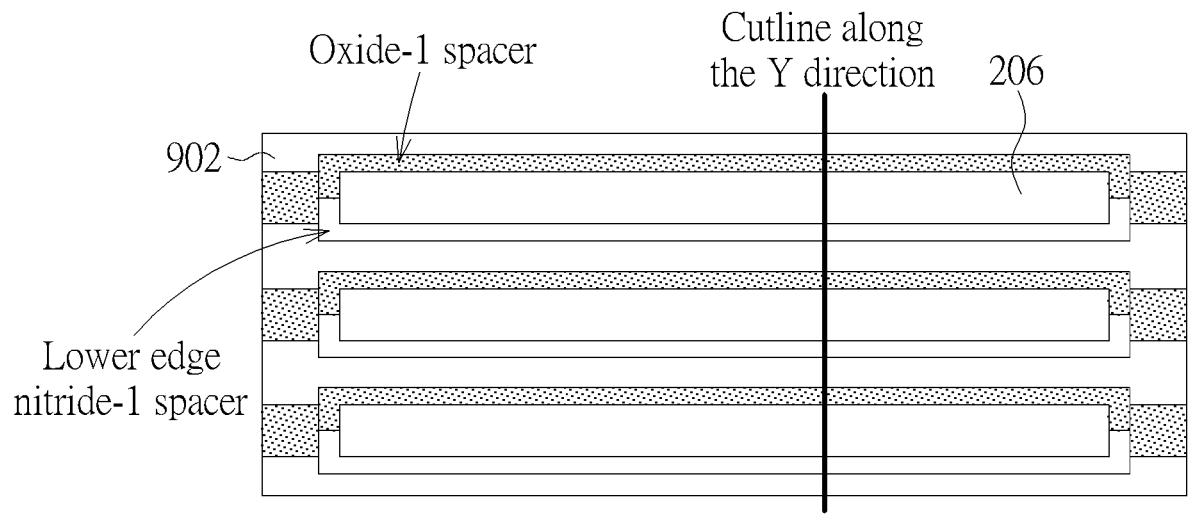

Step 124: The photoresist layer 702 is removed and the metal layer 602 (the multiple conductive lines) is etched back to form underground bit lines (UGBL) 902 or underground conductive lines (FIG. 9).

Figure 10:
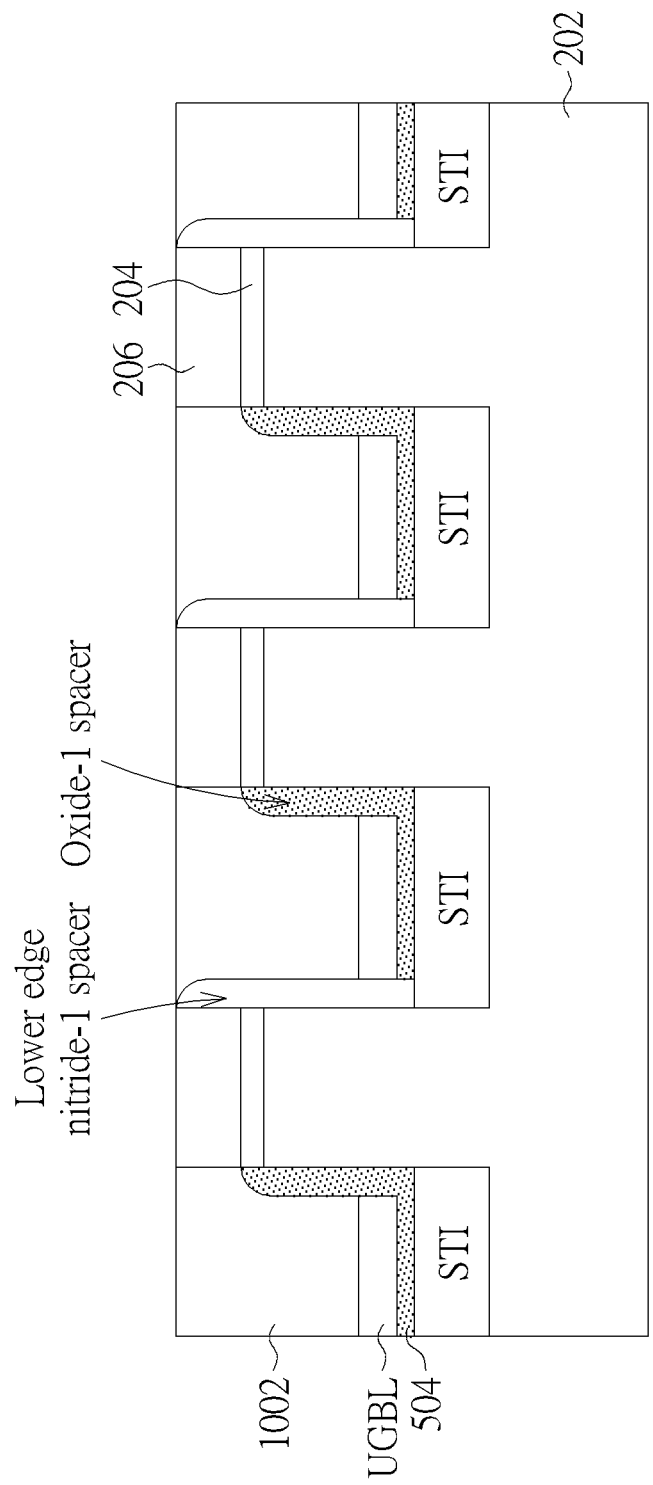
FIG. 10 is a diagram illustrating the oxide-2 layer being deposited in the trench.

Step 126: An oxide-2 layer 1002 is deposited in the trench 210 and planarized by the CMP technique (FIG. 10).

Figure 11:
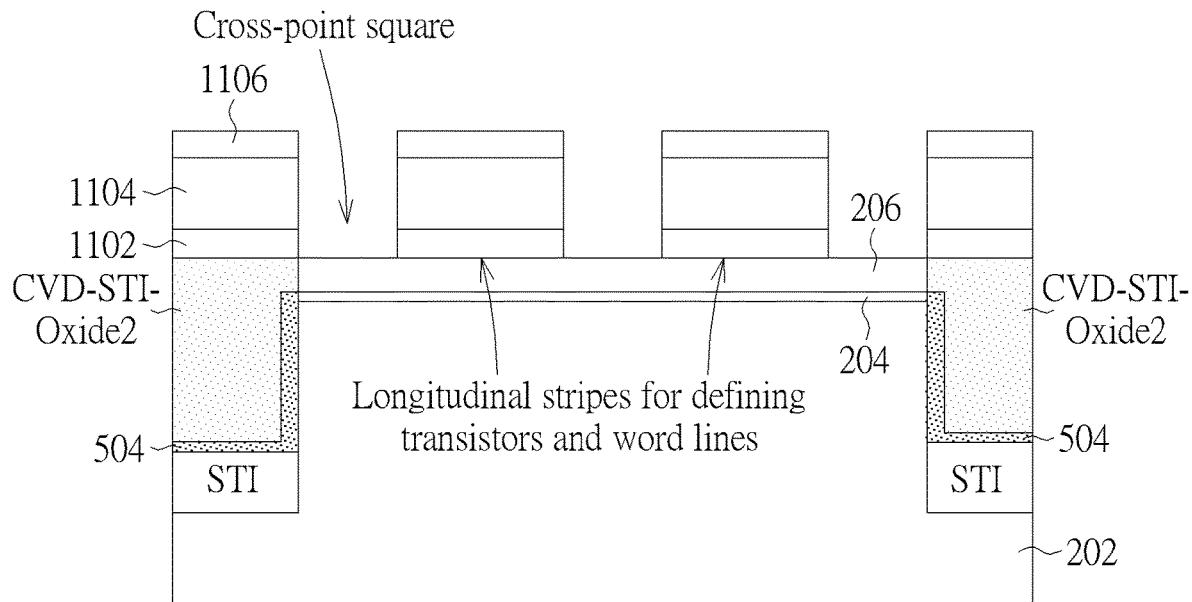
FIG. 11 is a diagram illustrating the oxide-3 layer, the nitride-2 layer, and the photoresist being deposited, and then the unnecessary parts of the oxide-3 layer, the nitride-2 layer, and the photoresist being removed.
Figure 11:
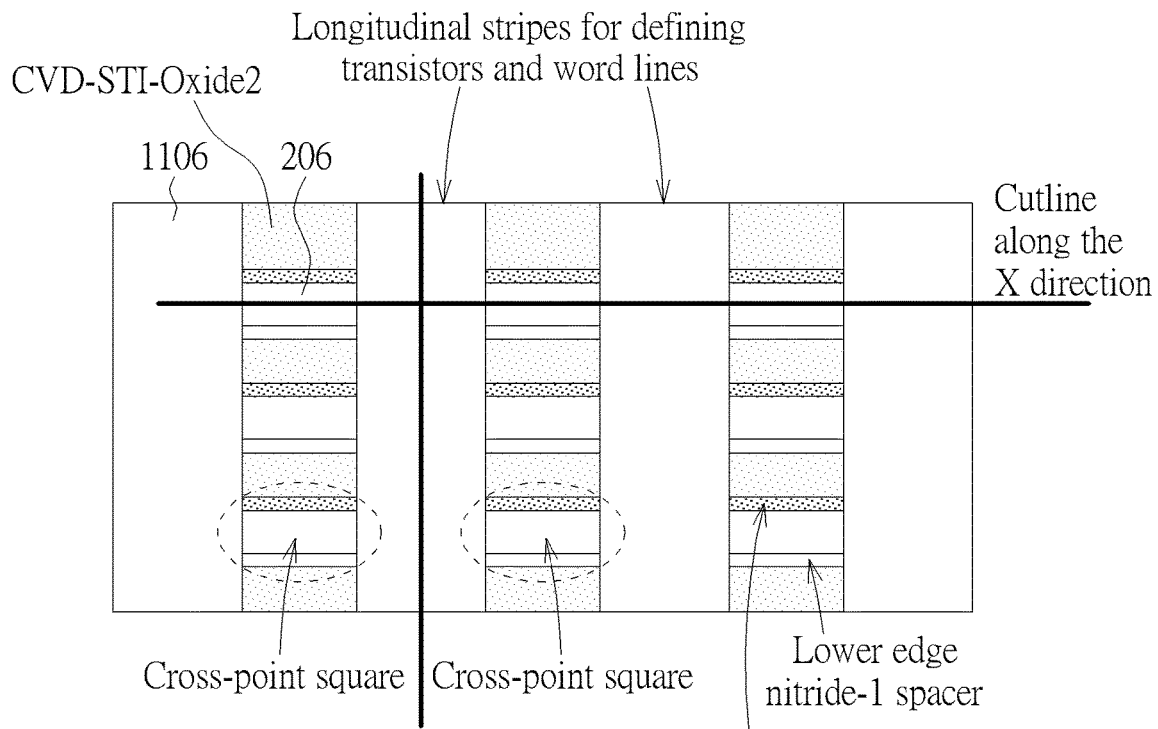

Please refer to FIG. 1E and FIGS. 11-15. Step 30 could include:

Step 128: A thick oxide-3 layer 1102, a thick nitride-2 layer 1104, and a patterned photoresist layer 1106 are deposited, and then unnecessary parts of the oxide-3 layer 1102, the nitride-2 layer 1104 are etched or removed (FIG. 11).

Figure 12:
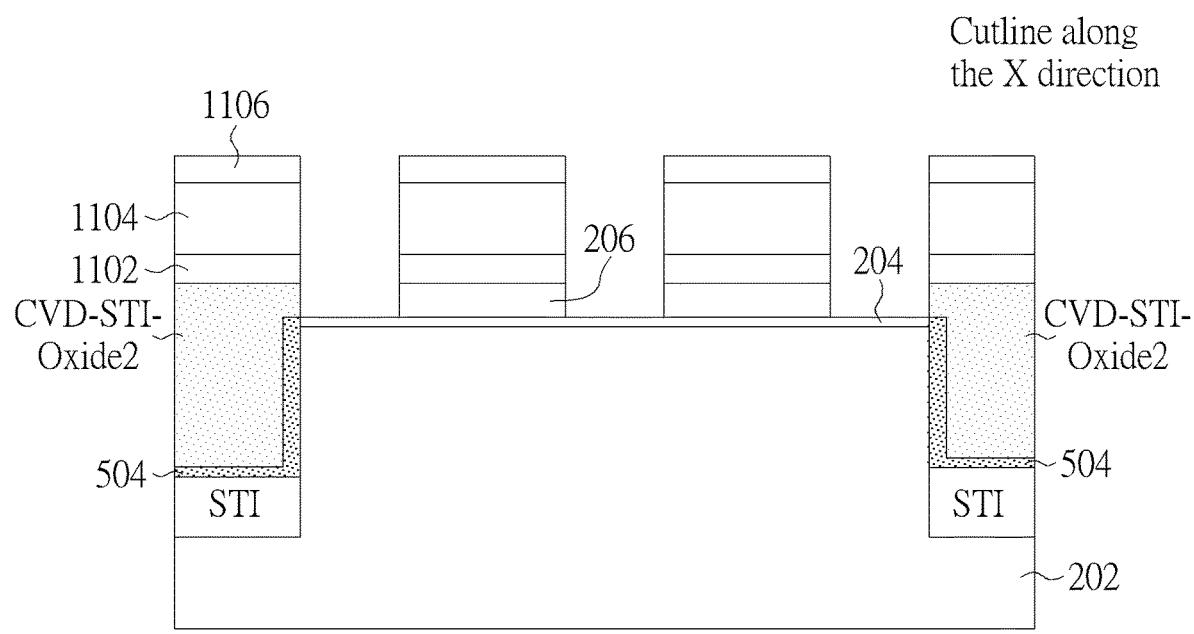
FIG. 12 is a diagram illustrating the photoresist layer, the pad-nitride layer, and the pad-oxide layer being removed.
Figure 12:
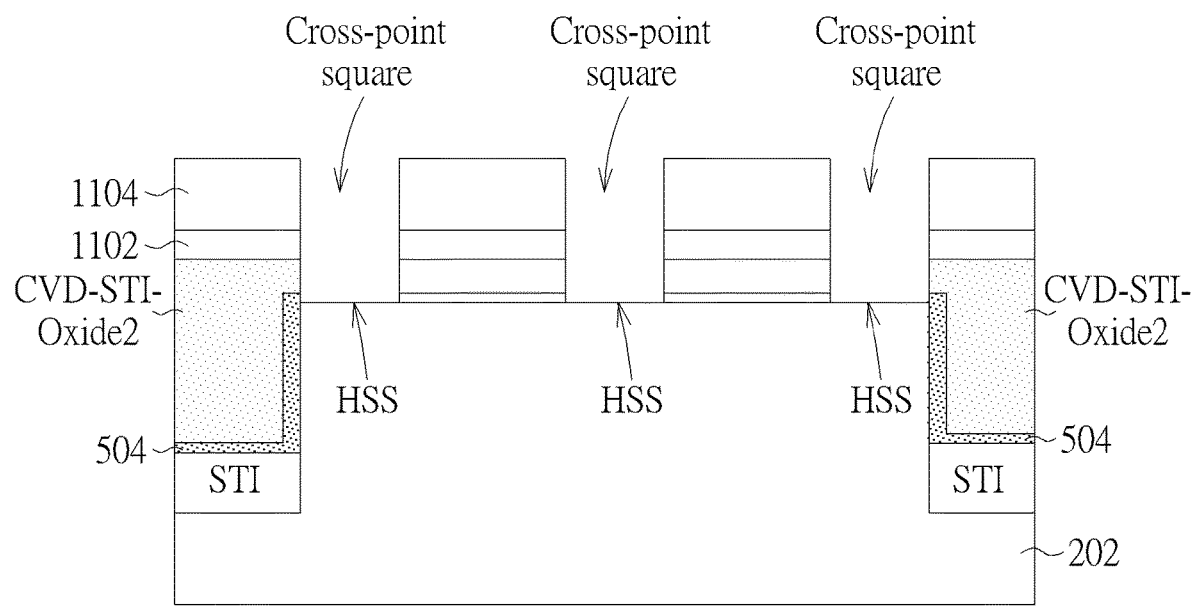

Step 130: The patterned photoresist layer 1106, the pad-nitride layer 206, and the pad-oxide layer 204 are removed, and the HSS could be revealed (FIG. 12).

Figure 13:
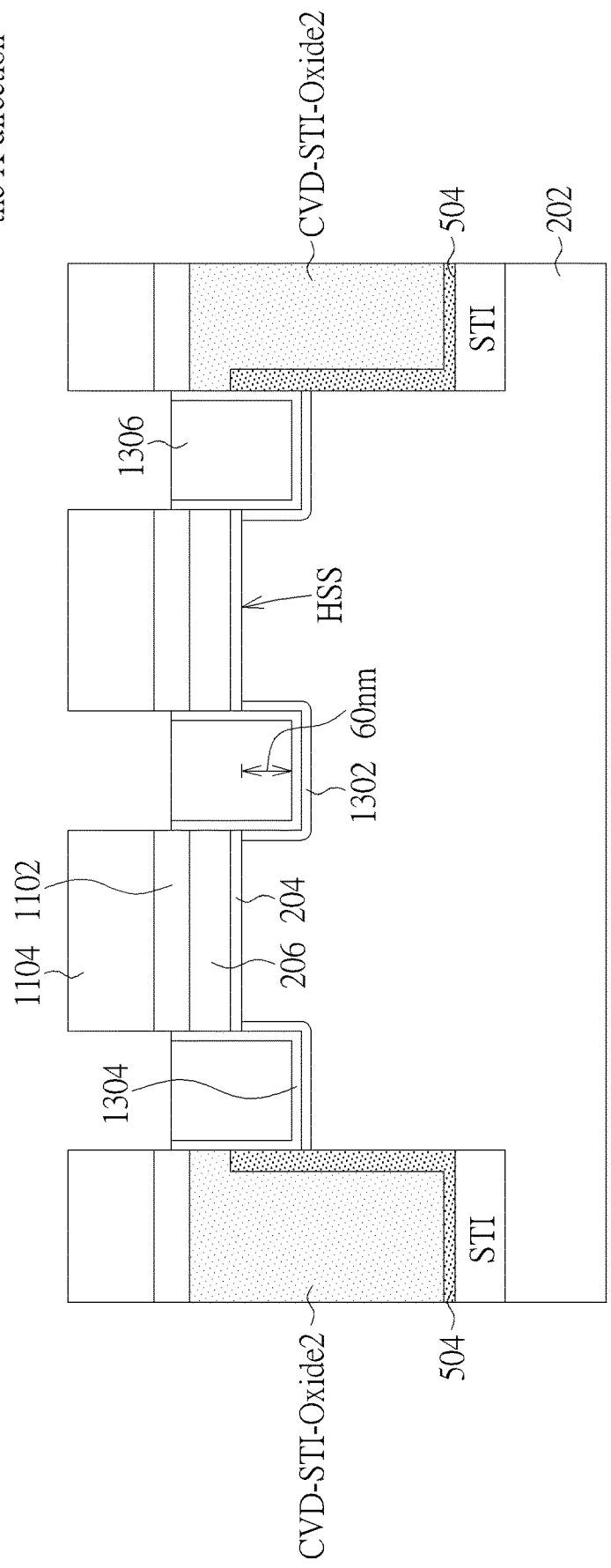
FIG. 13 is a diagram illustrating creating the U-shaped concave, the high-k insulator layer being formed as the gate dielectric layer of the access transistor, and the gate material being deposited and then etched back to form the word lines and the gate structures of the access transistors.

Step 132: The revealed HSS is etched to create a U-shaped concave, a high-k insulator layer 1304 is formed, and a gate material 1306 (such as Tungsten) is deposited and then etched back to form the word lines and the gate structures of the access transistors (FIG. 13). Such access transistor could be named as U-transistor.

Figure 14:
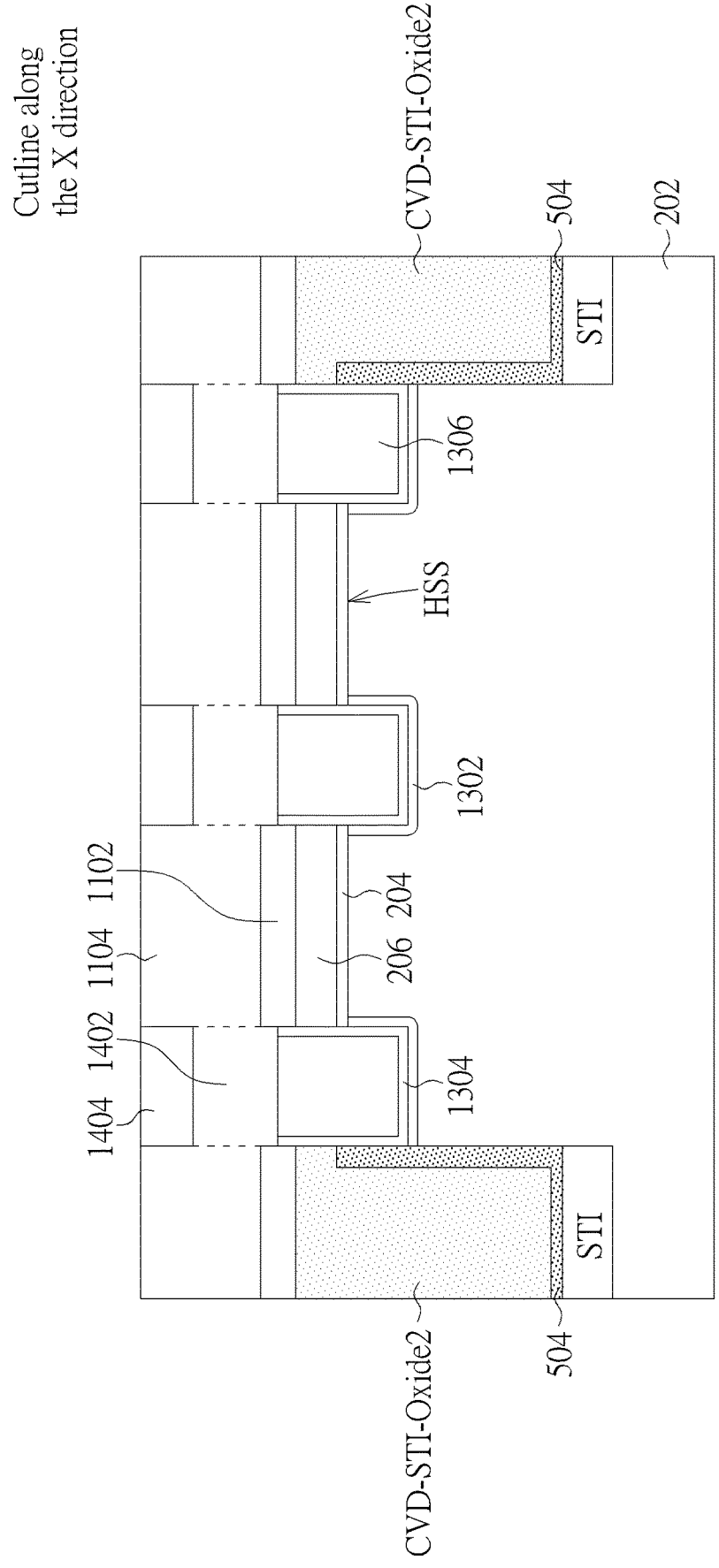
FIG. 14 is a diagram illustrating the nitride-3 layer and the oxide-4 layer being deposited and then polishing back the nitride-3 layer and the oxide-4 layer.

Step 134: Deposit and then etch back a nitride-3 layer 1402, subsequently deposit an oxide-4 layer 1404, and then etch back or planarize the oxide-4 layer 1404 (FIG. 14).

Figure 15:
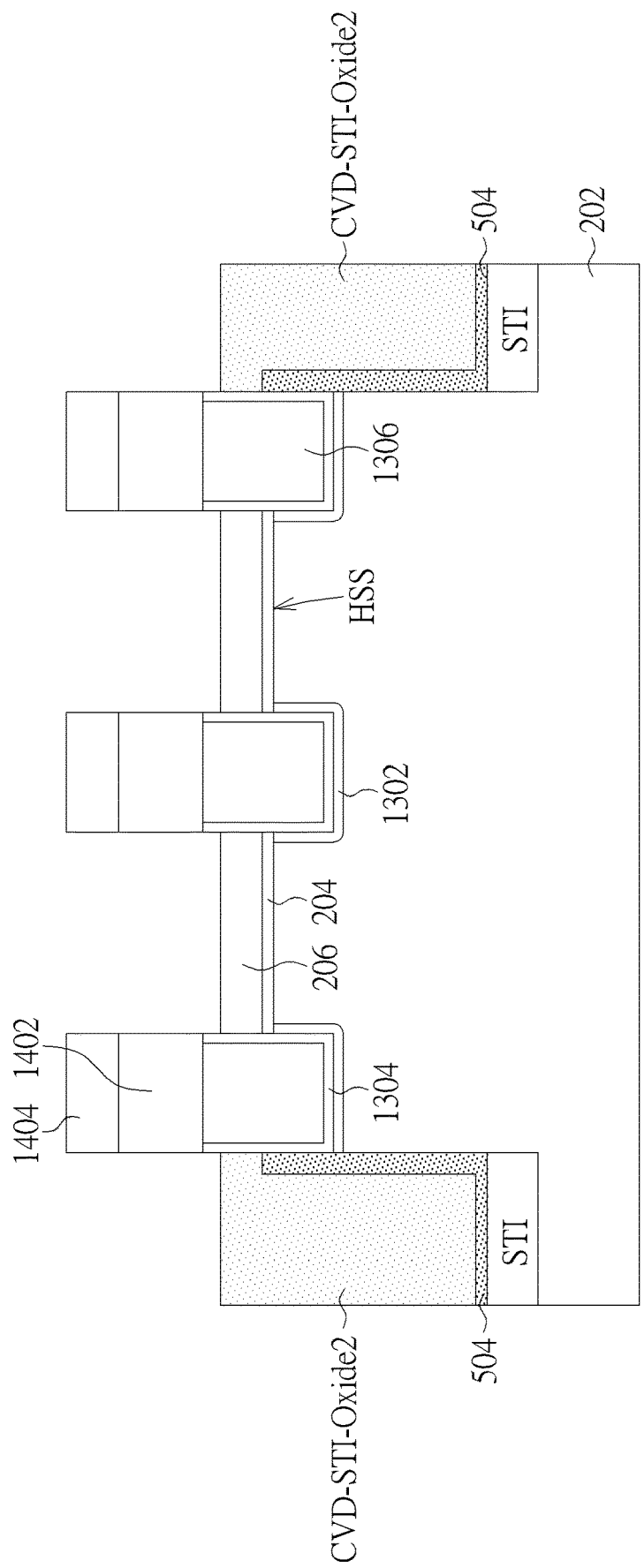
FIG. 15 is a diagram illustrating the nitride-2 layer and the oxide-3 layer being etched away.

Step 136: Etch away the nitride-2 layer 1104 and the oxide-3 layer 1102 (FIG. 15).

Please refer to FIG. 1F and FIGS. 16-22. Step 35 could include:

Step 138: Remove the pad-nitride layer 206, and etch back the CVD-STI-oxide2 to the top surface of the pad-oxide layer 204.

Figure 16:
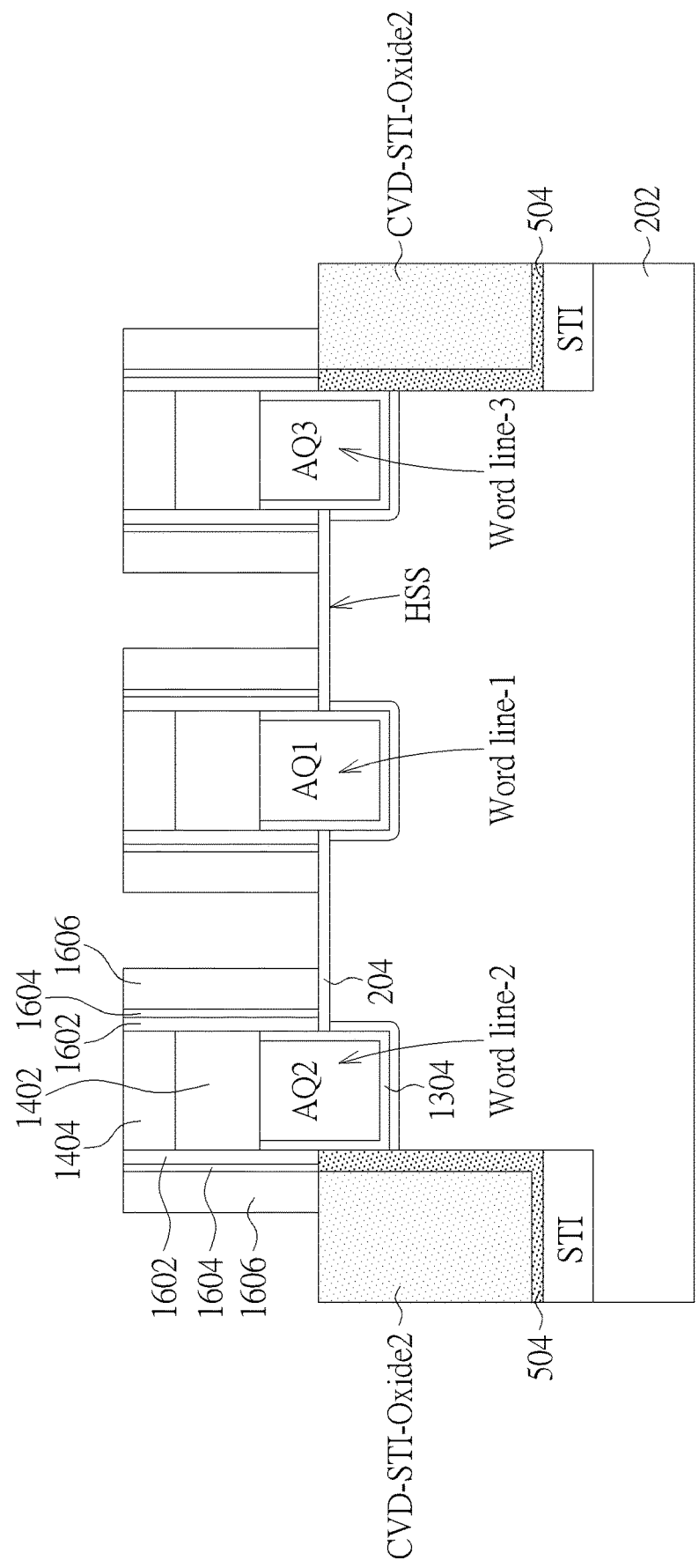
FIG. 16 is a diagram illustrating the pad-nitride layer 206 being removed, the CVD-STI-oxide2 being etched back, and the nitride-4 layer, the oxide-5 layer, the polysilicon-1 layer being deposited and etched.

Step 140: Deposit and anisotropic etch a nitride-4 layer 1602, an oxide-5 layer 1604, and a polysilicon-1 layer 1606, respectively (FIG. 16).

Figure 17:
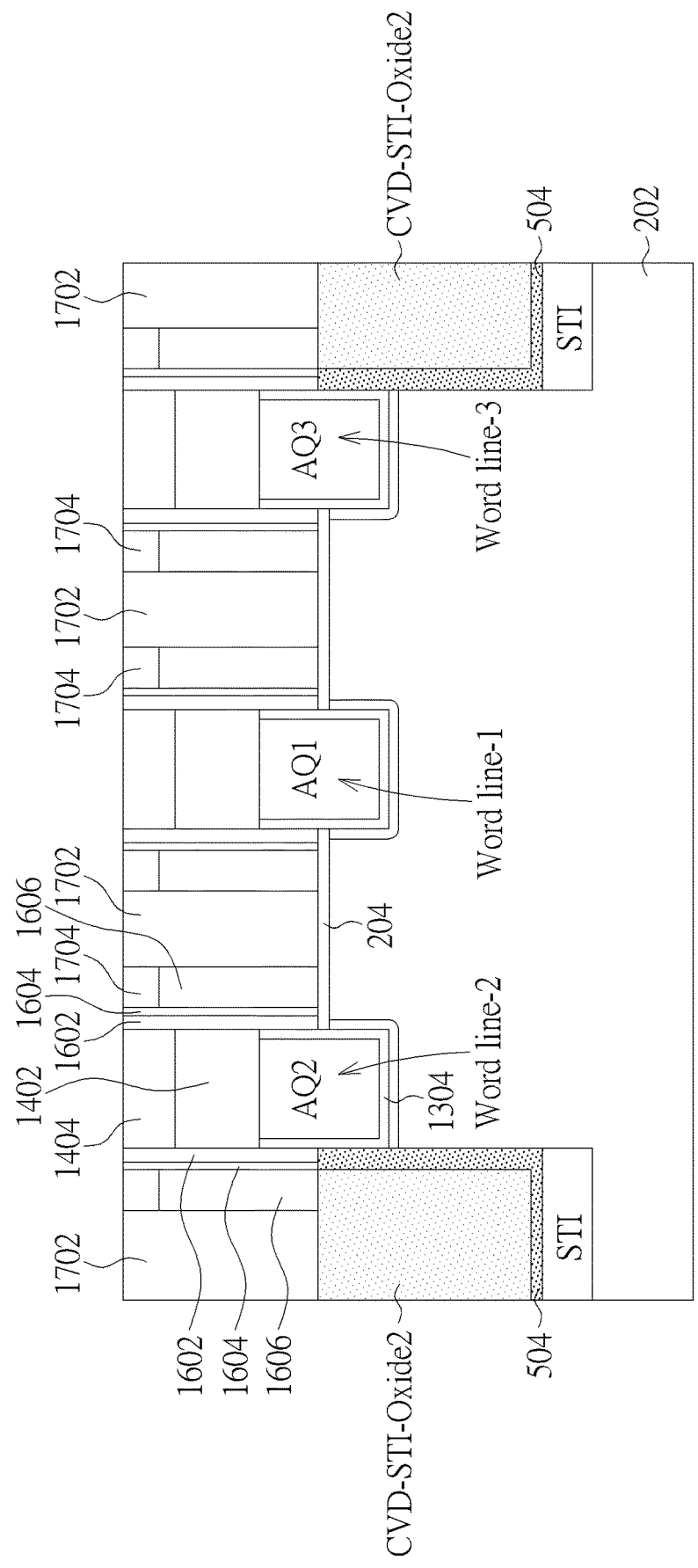
FIG. 17 is a diagram illustrating the SOD being deposited and polished, some upper part of the polysilicon-1 layer being etched, and the cap-oxide-1 layer being deposited and planarized.

Step 142: Deposit and then CMP a spin-on dielectrics (SOD) 1702, etch upper part of the polysilicon-1 layer 1606, and deposit and then CMP a cap-oxide-1 layer 1704 (FIG. 17).

Figure 18:
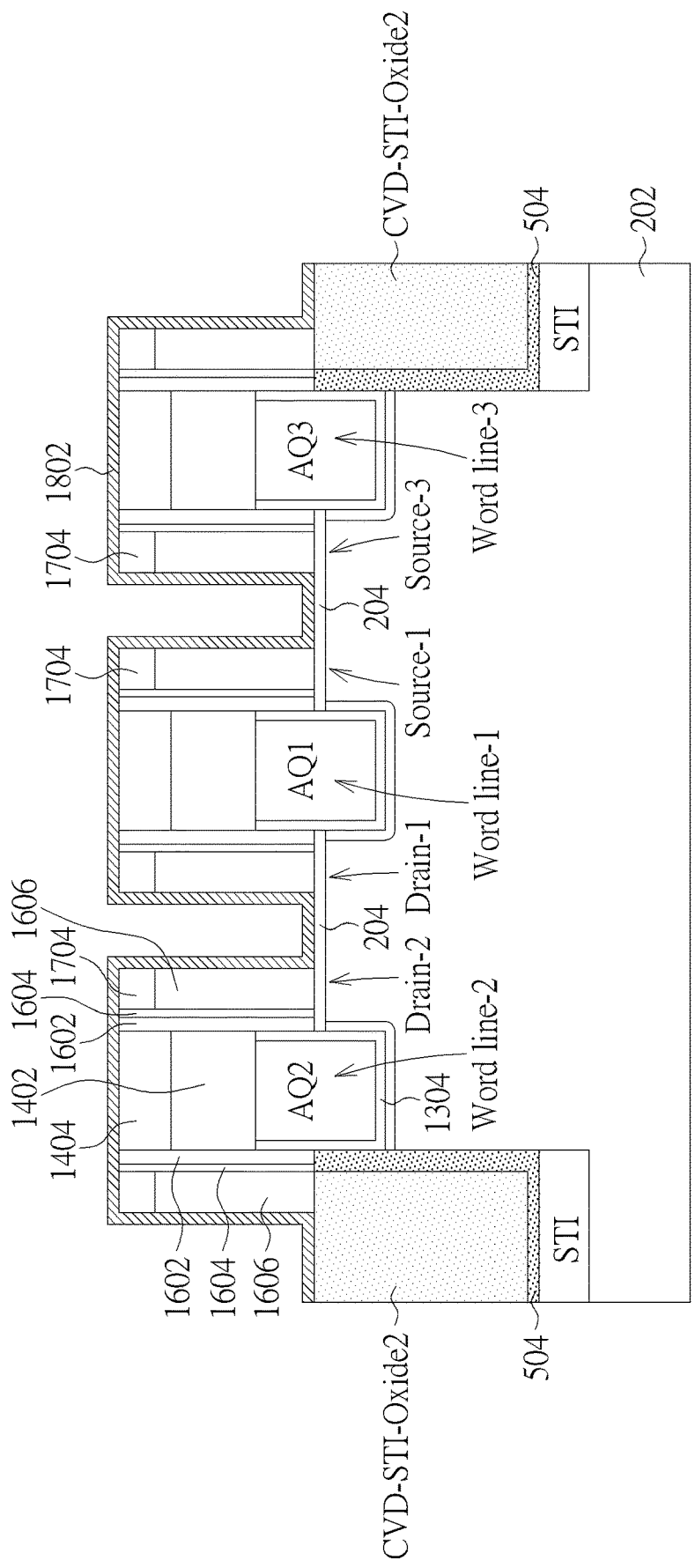
FIG. 18 is a diagram illustrating the SOD being etched away and the nitride-5 layer 1802 being deposited.

Step 144: Remove the SOD 1702, and then deposit a nitride-5 layer 1802 (FIG. 18).

Figure 19:
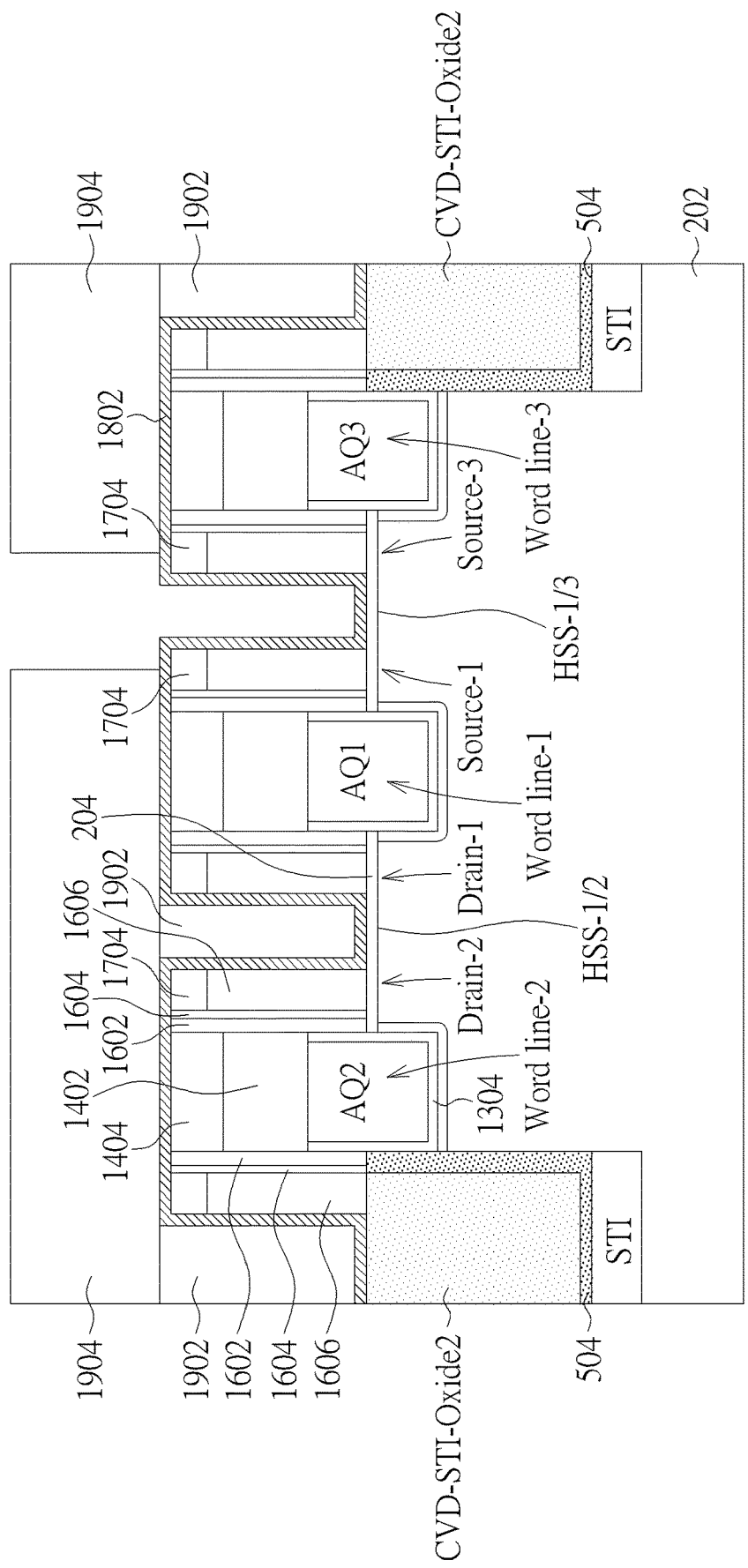
FIG. 19 is a diagram illustrating the SOD being deposited, the photoresist being deposited, and the SOD corresponding to the areas reserved for the source region being removed.

Step 146: Deposit and a SOD 1902, deposit a photoresist 1904, and then etch back unwanted SOD 1902 (FIG. 19).

Figure 20:
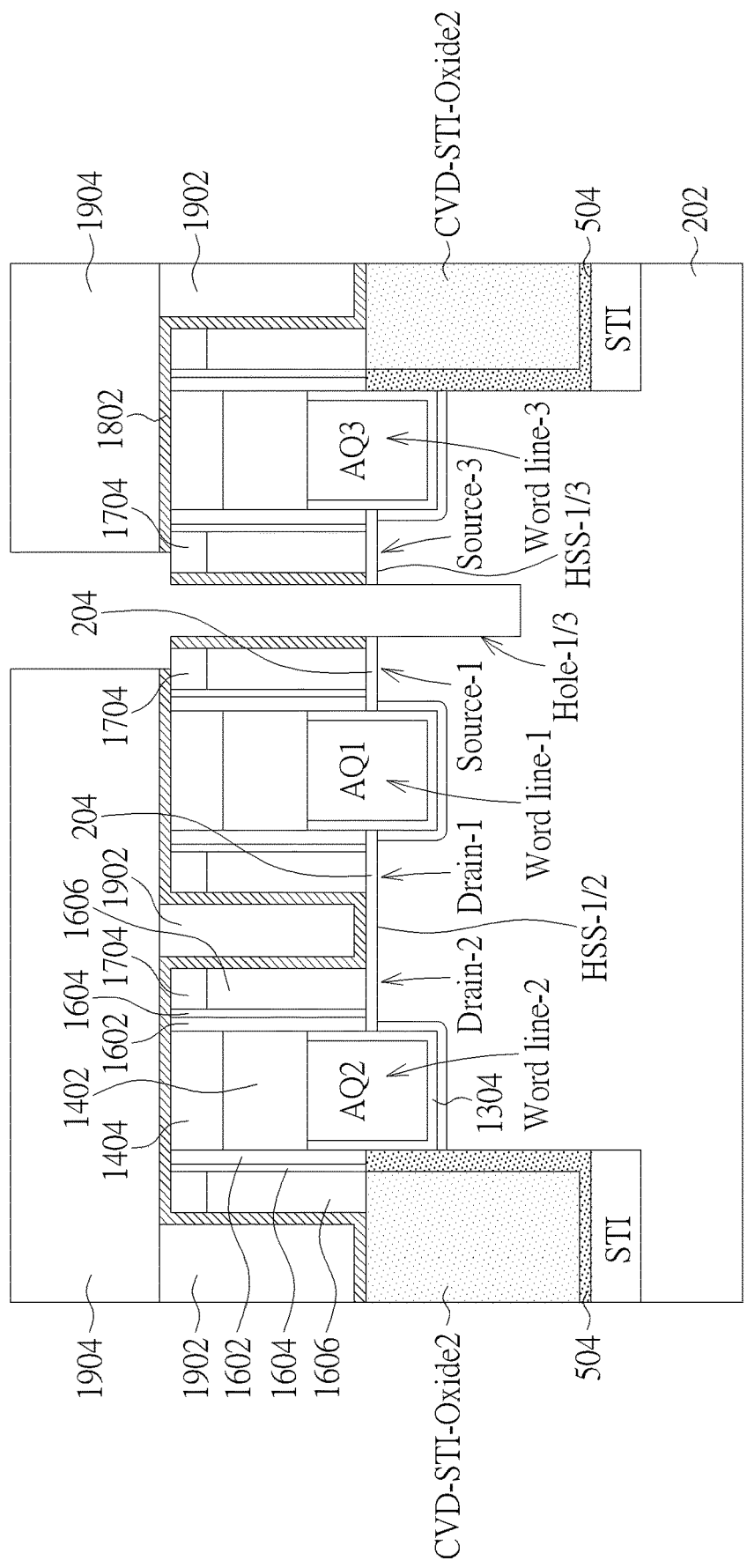
FIG. 20 is a diagram illustrating the exposed nitride-5 layer and the pad-oxide layer at a center of the source region being etched away and the silicon material corresponding to the center of the source region being dug to generate the hole-1/3.

Step 148: Etch away the exposed nitride-5 layer 1802, the pad-oxide layer 204, and silicon material corresponding to the HSS-1/3 to generate a hole-1/3 (FIG. 20).

Figure 21:
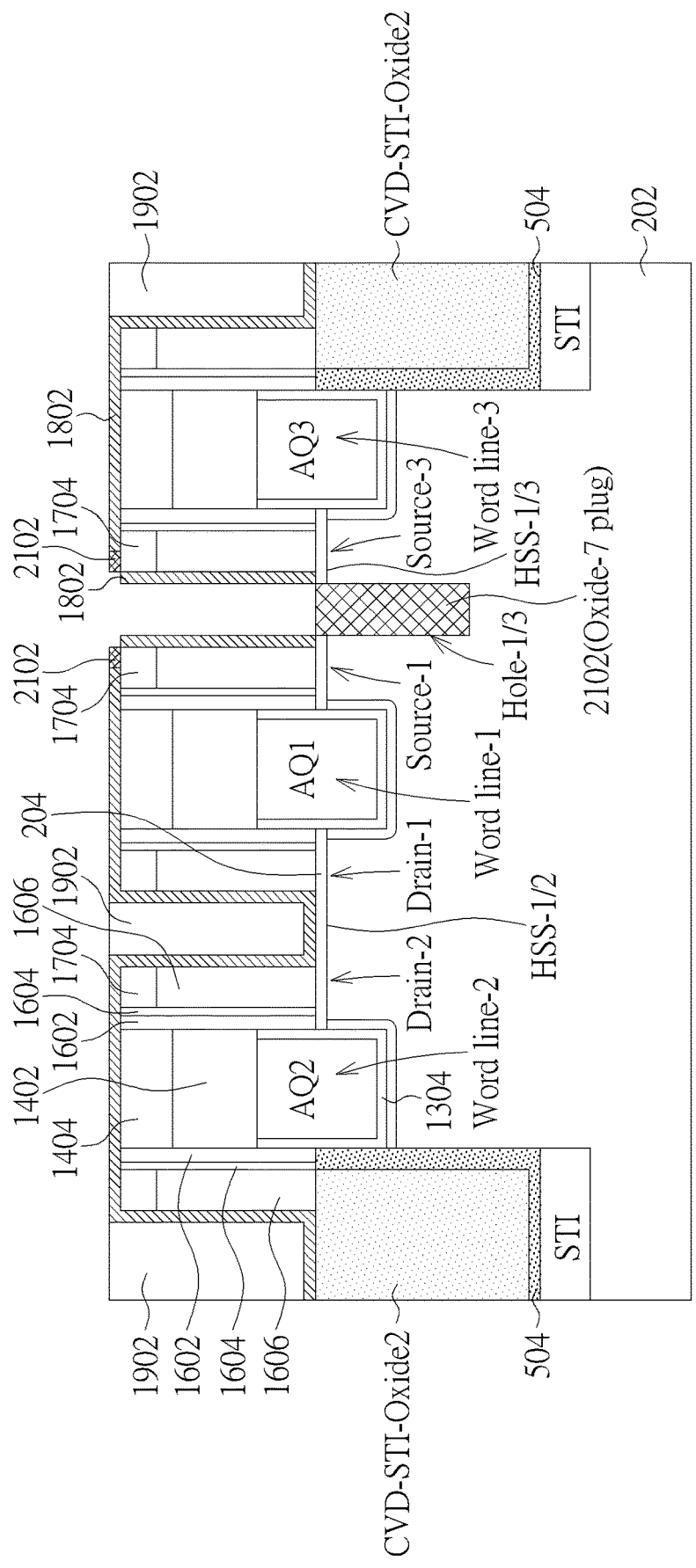
FIG. 21 is a diagram illustrating the oxide-7 layer being grown thermally in the hole-1/3.

Step 150: Remove the photoresist 1904 and thermally grow an oxide-7 layer 2102 (FIG. 21).

Figure 22:
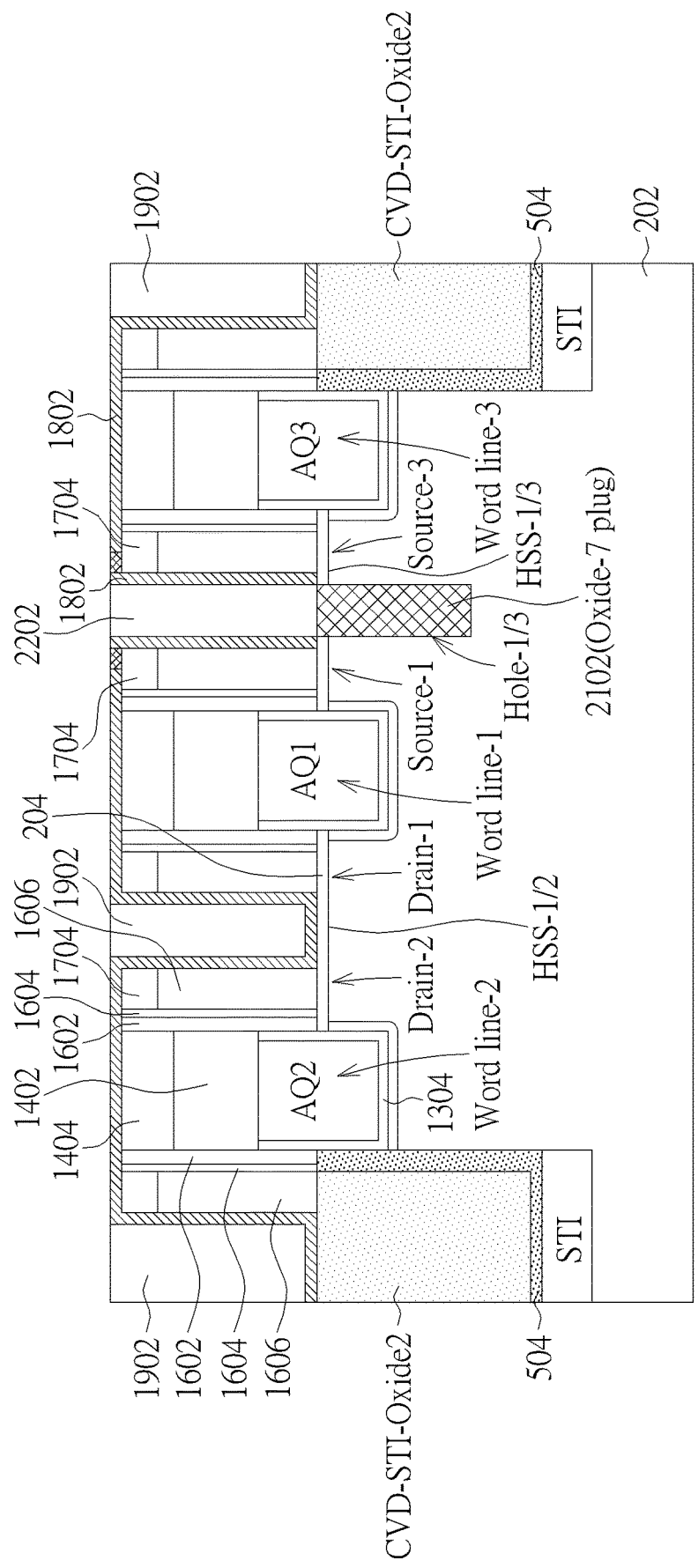
FIG. 22 is a diagram illustrating the another SOD layer being deposited and etched back.

Step 152: Deposit another SOD layer 2202 on the oxide-7 layer 2102 and then etch back the another SOD layer 2202 (FIG. 22).

Figure 23:
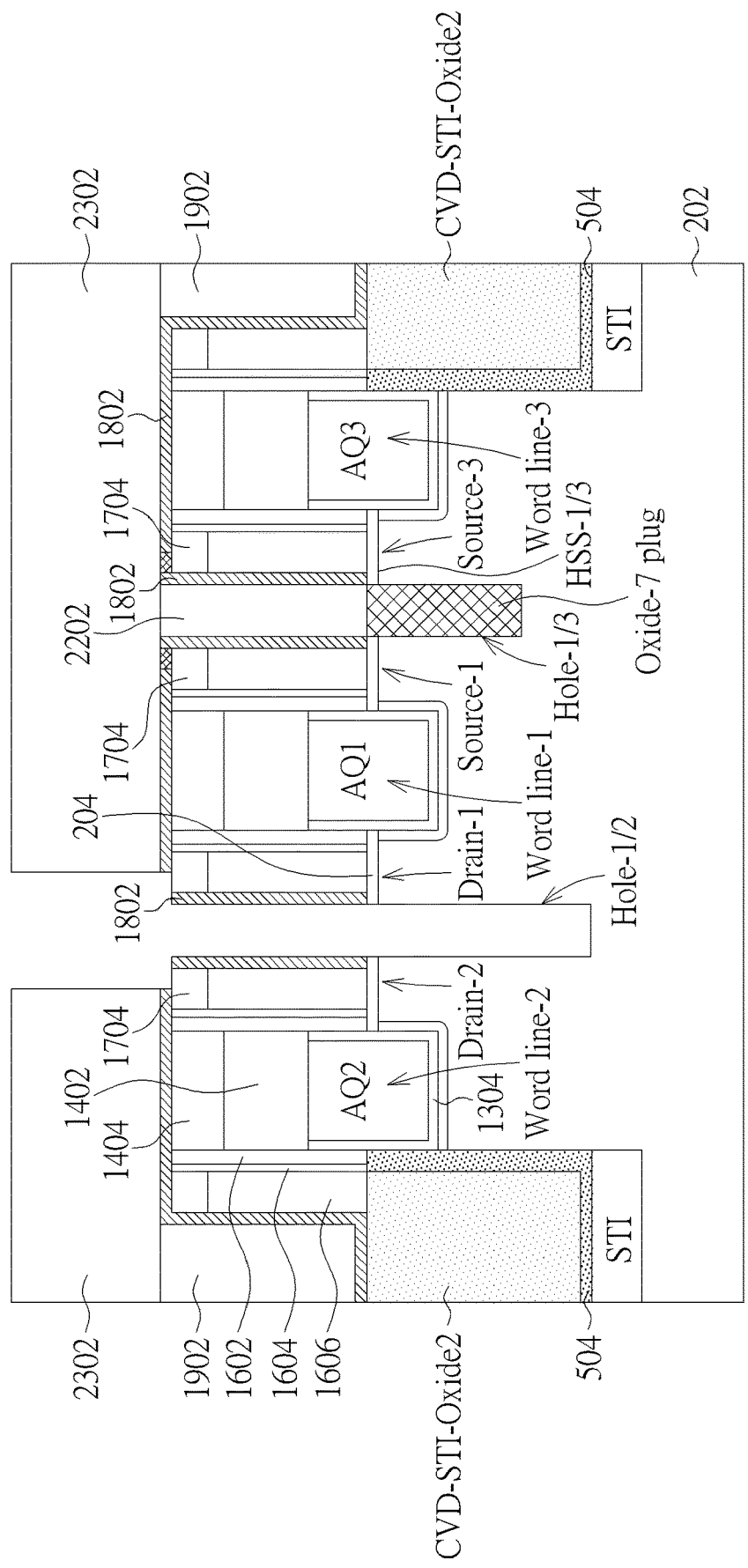
FIG. 23 is a diagram illustrating the photoresist being deposited to cover the area corresponding to the source region and to expose the area reserved for the drain region, the exposed SOD, the exposed nitride-5 layer, the exposed pad-oxide layer underneath, and silicon material being removed to generate the hole-1/2.

Please refer to FIG. 1G and FIGS. 23-33. Step 40 could include:

Step 154: Deposit photoresist 2302, remove the exposed SOD 1902, the exposed nitride-5 layer 1802, and the exposed pad-oxide layer 204; and then dig and remove the silicon material corresponding to the HSS-1/2 to generate a hole-1/2 (FIG. 23).

Figure 24:
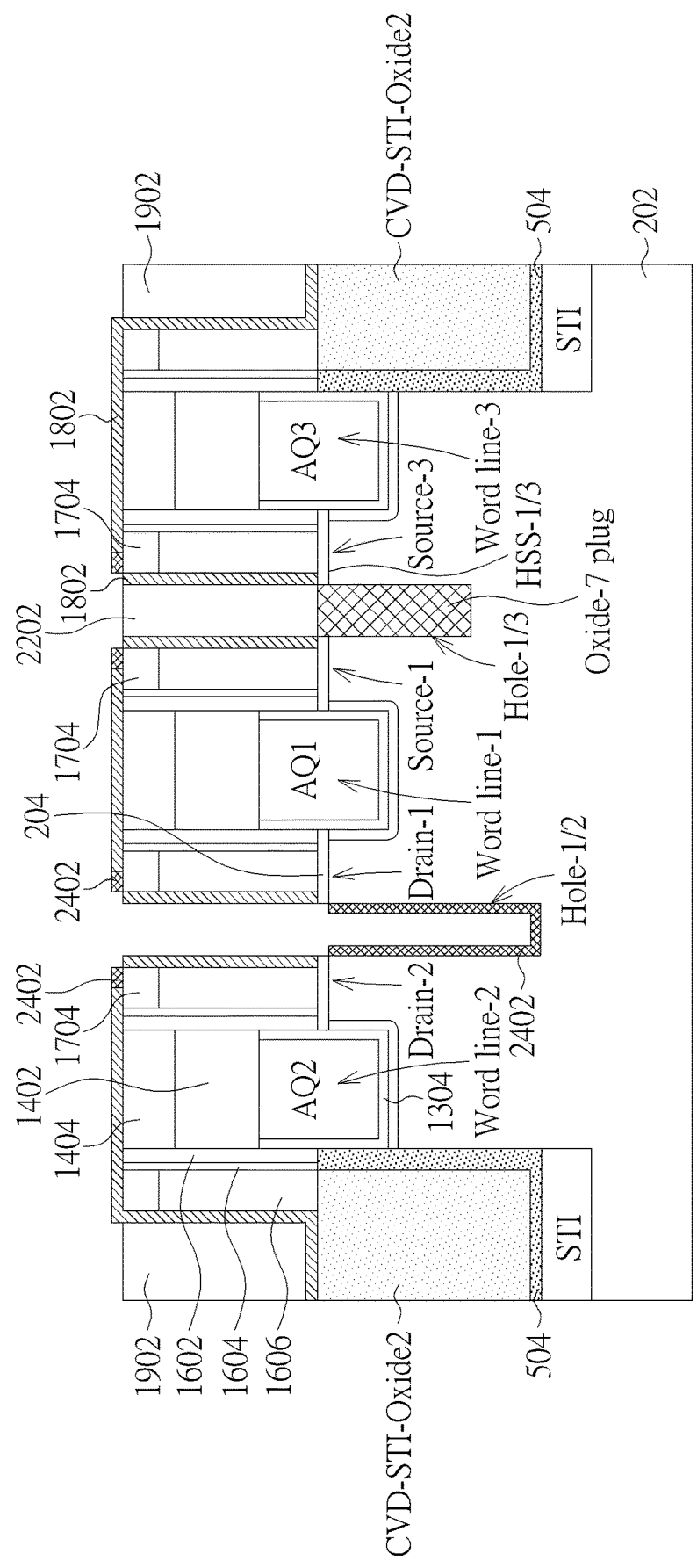
FIG. 24 is a diagram illustrating the photoresist being removed and the oxide-8 layer being thermally grown to generate the oxide-8 spacer.
Figure 25:
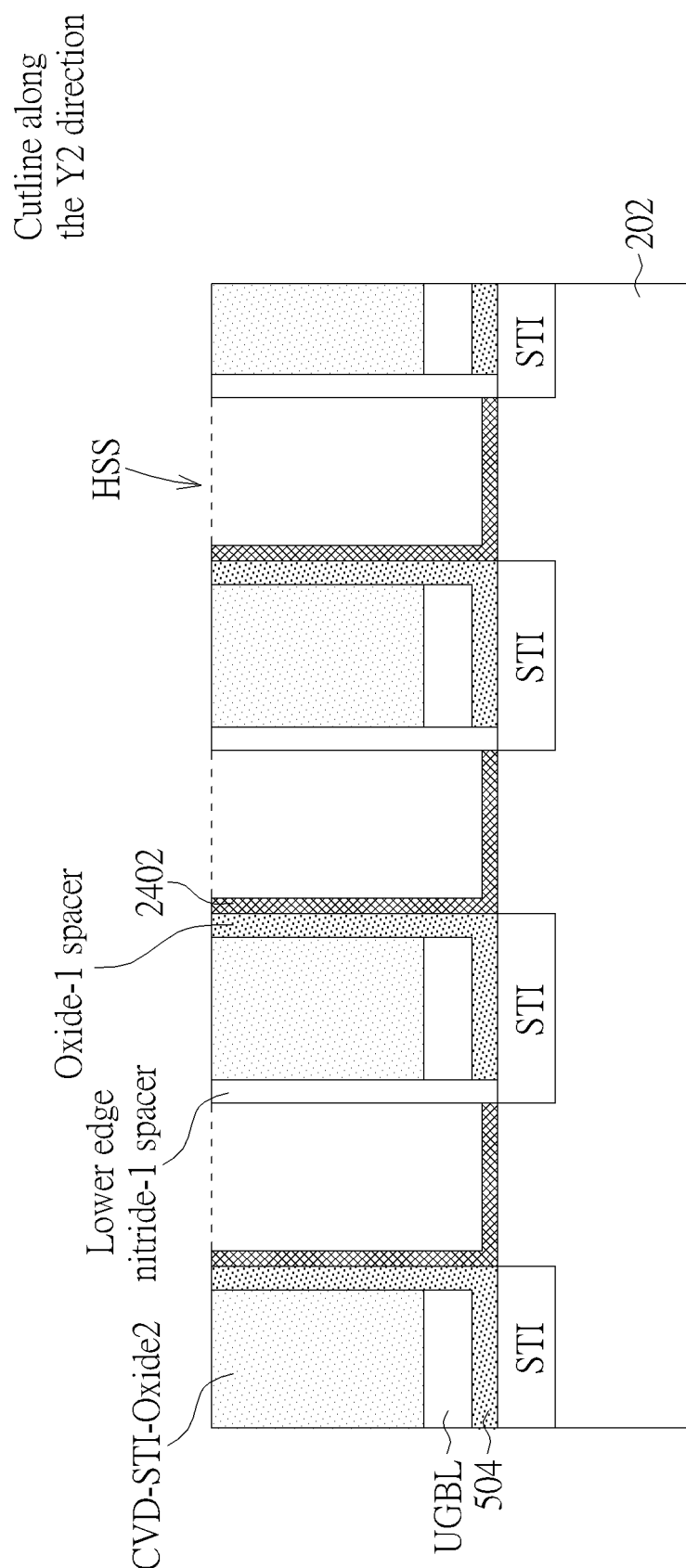
FIG. 25 is a diagram illustrating a cross-section view of the DRAM cell array along a Y2 direction showing the cross section of the hole-1/2.

Step 156: Remove the photoresist 2302 and grow an oxide-8 layer 2402 thermally (FIG. 24 & FIG. 25).

Figure 26:
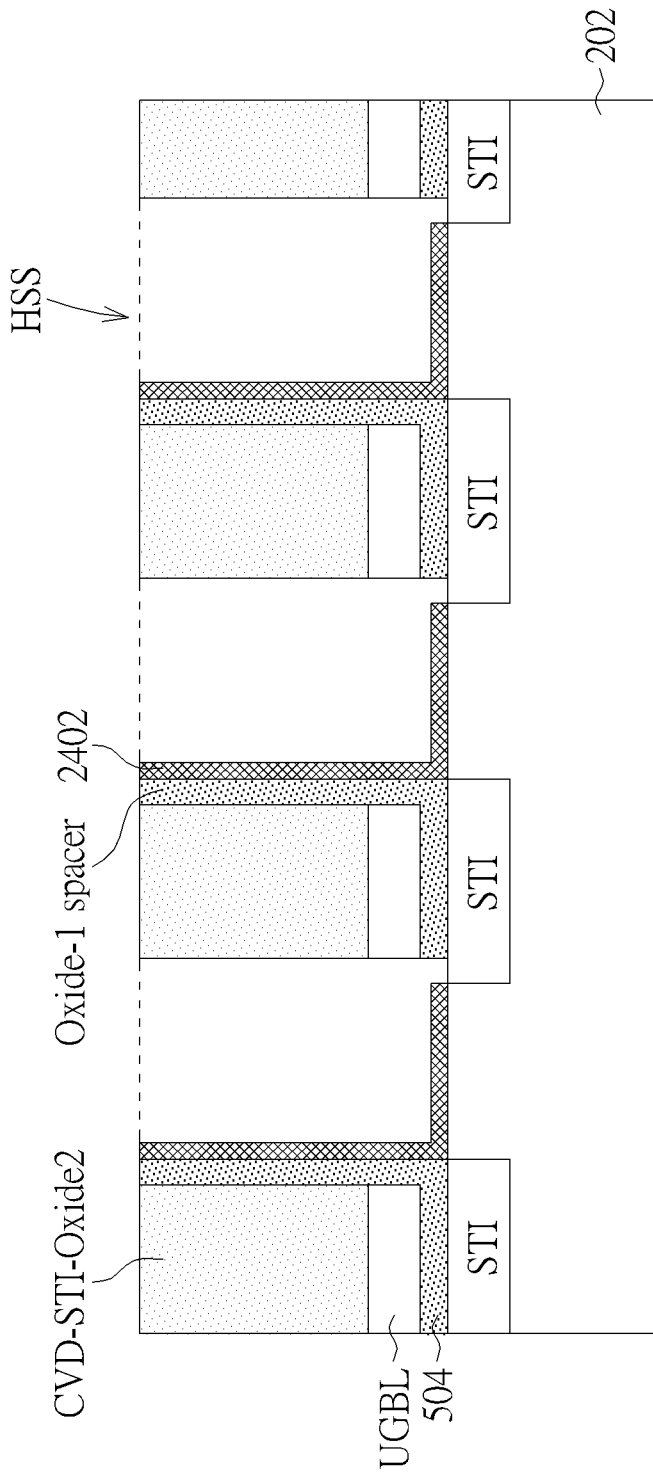
FIG. 26 is a diagram illustrating the lower edge nitride-1 spacer inside the hole-1/2 being etched.
Figure 27:
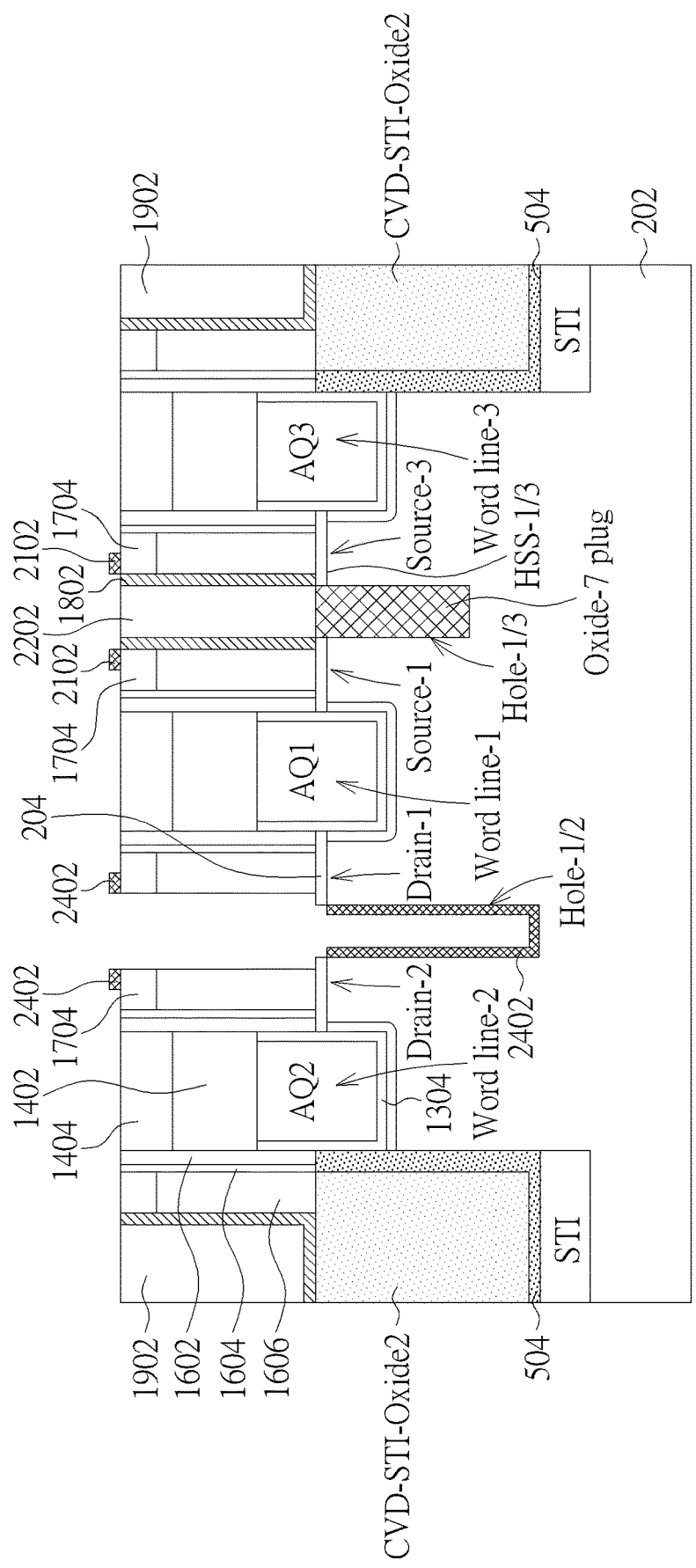
FIG. 27 is a diagram illustrating the nitride-5 layer being removed.

Step 158: Remove the lower edge nitride-1 spacer to reveal sidewall of the underground bit line and remove the nitride-5 layer 1802 (FIG. 26 & FIG. 27).

Figure 28:
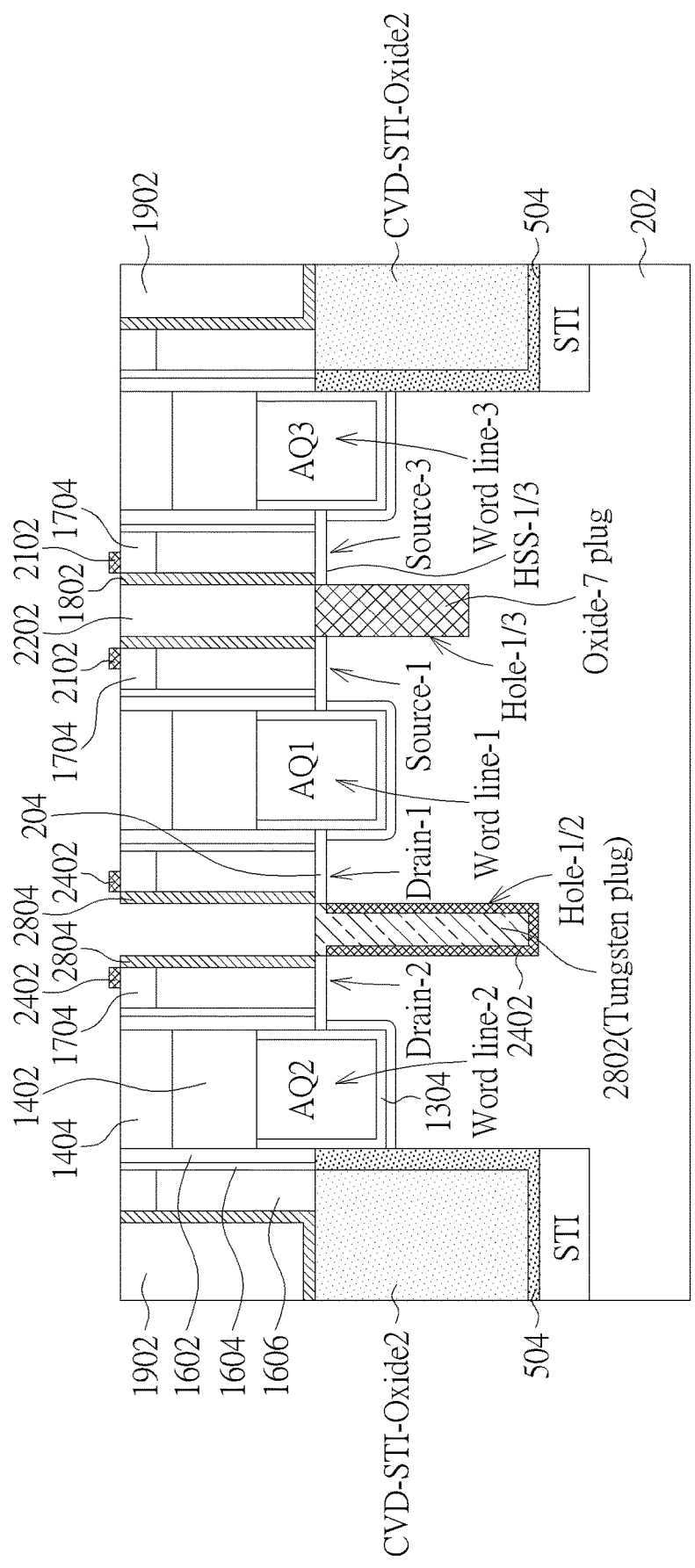
FIG. 28 is a diagram illustrating the metal layer being deposited and etched back to leave Tungsten plug inside the hole-1/2, and the nitride-6 layer being deposited and etched.

Step 160: Deposit a metal layer 2802 in the hole-1/2 to contact the sidewall of the UGBL, and then deposit and etch back a nitride-6 layer 2804 to create a nitride-6 spacer (FIG. 28).

Figure 29:
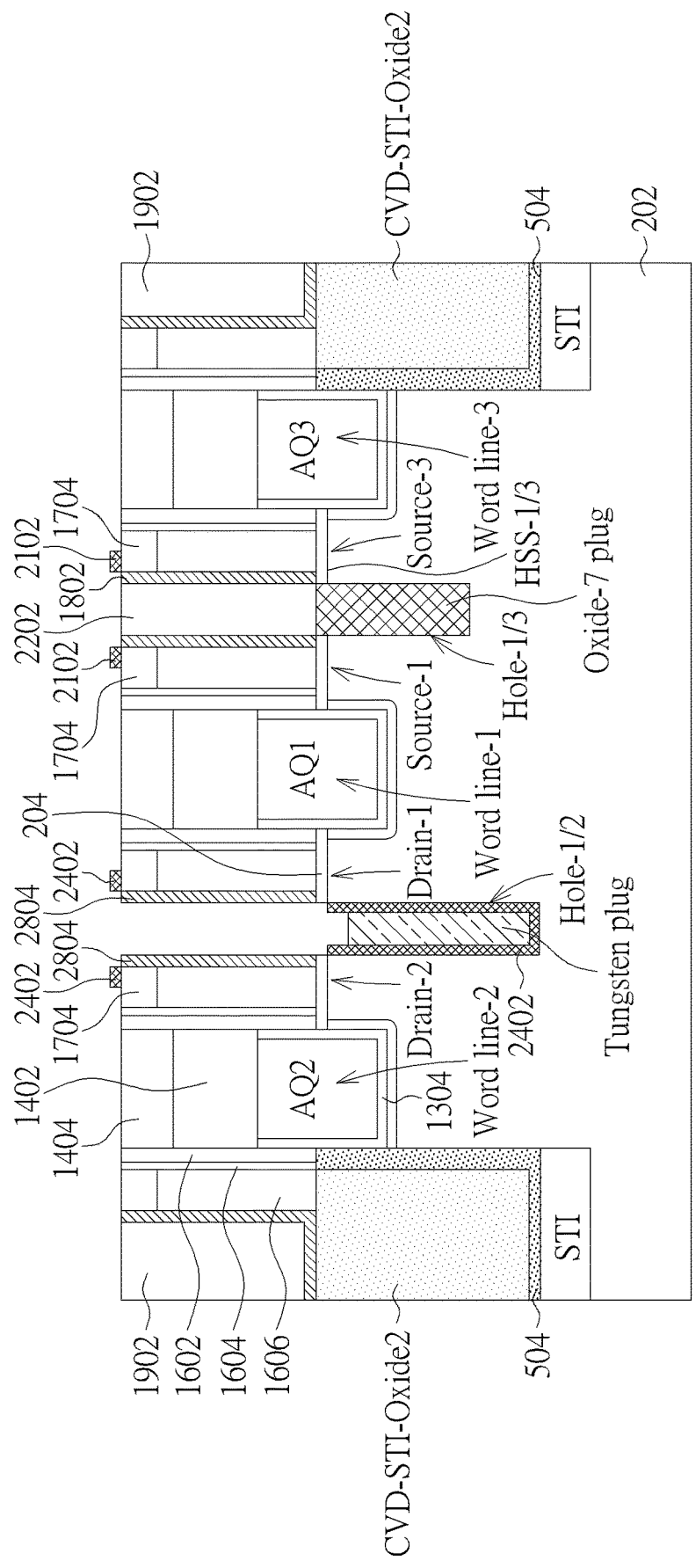
FIG. 29 is a diagram illustrating some upper portion of the Tungsten plug below the HSS being etched back.
Figure 30:
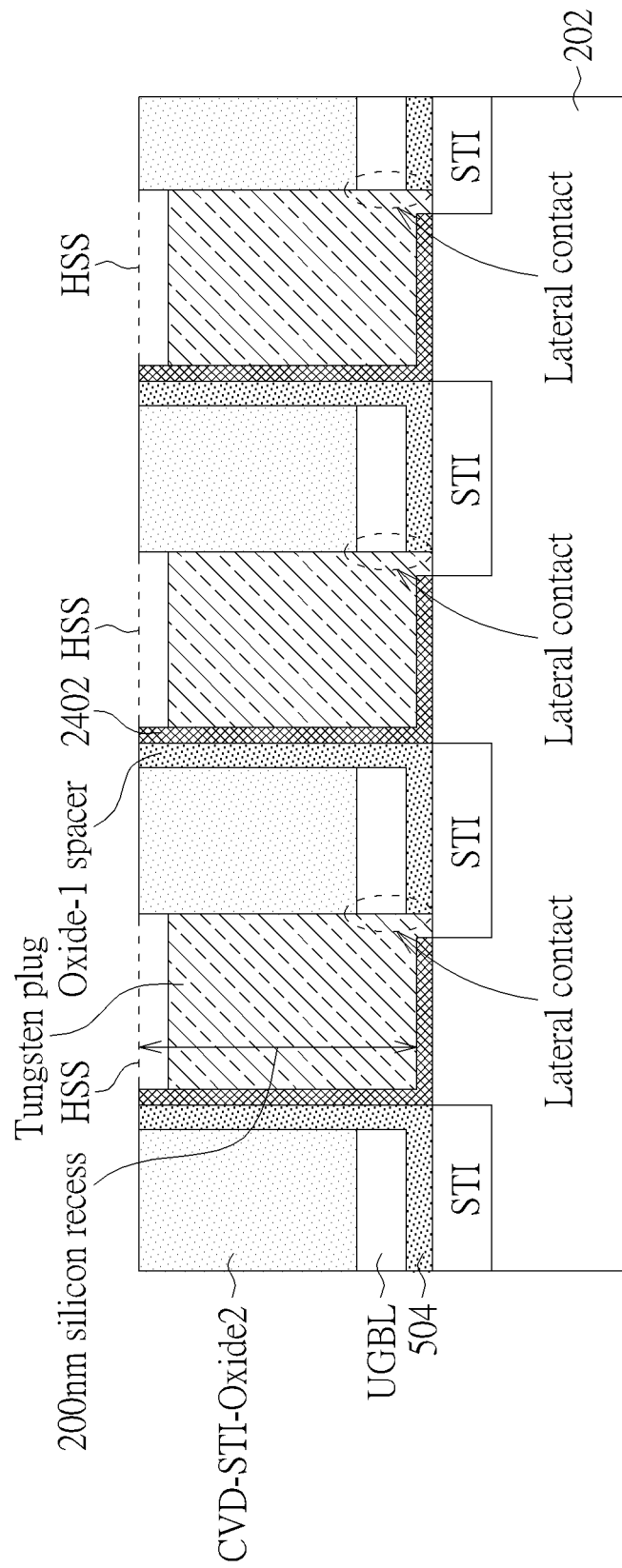
FIG. 30 is a diagram illustrating the Tungsten plug being connected to the UGBL.

Step 162: Etch back an upper portion of the metal layer 2802 (FIG. 29 & FIG. 30).

Figure 31:
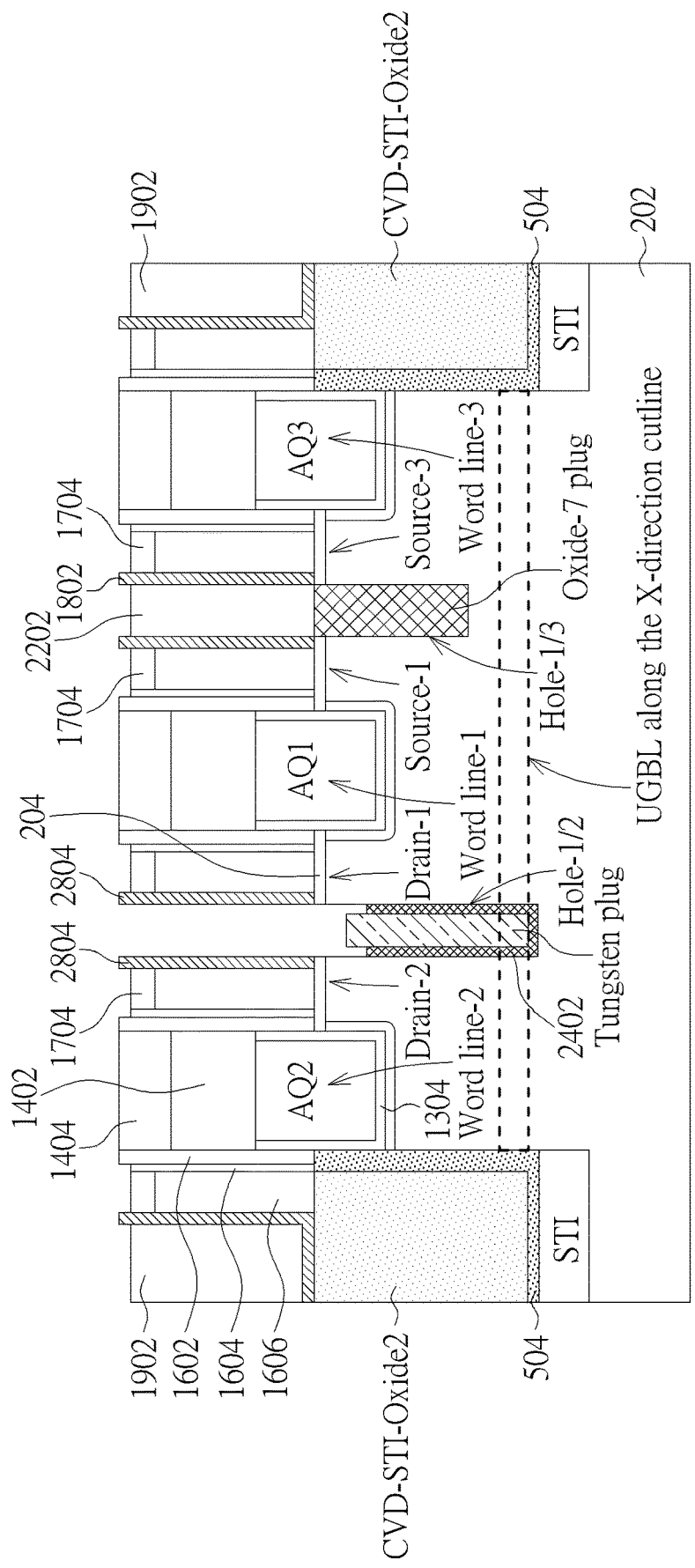
FIG. 31 is a diagram illustrating the upper portion of the oxide-8 layer being removed.

Step 164: Etch back an upper portion of the oxide-8 layer 2402 to reveal silicon material corresponding to the hole-1/2 (FIG. 31).

Figure 32:
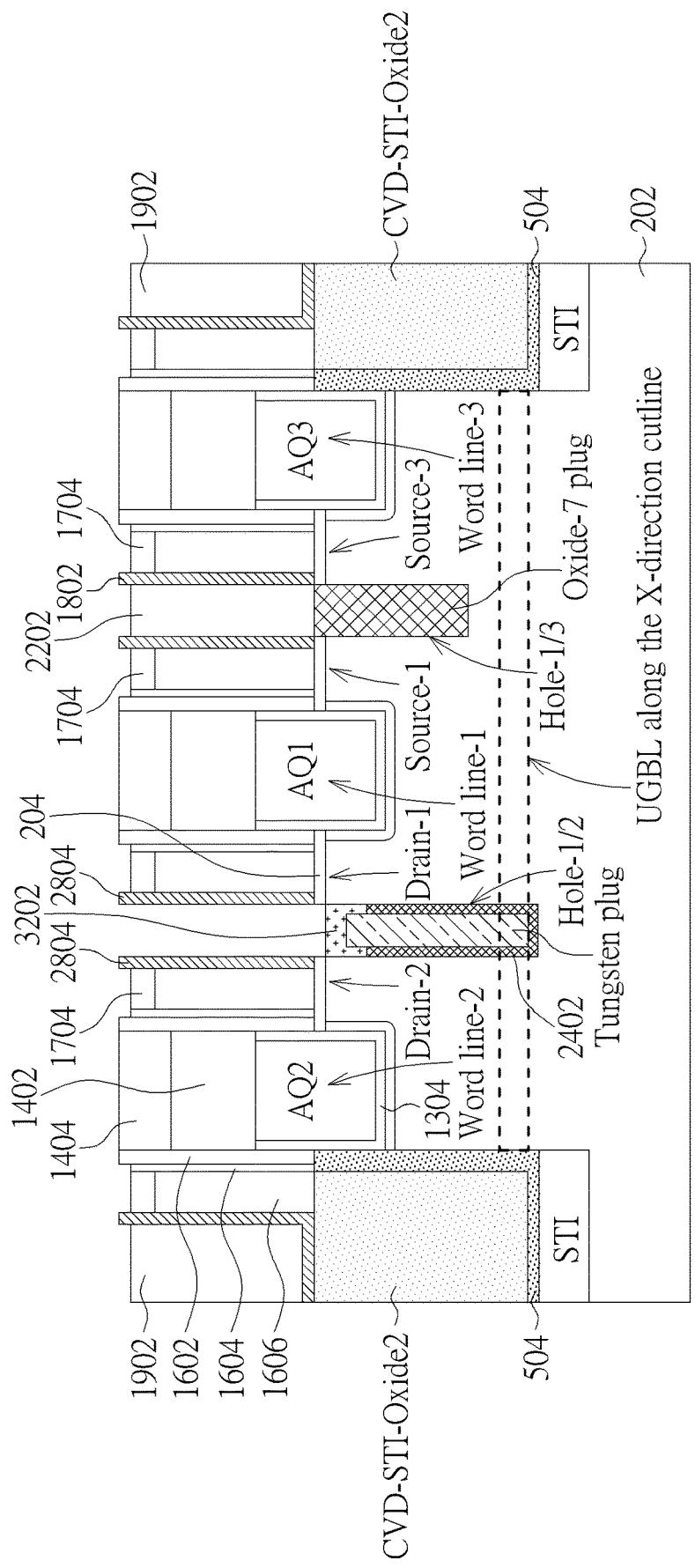
FIG. 32 is a diagram illustrating the n+ in-situ doped silicon layer being grown laterally to form the n+ silicon drain-collar.

Step 166: Grow laterally an n+ in-situ doped silicon layer 3202 based on the revealed silicon material to contact the drain region and the Tungsten plug (FIG. 32).

Figure 33:
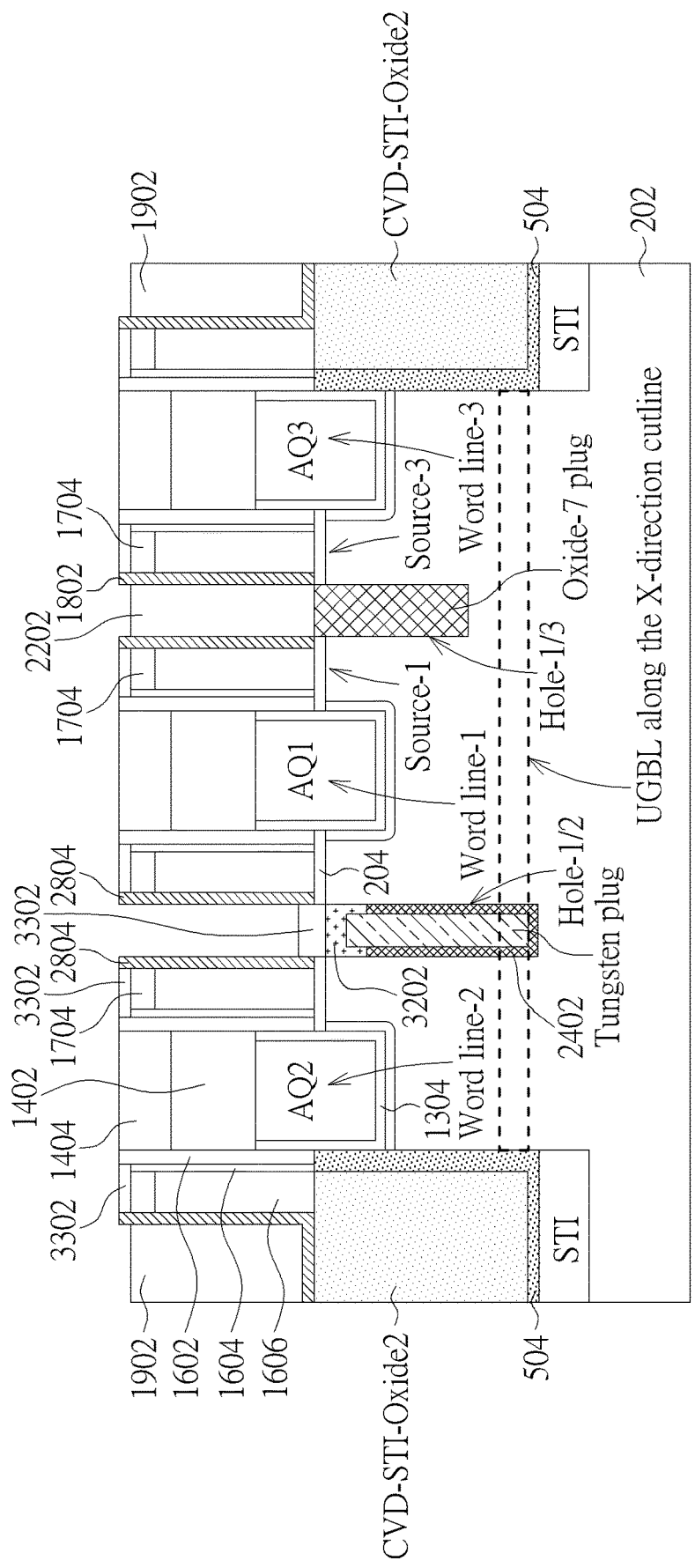
FIG. 33 is a diagram illustrating the oxide-9 layer being thermally grown locally over the n+ silicon drain-collar.

Step 168: Grow thermally an oxide-9 layer 3302 above the n+ in-situ doped silicon layer 3202 (FIG. 33).

Figure 34:
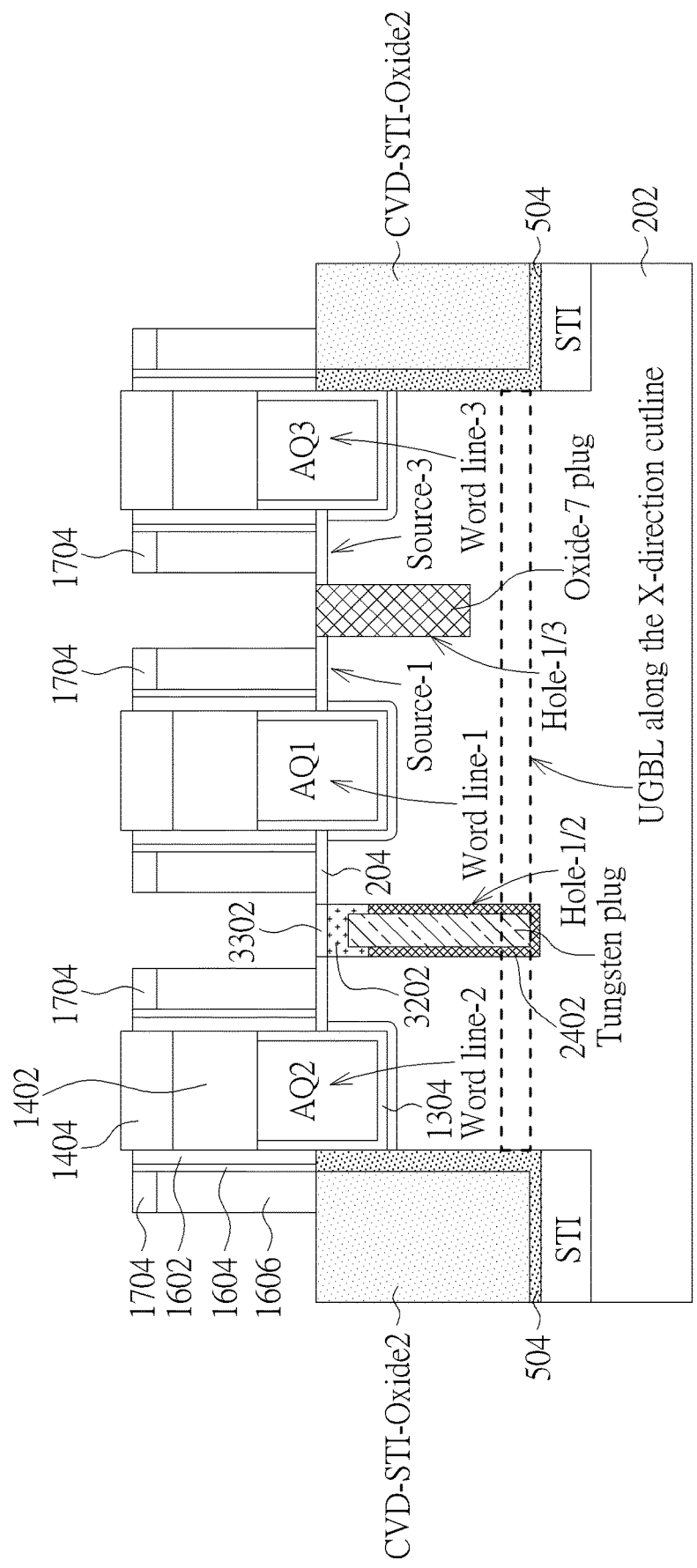
FIG. 34 is a diagram illustrating all the SODs, the nitride-5 layer, and the nitride-6 layer being removed.

Please refer to FIG. 1H and FIGS. 34-41. Step 45 could include:

Step 170: Remove all the SODs (i.e. the SOD layer 1902 and the another SOD layer 2202), the nitride-5 layer 1802, and the nitride-6 layer 2804 (FIG. 34).

Figure 36:
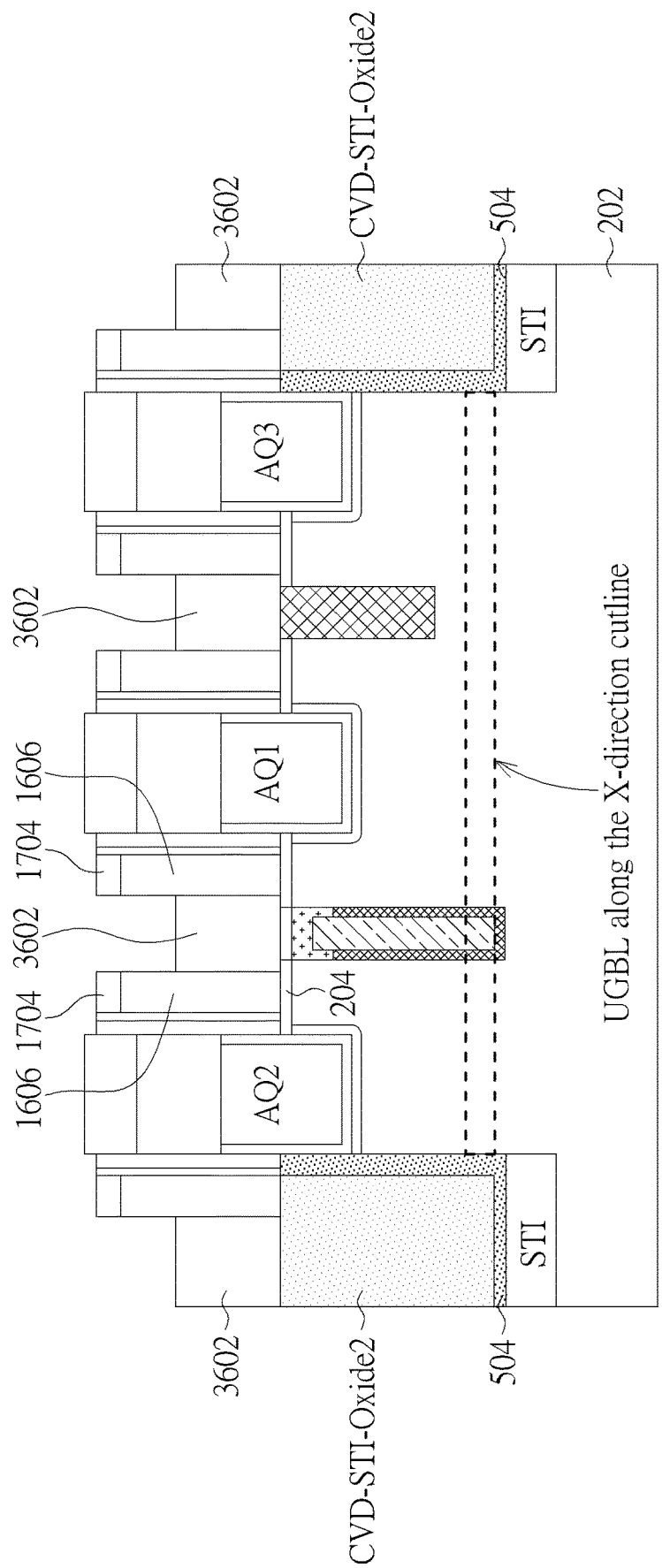
FIG. 36 is a diagram illustrating the metal layer being deposited and etched back.

Step 171: Deposit and etch back a metal layer 3602 (FIG. 36).

Figure 37:
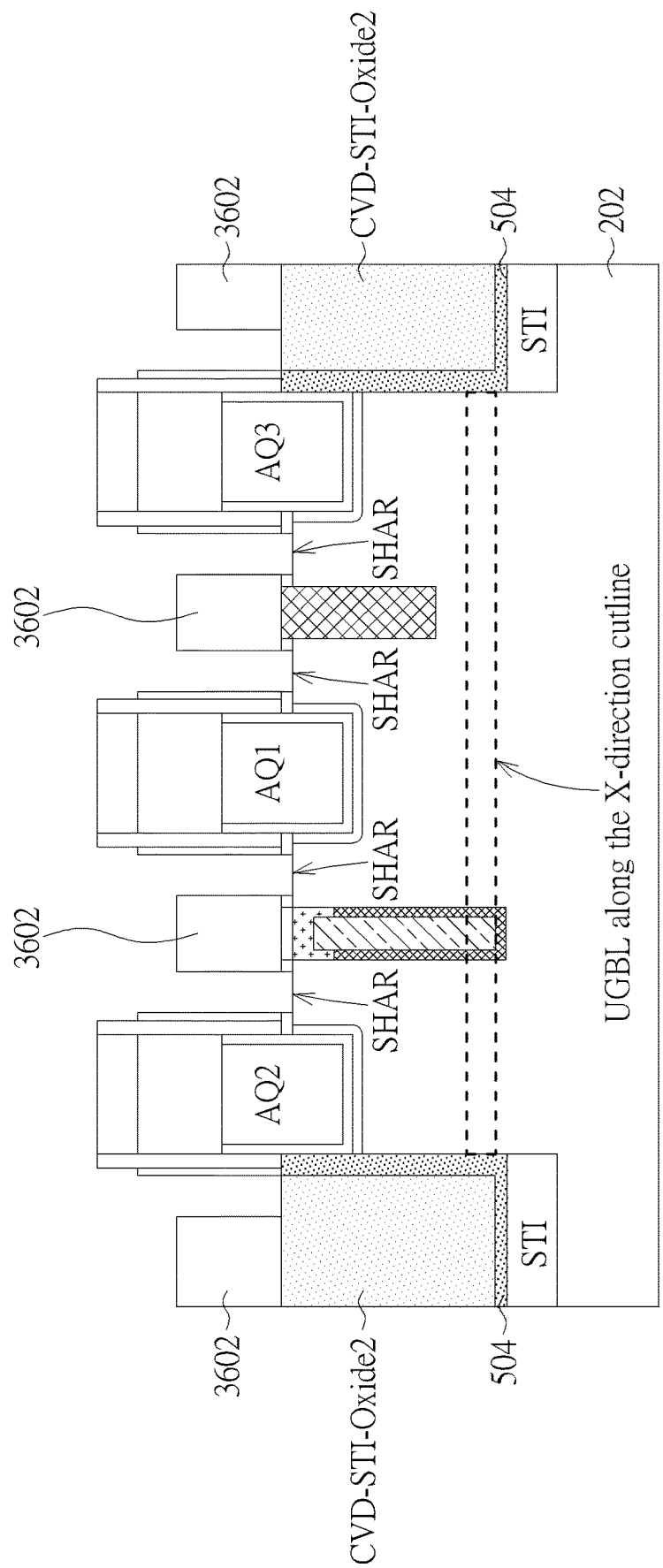
FIG. 37 is a diagram illustrating the cap-oxide-1 layer, the Polysilcon-1 spacer, and the pad-oxide layer 204 being removed to expose the HSS corresponding to the source region and the drain region.

Step 172: Etch away the cap-oxide-1 layer 1704, the polysilicon-1 spacer 1606, and the pad-oxide layer 204 underneath the polysilicon-1 spacer 1606 to expose the HSS corresponding to the source region and the drain region (FIG. 37).

Figure 38:
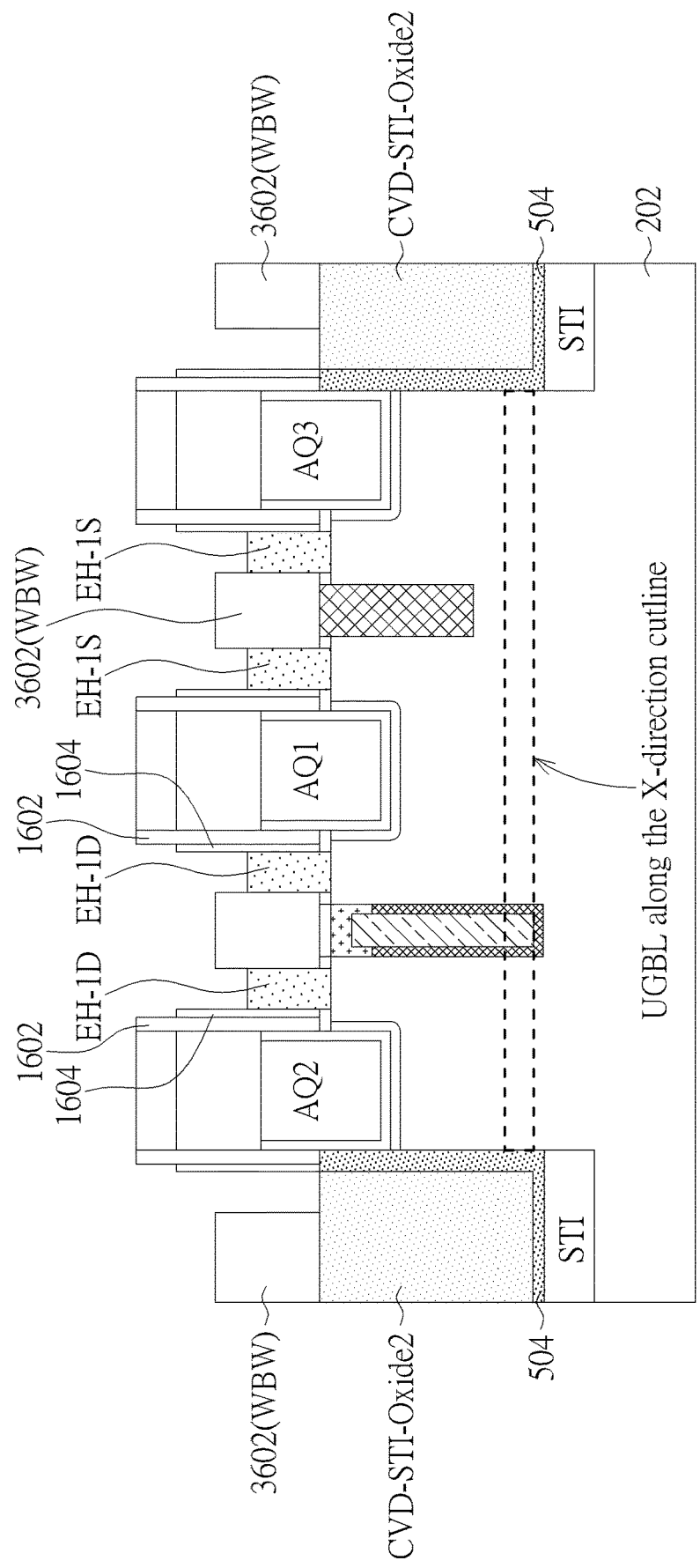
FIG. 38 is a diagram illustrating the elevated source electrode EH-1S and the elevated drain electrode EH-1D being grown.

Step 173: Grow both an elevated source electrode EH-1S and an elevated drain electrode EH-1D by using the selective epitaxy silicon growth technology (FIG. 38).

Figure 39:
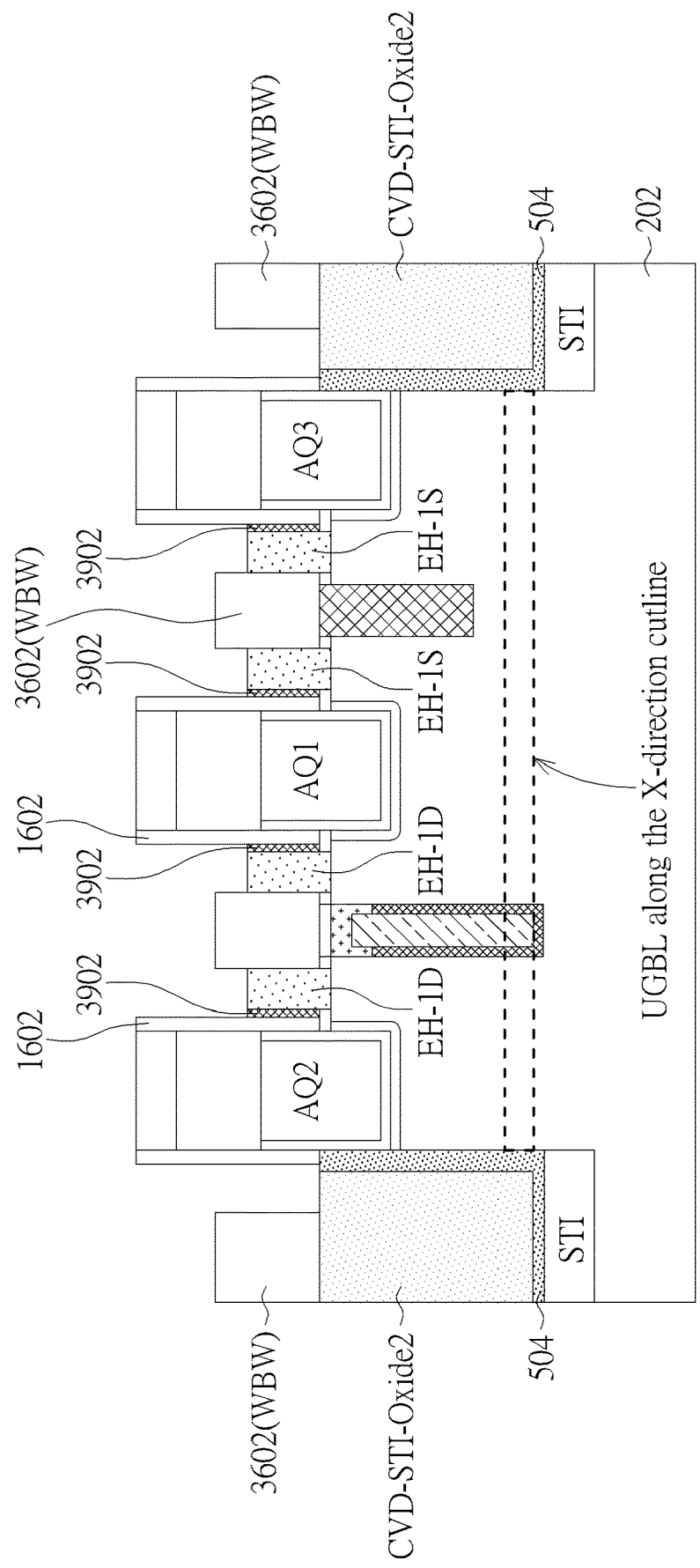
FIG. 39 is a diagram illustrating the oxide-5 spacer being etched and the oxide-a layer being thermally grown and etched.

Step 174: Etch away the oxide-5 spacer 1604, and grow thermally and etch an oxide-a layer 3902 (FIG. 39).

Figure 40:
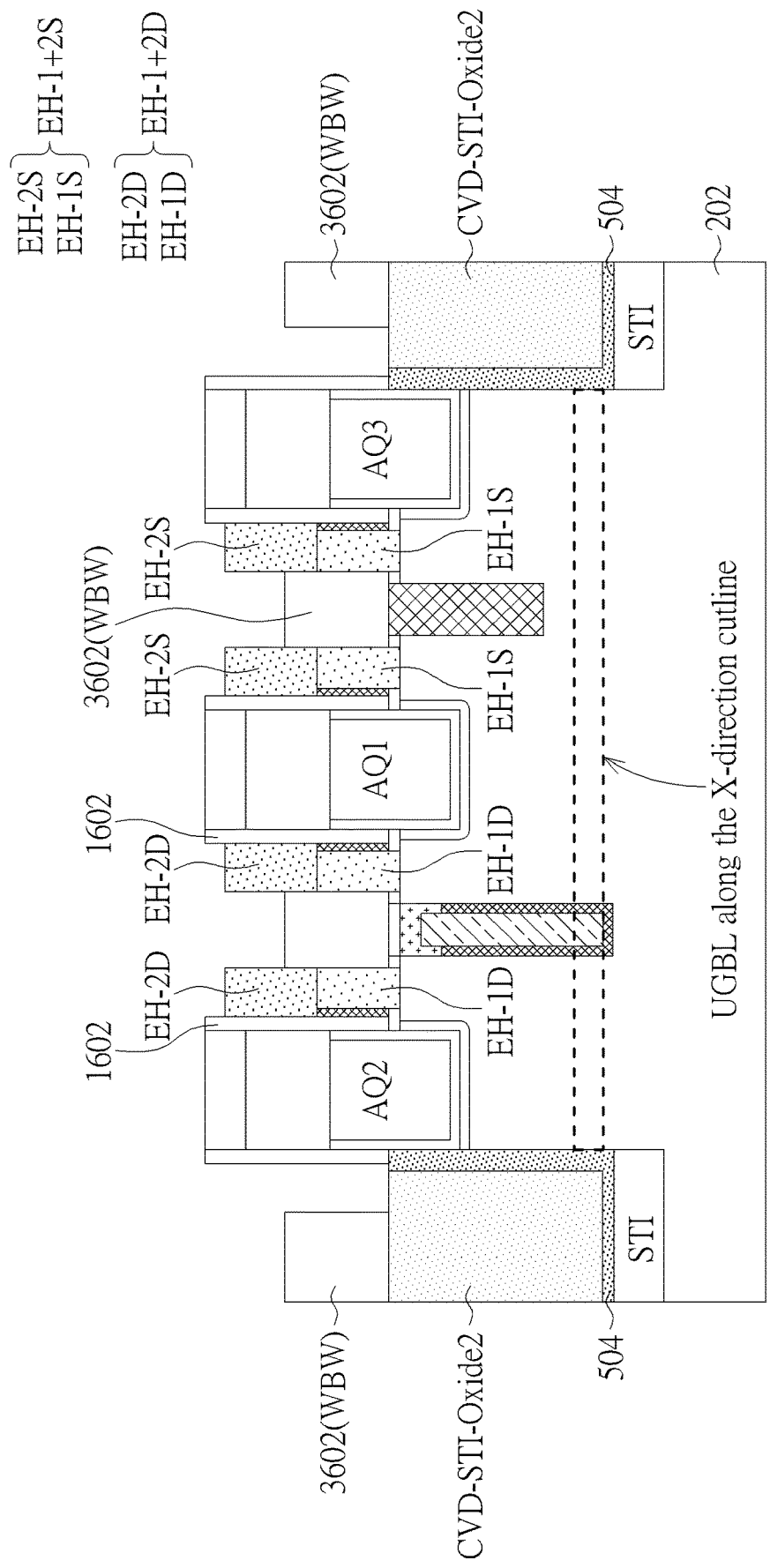
FIG. 40 is a diagram illustrating the elevated source electrode EH-2S and the elevated drain electrode EH-2D being grown.

Step 175: Grow both an elevated source electrode EH-2S and an elevated drain electrode EH-2D respectively based on the source electrode EH-1S and the drain electrode EH-1D by using selective epitaxy silicon growth technology (FIG. 40).

Figure 41:
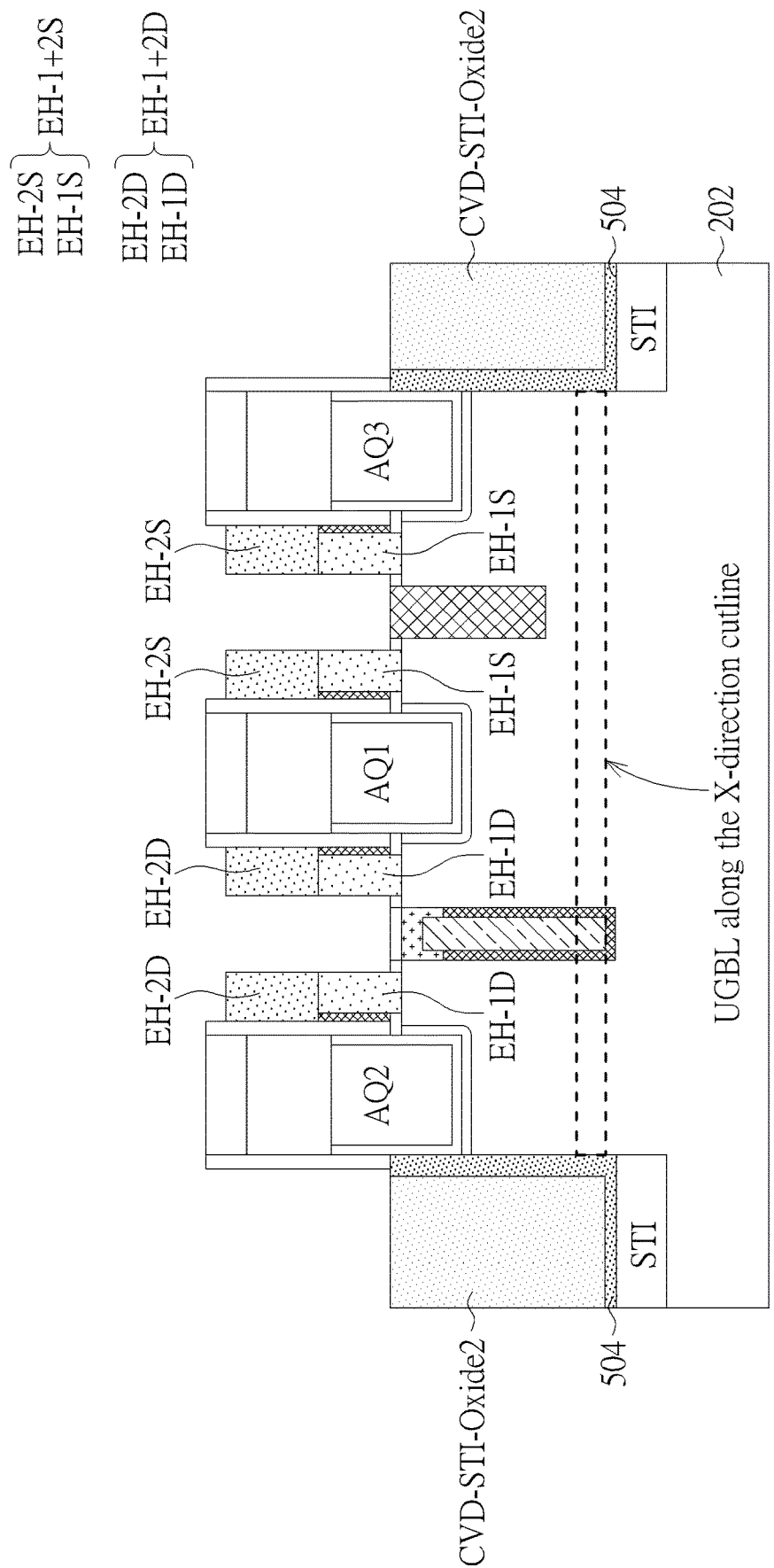
FIG. 41 is a diagram illustrating the WBW being etched away.

Step 176: Etch away the metal layer 3602 (FIG. 41).

Figure 42:
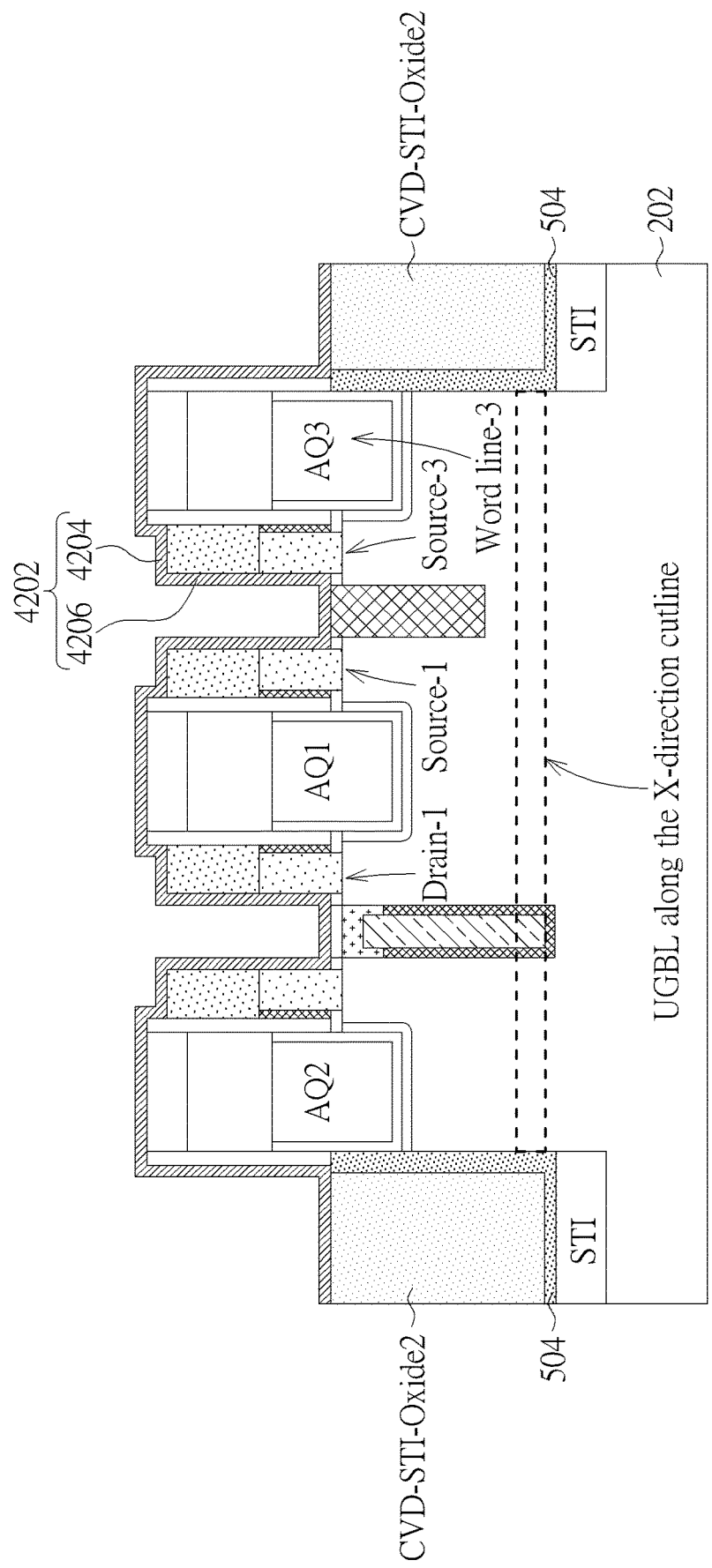
FIG. 42 is a diagram illustrating the high-K dielectric insulator material being formed.

Please refer to FIGS. 1I, 1J and FIGS. 42-64. Step 50 could include:

Step 177: Form a high-K-dielectric-insulator-1 4202 (FIG. 42).

Figure 43:
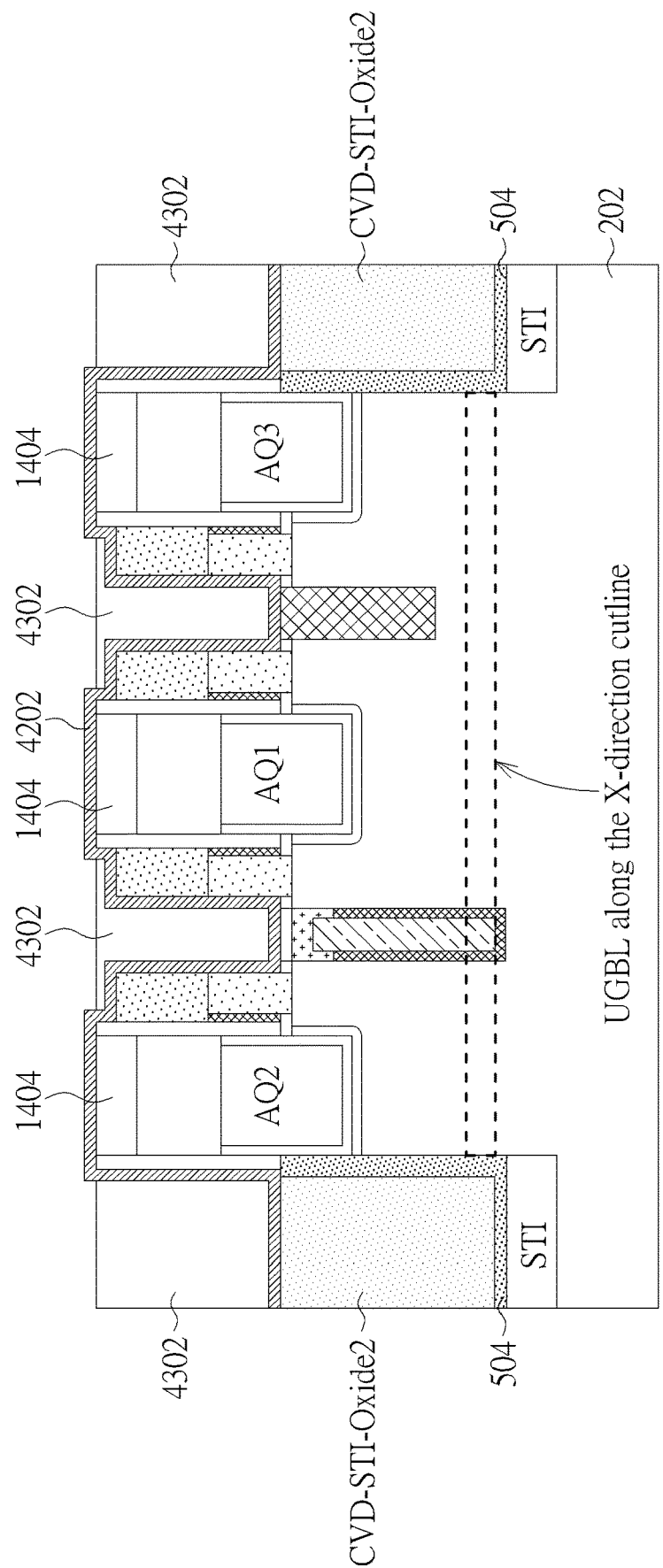
FIG. 43 is a diagram illustrating the thick metal layer being deposited and etched back.

Step 178: Deposit and etch back a thick metal layer 4302, such as Tungsten (FIG. 43).

Figure 44:
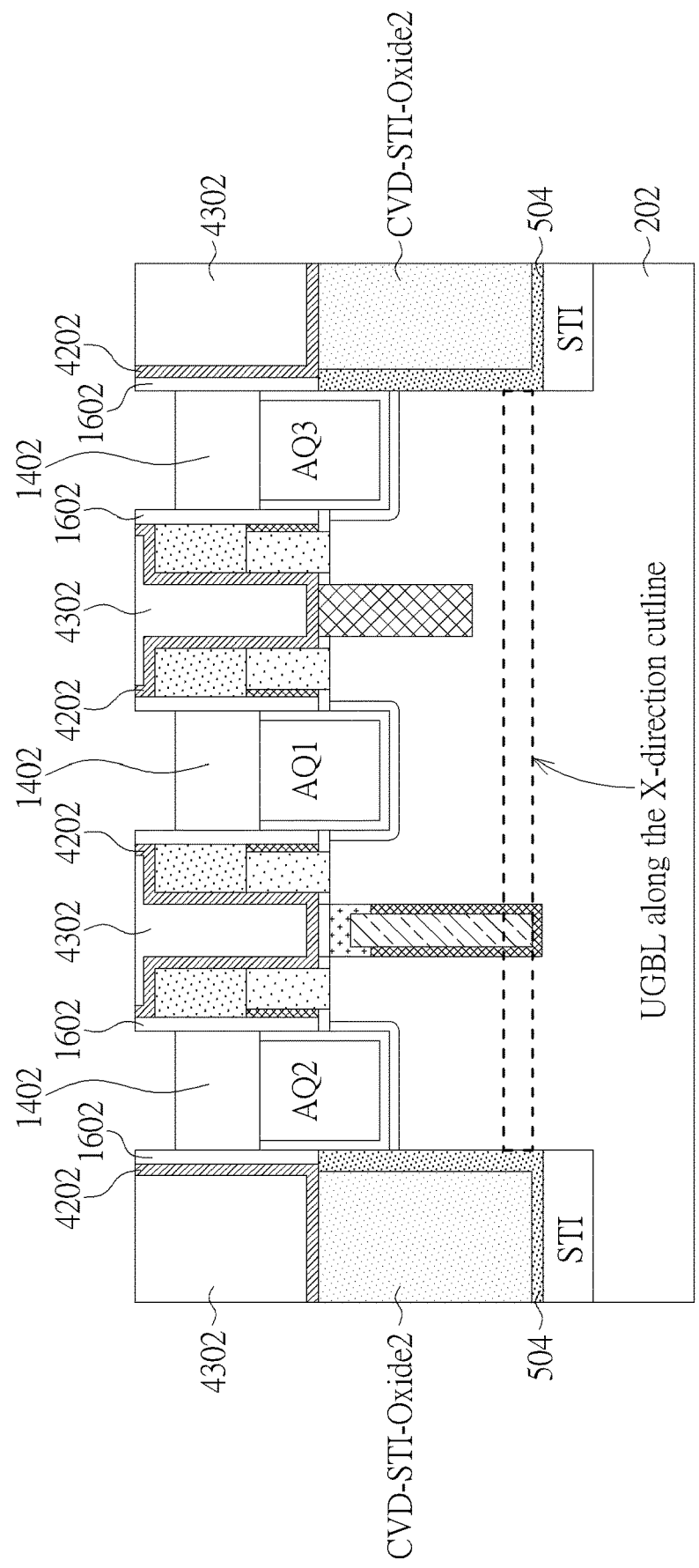
FIG. 44 is a diagram illustrating the high-K-dielectric-insulator-1 over the oxide-4 layer being removed and then the oxide-4 layer being etched away.

Step 179: Etch away the high-K-dielectric-insulator-1 4202 over the oxide-4 layer 1404 and then etch away the oxide-4 layer 1404 (FIG. 44).

Figure 45:
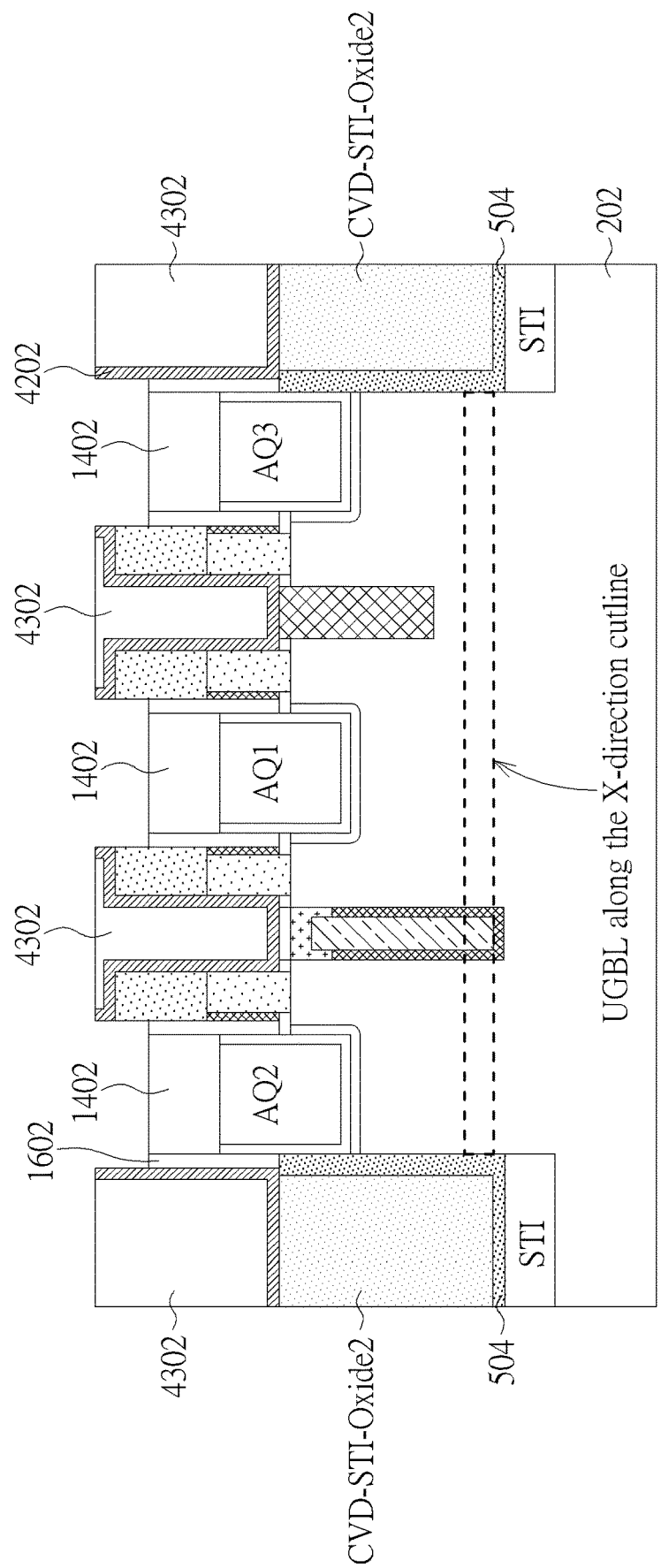
FIG. 45 is a diagram illustrating the upper portion of the nitride-3 layer being removed and the upper portion of the nitride-4 spacer being also removed.

Step 180: Remove an upper portion of the nitride-3 layer 1402 and an upper portion of the nitride-4 spacer 1602 (FIG. 45).

Figure 46:
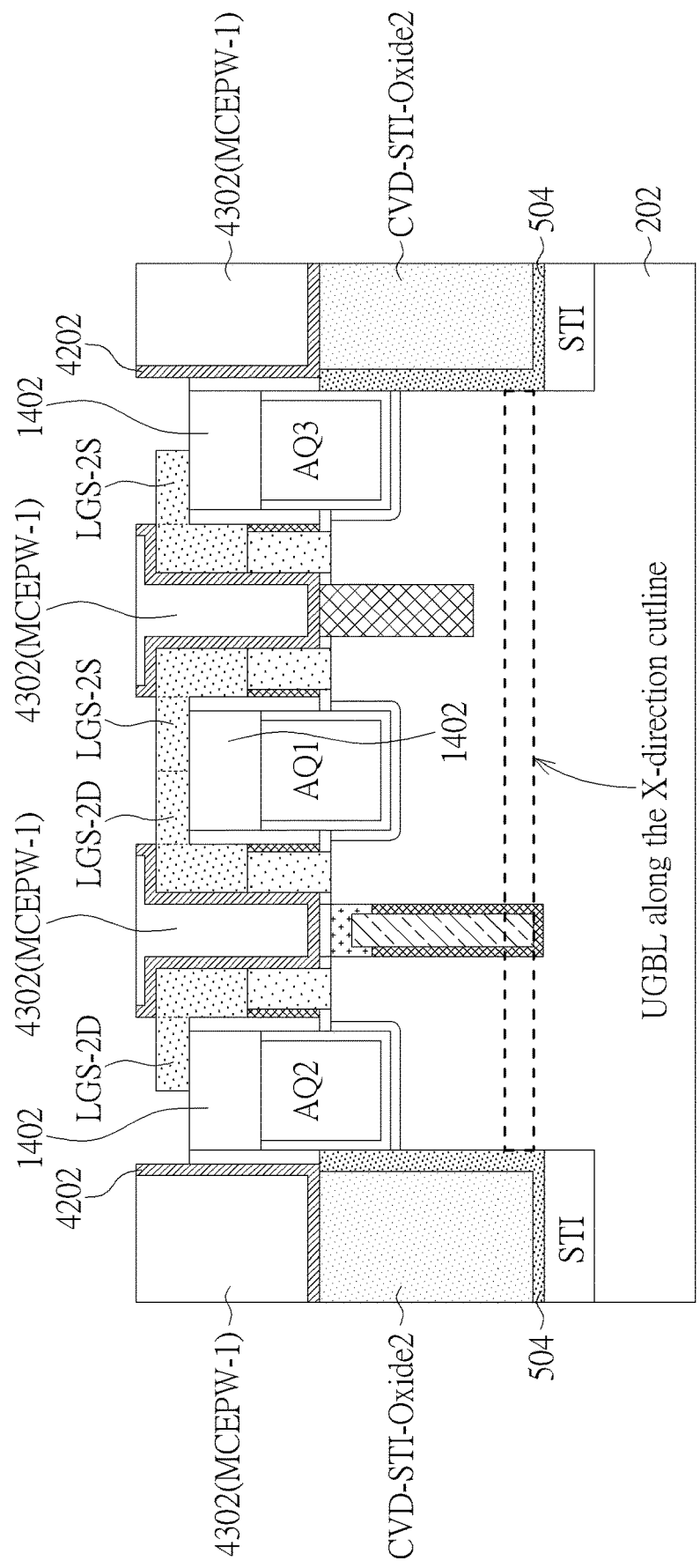
FIG. 46 is a diagram illustrating the LGS-2S and the LGS-2D being grown laterally.

Step 181: Grow an n+ in-situ heavily-doped silicon material laterally (and vertically) over the nitride-3 layer 1402 based on the exposed silicon sidewalls of the EH-2 electrodes by using the selective epitaxy silicon growth technology (FIG. 46).

Figure 47:
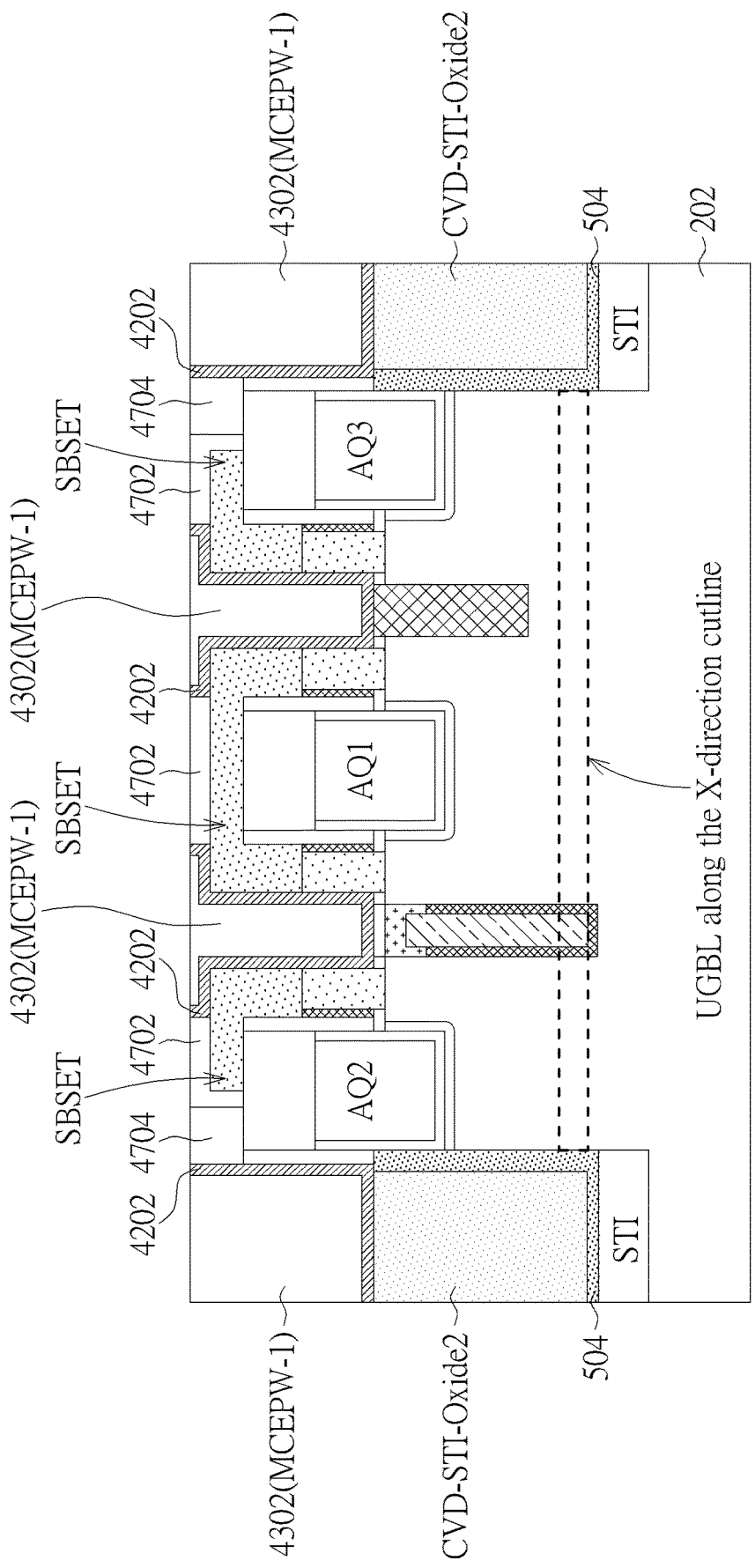
FIG. 47 is a diagram illustrating the thin oxide-b layer being grown thermally and the oxide-10 layer being deposited and etched back.

Step 182: Grow an oxide-b layer 4702 thermally on top surface of the aforesaid laterally grown n+ in-situ heavily-doped silicon material (hereinafter, Seeding Base for Growing Storage-Electrode Tower, or abbreviated as "SBSET"), and deposit and etch back an oxide-10 layer 4704 (FIG. 47).

Figure 48:
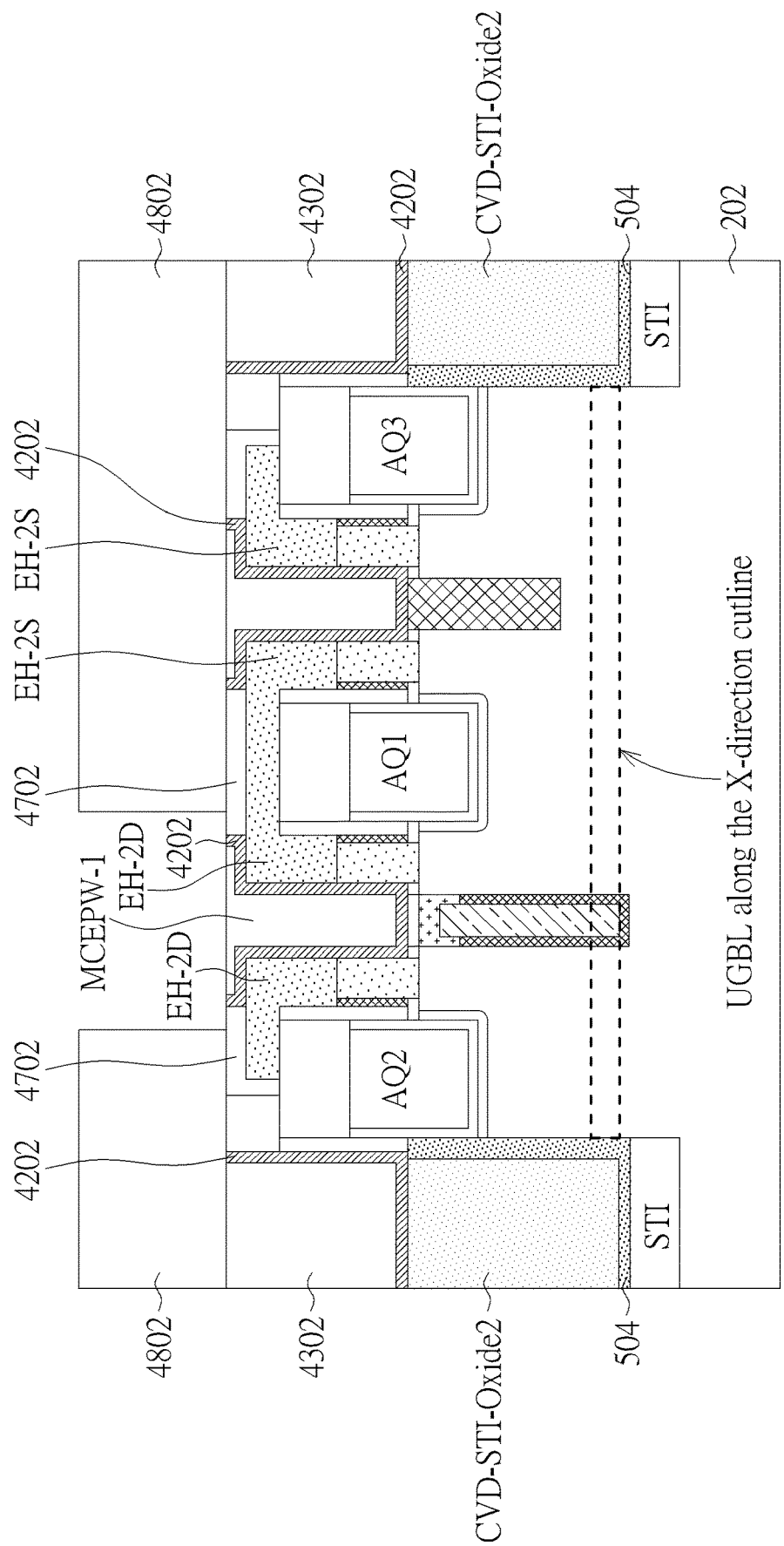
FIG. 48 is a diagram illustrating the photoresist layer being deposited.

Step 183: Deposit a photoresist layer 4802 (FIG. 48).

Figure 49:
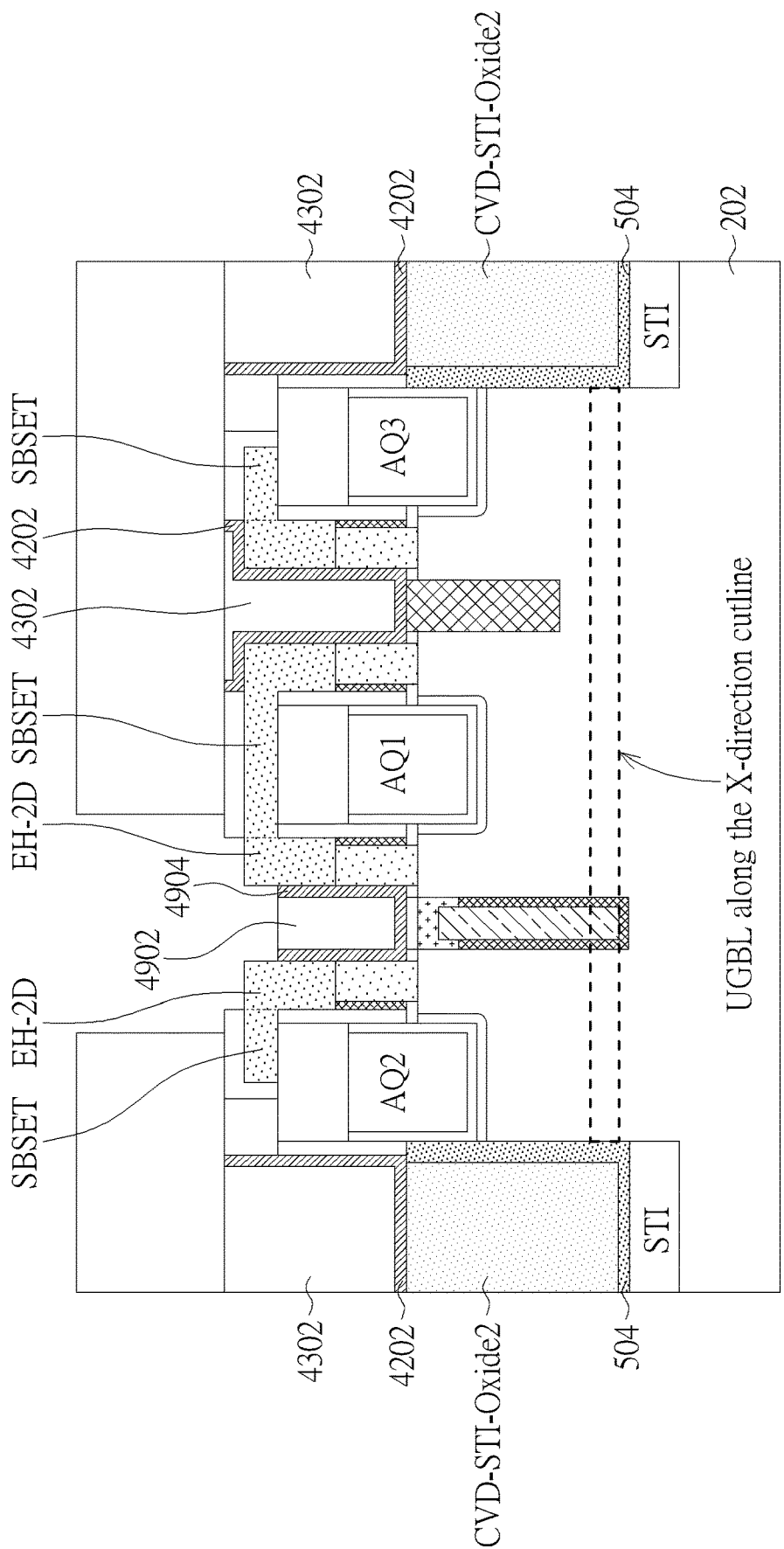
FIG. 49 is a diagram illustrating the exposed MCEPW-1 on the drain region being etched to the Tungsten plug and some high-K-dielectric-insulator-1 being also to etched away to result in the high-K-dielectric-insulator-1a spacer.

Step 184: Etch the exposed thick metal layer 4302 on the drain region to form a metal or Tungsten plug 4902 (hereinafter, "Tungsten-a"); and also etch some exposed high-K-dielectric-insulator-1 4202, and the remaining portion 4904 is named "high-K-dielectric-insulator-1a spacer") (FIG. 49).

Figure 50:
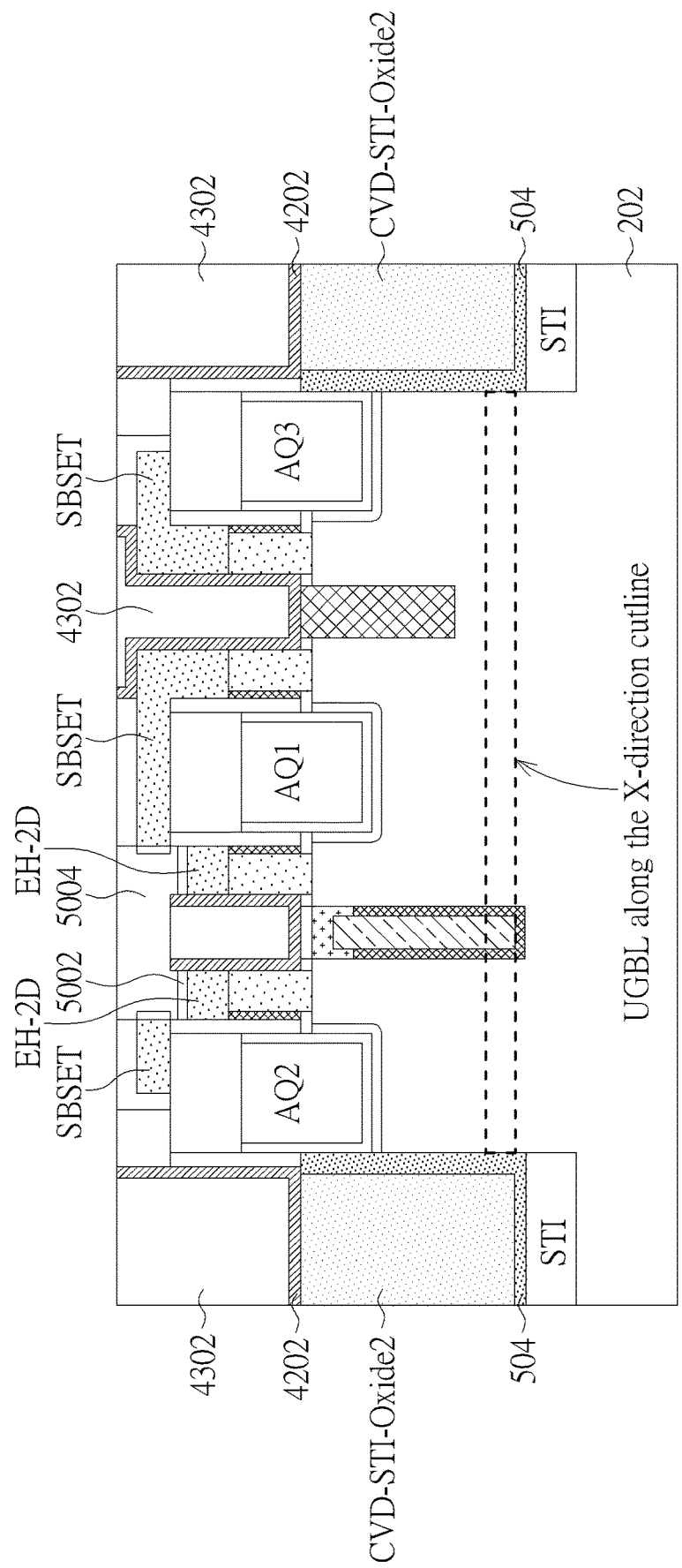
FIG. 50 is a diagram illustrating some upper part of the elevated drain electrode EH-2D being etched away, the photoresist being removed, the thin oxide-c layer being thermally grown, and the oxide-c1 layer being deposited and etched back.

Step 185: Etch away some upper part of the elevated drain electrode EH-2D, remove the photoresist 4802, grow thermally an oxide-c layer 5002 over the top surface of the remaining portion of the elevated drain electrode EH-2D, and deposit and etch back an oxide-c1 layer 5004 (FIG. 50).

Figure 51:
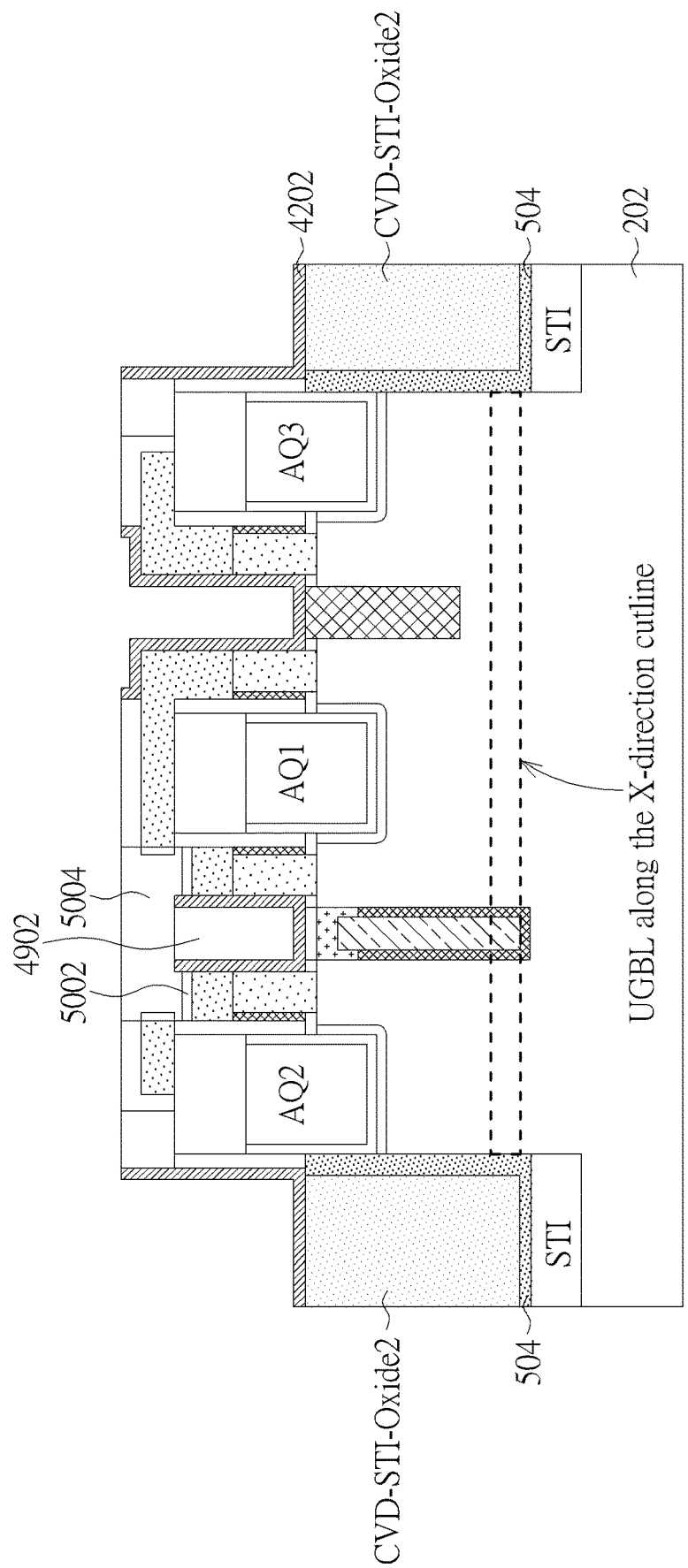
FIG. 51 is a diagram illustrating the MCEPW-1 being removed.

Step 186: Remove the exposed thick metal layer 4302 (FIG. 51).

Figure 52:
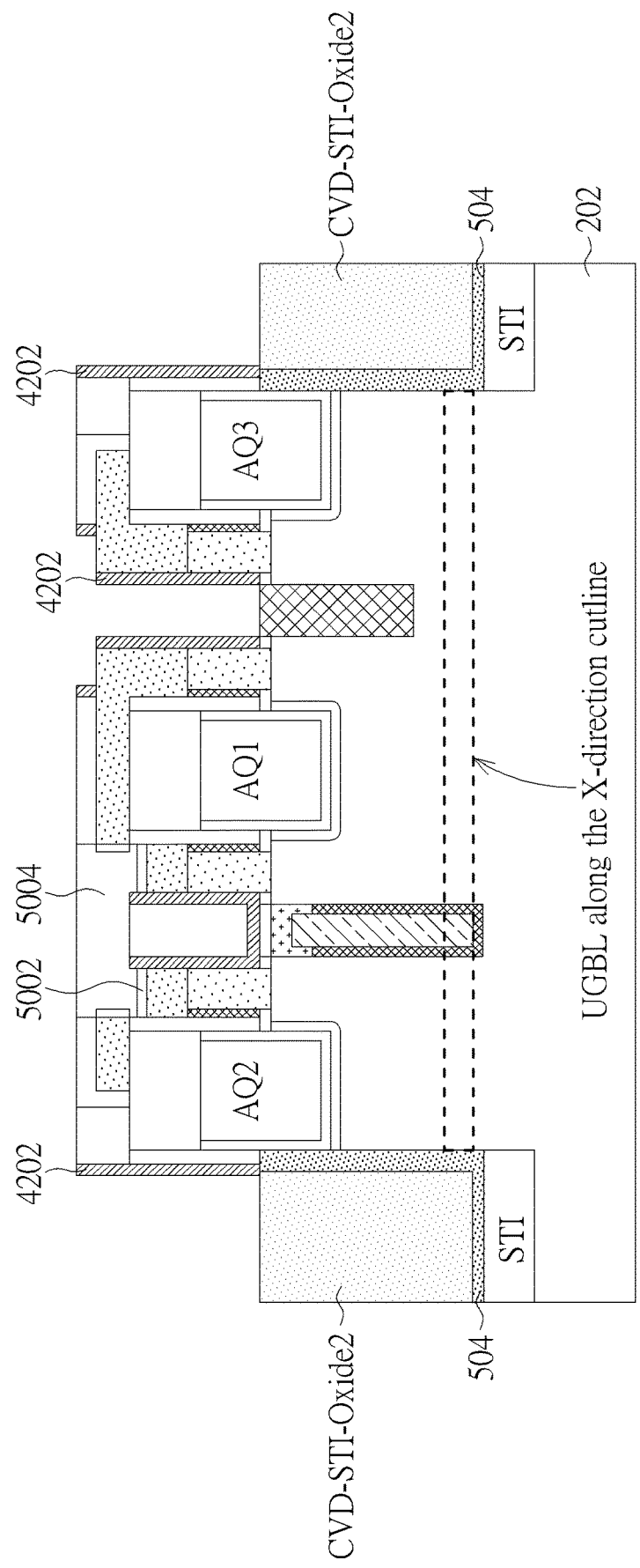
FIG. 52 is a diagram illustrating the exposed high-K-dielectric-insulator-1 on all planar surfaces being etched away but leave the high-K-dielectric-insulator-1 spacer.

Step 187: Etch away the exposed high-K-dielectric-insulator-1 4202 on all planar surfaces but leave the vertical portion of the high-K-dielectric-insulator-1 4202 (FIG. 52).

Figure 53:
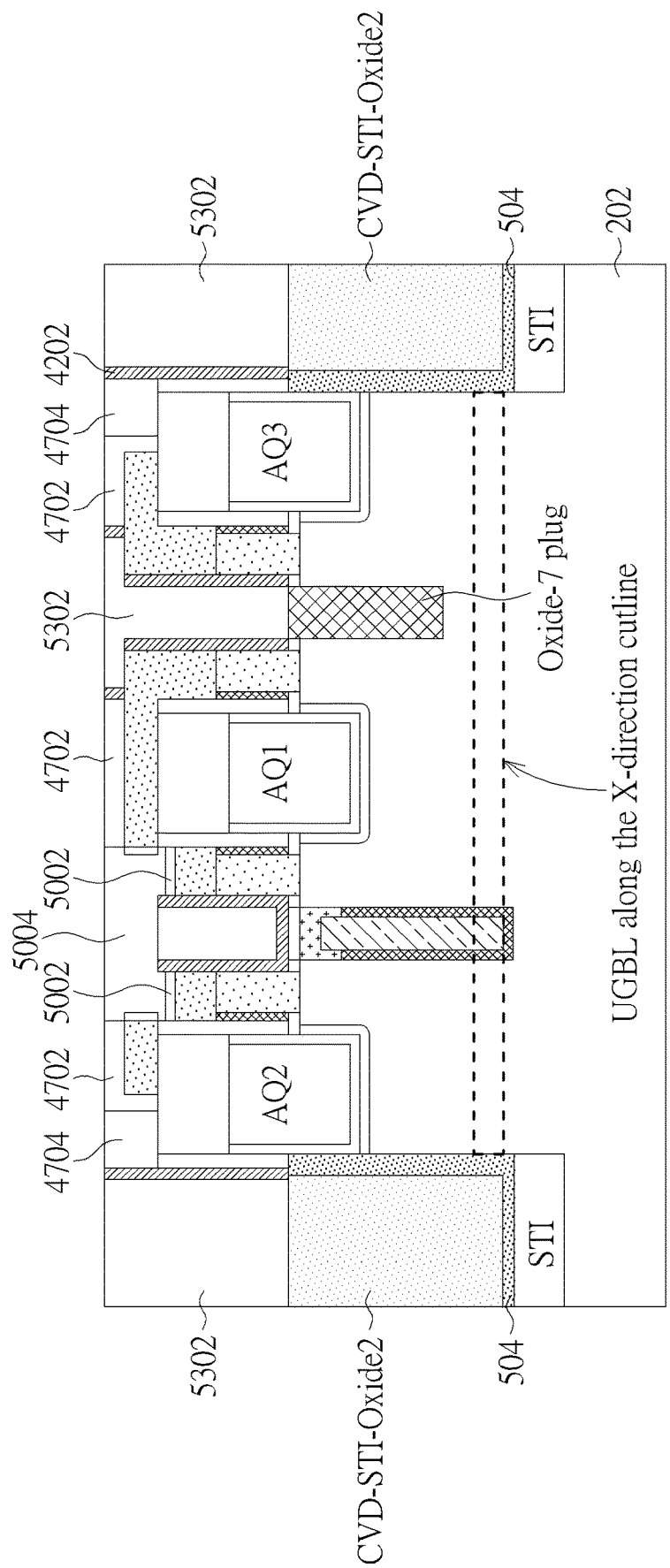
FIG. 53 is a diagram illustrating the SOD layer being deposited and etched back.

Step 188: Deposit and etch back the SOD layer 5302 (FIG. 53).

Figure 54:
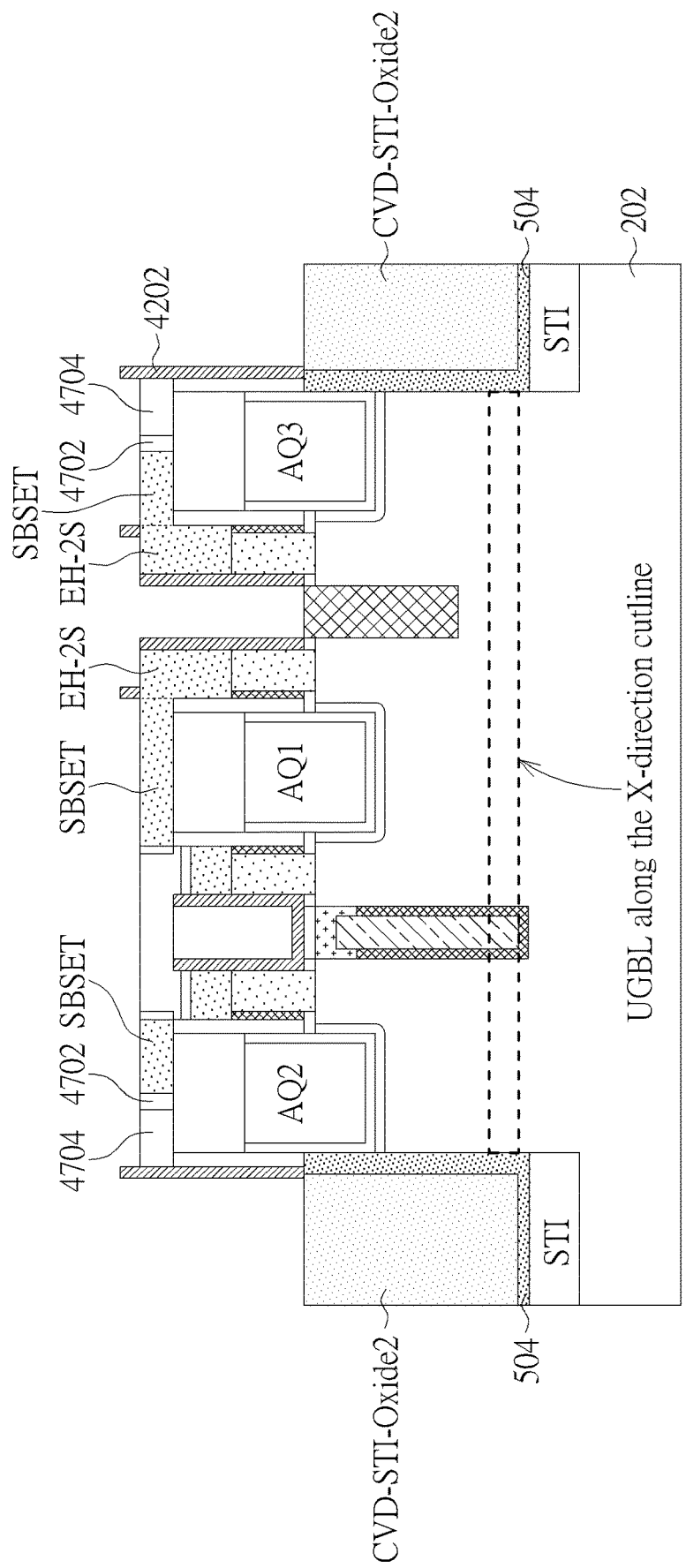
FIG. 54 is a diagram illustrating the upper parts of the oxide-b layer, the oxide-10 layer, and the oxide-c1 layer over the height of the SBSET being removed, and the SOD layer being etched away.

Step 189: Etch upper parts of the oxide-b layer 4702, the oxide-10 layer 4704, and the oxide-c1 layer 5004 over the height of the SBSET, and etch away the SOD layer 5302 (FIG. 54).

Figure 55:
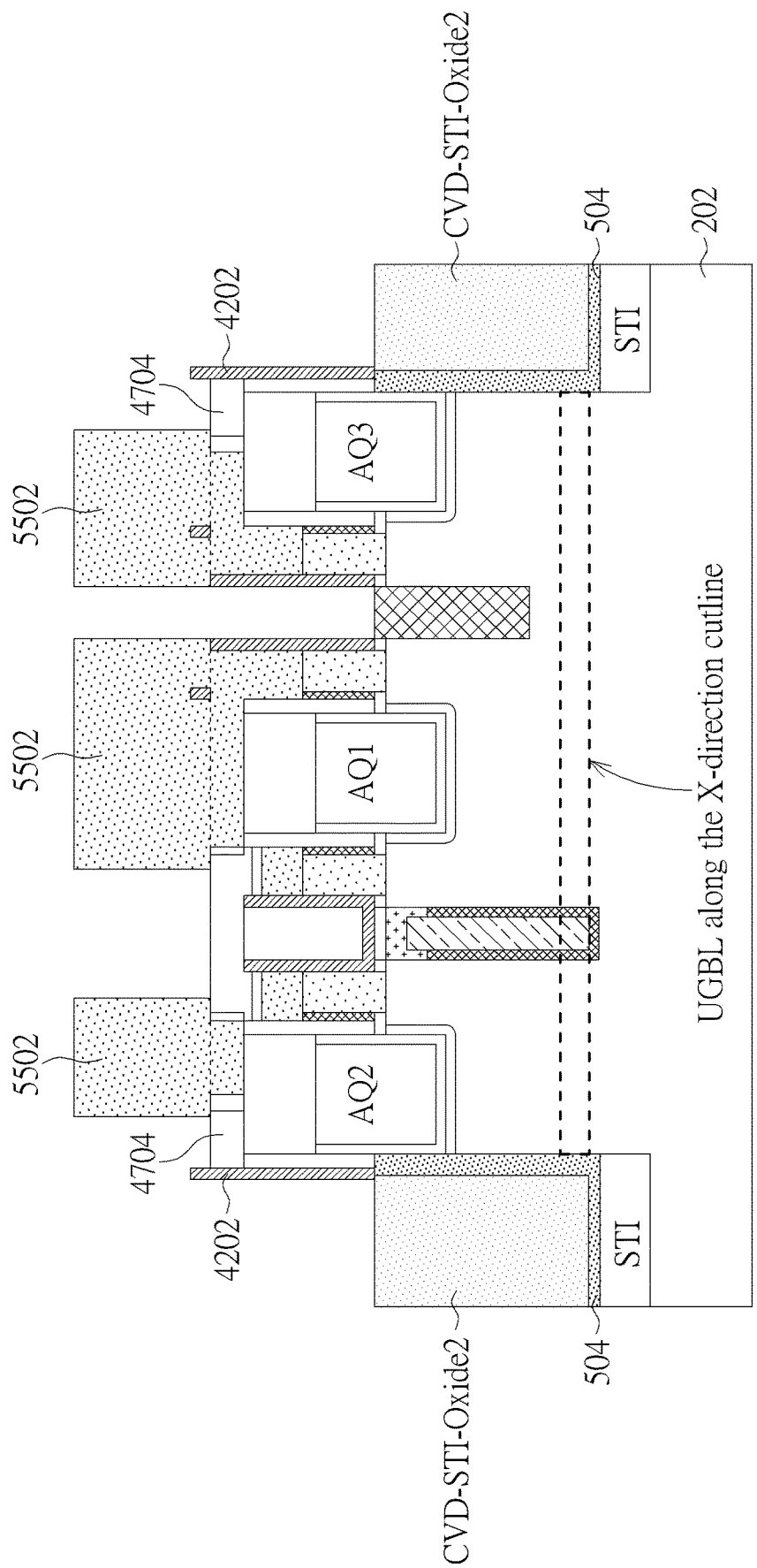
FIG. 55 is a diagram illustrating the heavily n+ in-situ-doped silicon tower being grown.

Step 190: Grow heavily n+ in-situ-doped silicon tower 5502 ("STSEC-1") by utilizing the selective epitaxial silicon growth technique (FIG. 55).

Figure 56:
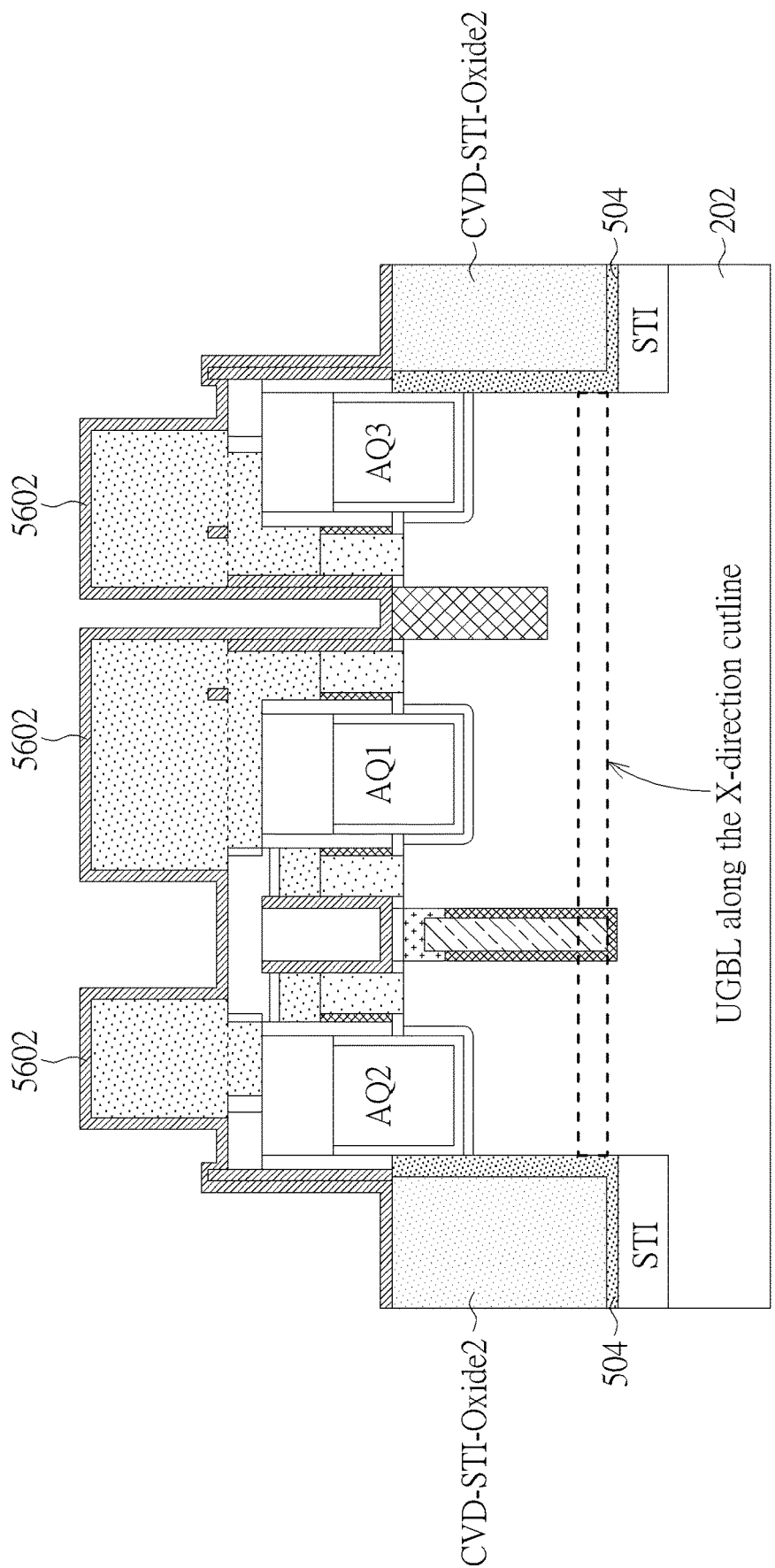
FIG. 56 is a diagram illustrating the high-K-dielectric-insulator-2 being formed.

Step 191: Form high-K-dielectric-insulator-2 5602 to cover all sidewalls and top surface, including the STSEC-1 (FIG. 56).

Figure 57:
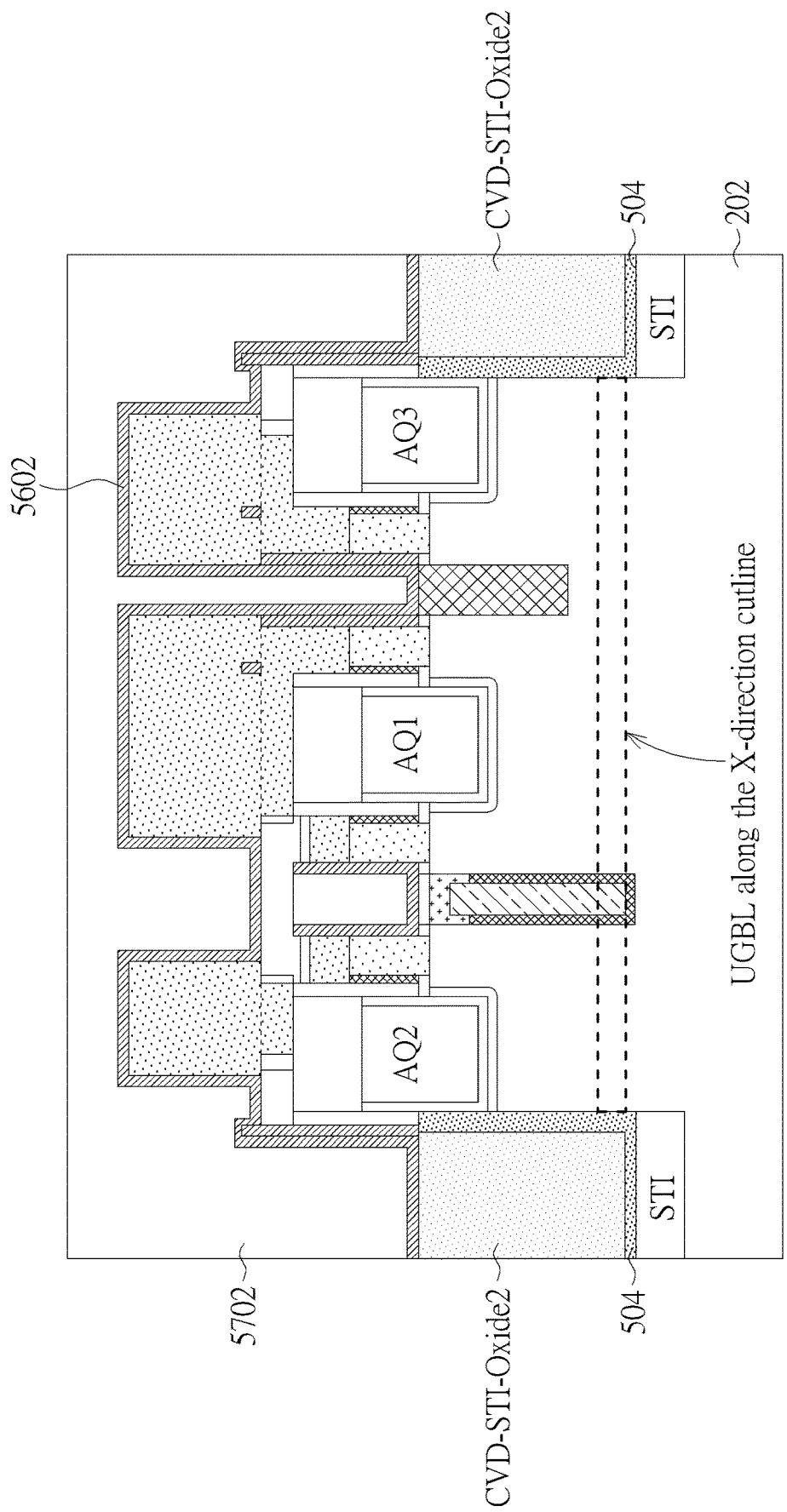
FIG. 57 is a diagram illustrating the thick metal layer being deposited.

Step 192: Deposit thick metal layer 5702 (FIG. 57).

Figure 58:
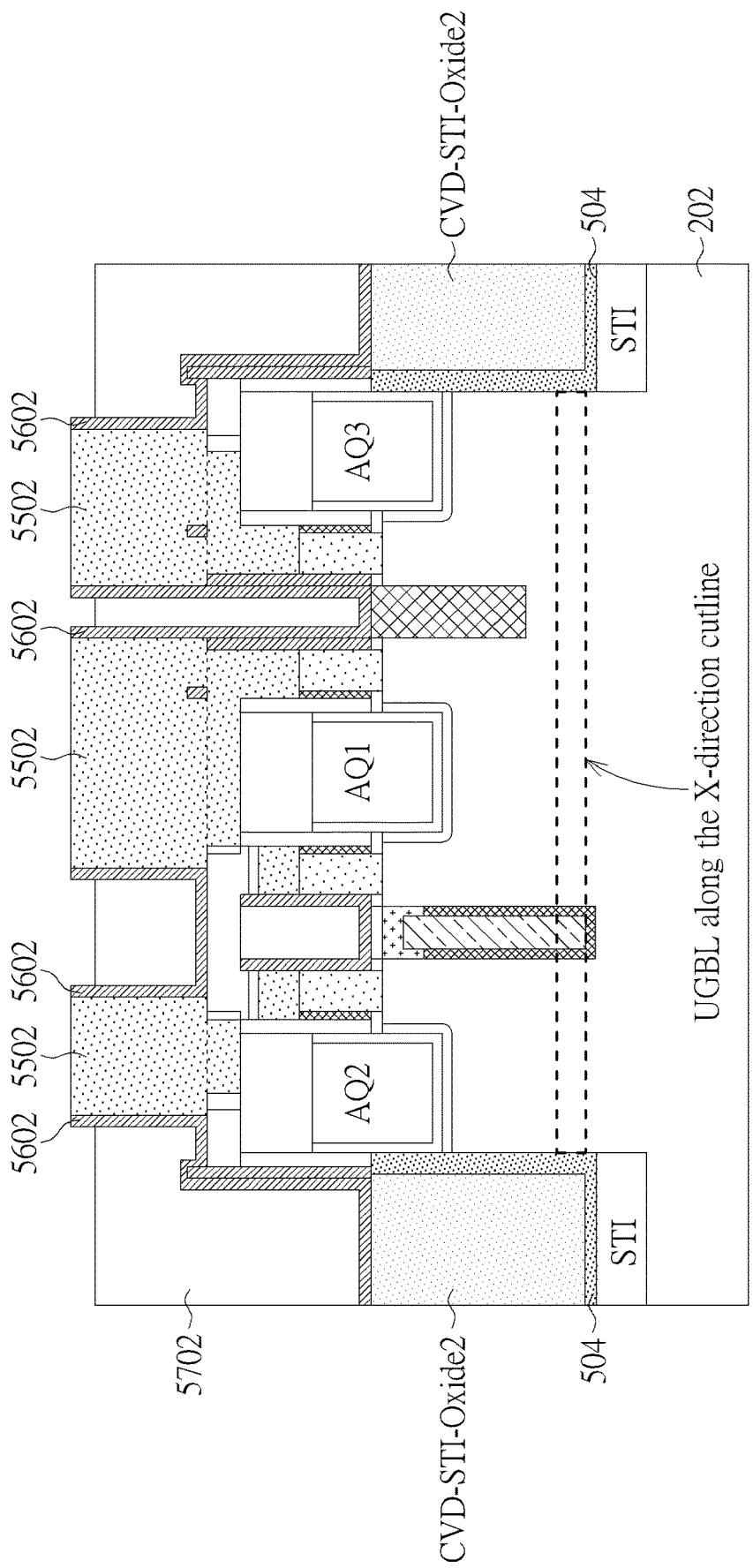
FIG. 58 is a diagram illustrating the MCEPW-2 being etched back to a height lower than that of the storage electrode and the high-K-dielectric-insulator-2 on the top surface of the STSEC-1 being etched away.

Step 193: Etch back the metal layer 5702, and etch the portion of high-K-dielectric-insulator-2 5602 on the top of the heavily n+ in-situ-doped silicon tower 5502 (FIG. 58).

Figure 59:
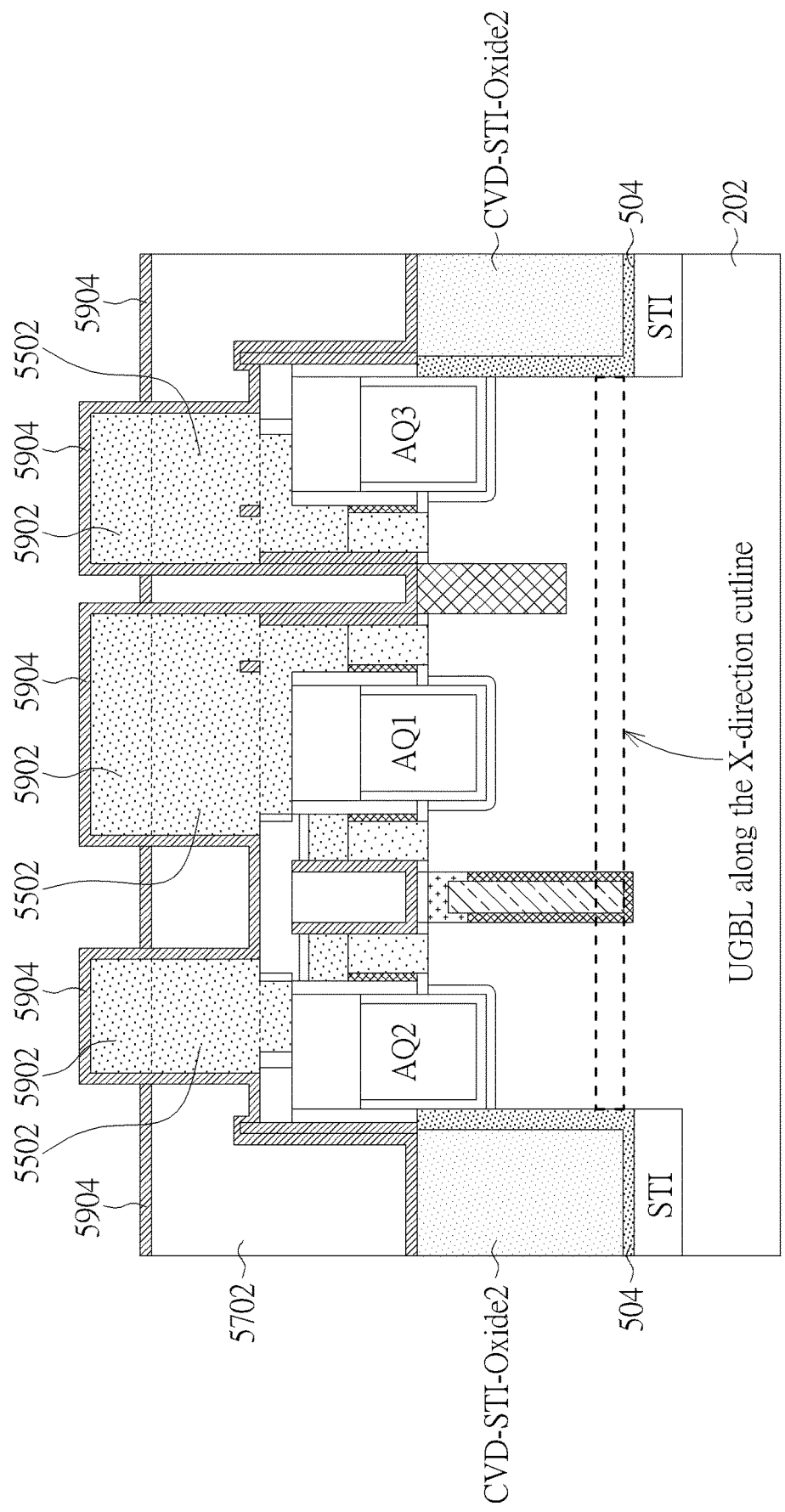
FIG. 59 is a diagram illustrating the taller, heavily n+ in-situ-doped silicon tower as a signal electrode of the storage capacitor being grown and the high-K-Dielectric-Insulator-3 being formed.

Step 194: Grow heavily n+ in-situ-doped silicon tower 5902 by utilizing the selective epitaxial silicon growth technique and form high-K-Dielectric-Insulator-3 5904 (FIG. 59).

Figure 60:
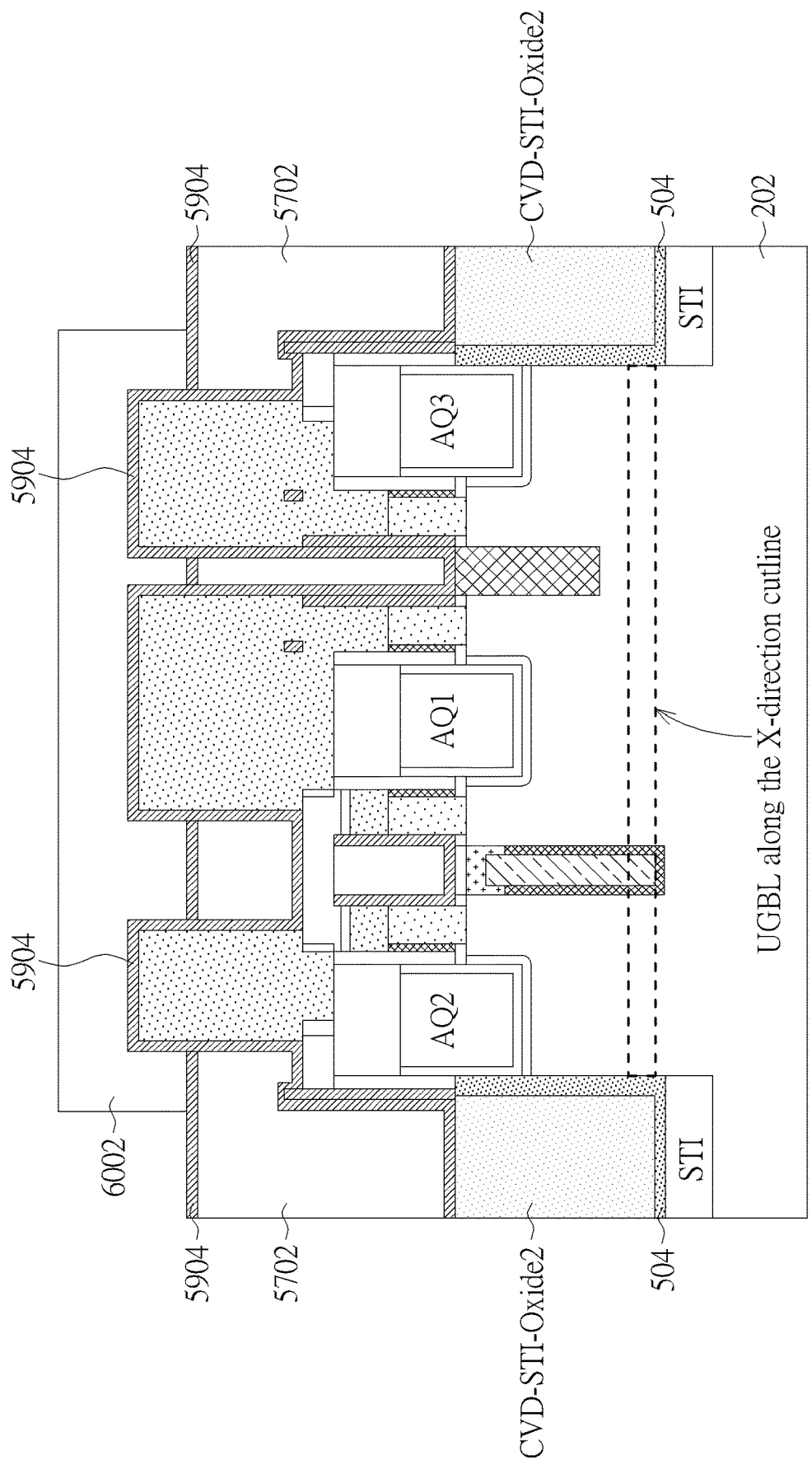
FIG. 60 is a diagram illustrating the photoresist being formed.

Step 195: Form photoresist 6002 to cover all the cell array area except exposing the edge areas of the high-K-Dielectric-Insulator-3 5904 (FIG. 60).

Figure 61:
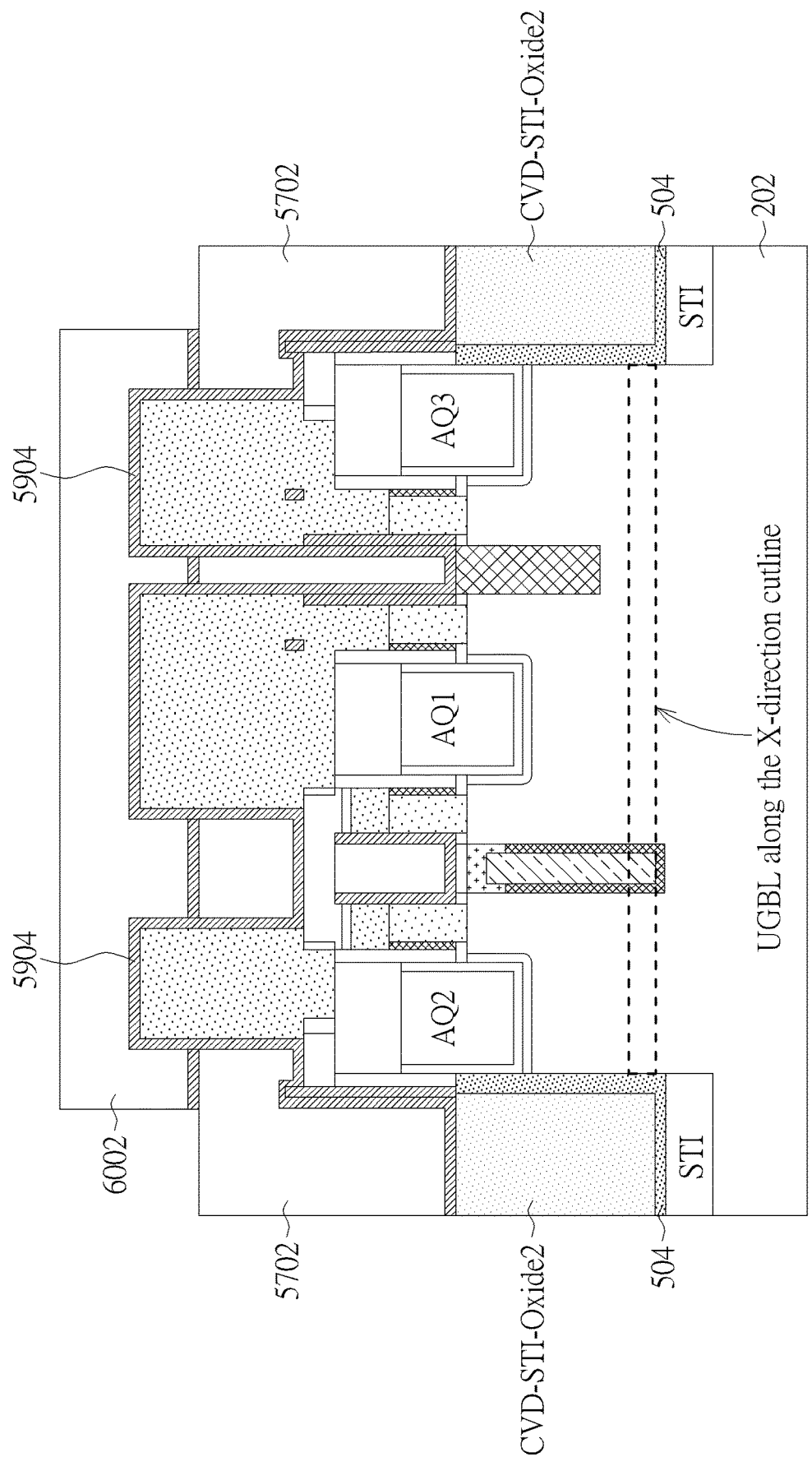
FIG. 61 is a diagram illustrating the high-K-dielectric-insulator-3 on the exposed edge areas of the MCEPW-2 being etched away.

Step 196: Etch away the exposed high-K-dielectric-insulator-3 5904 to expose edge areas of the metal layer 5702 (FIG. 61).

Figure 62:
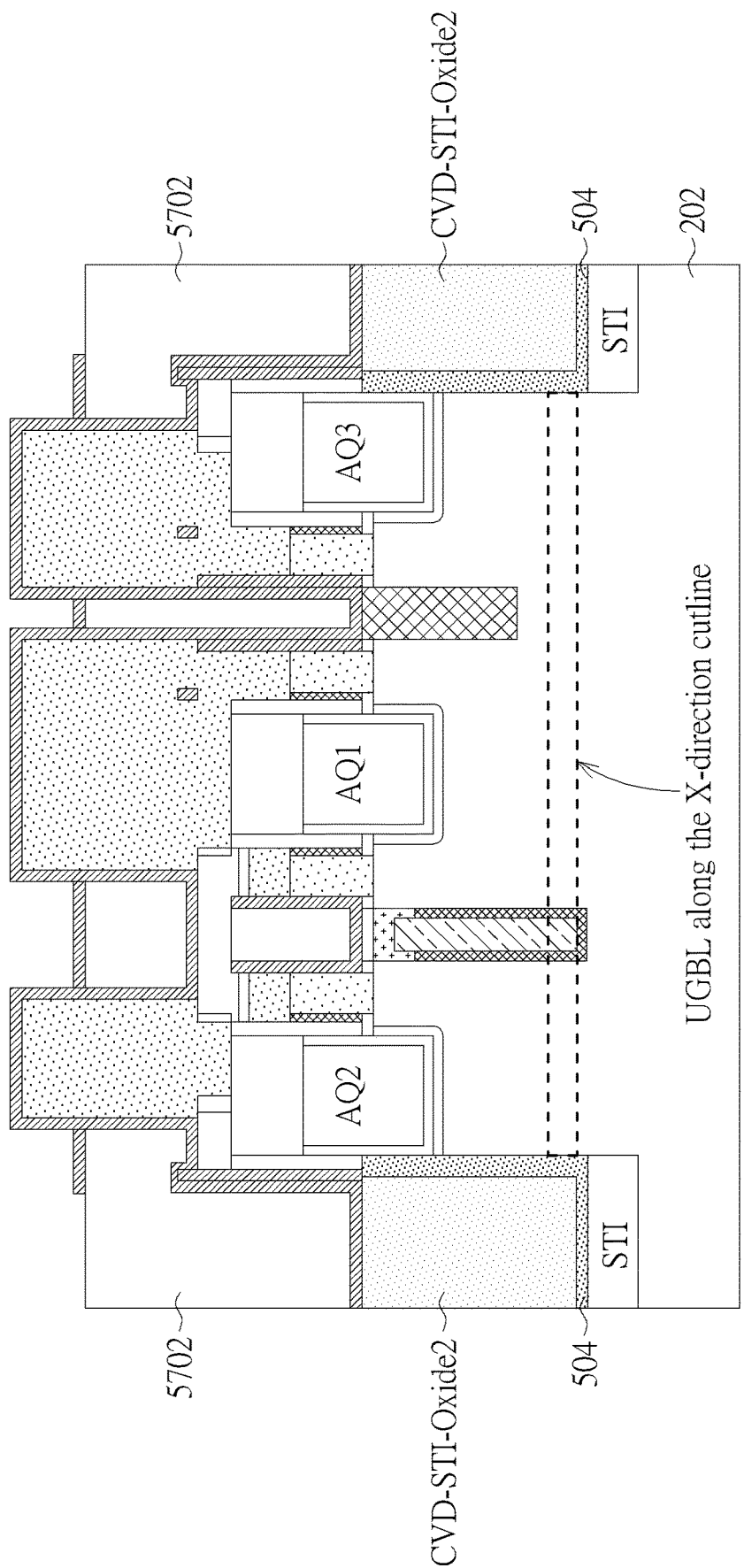
FIG. 62 is a diagram illustrating the photoresist being removed.

Step 197: Remove the photoresist 6002 (FIG. 62).

Figure 63:
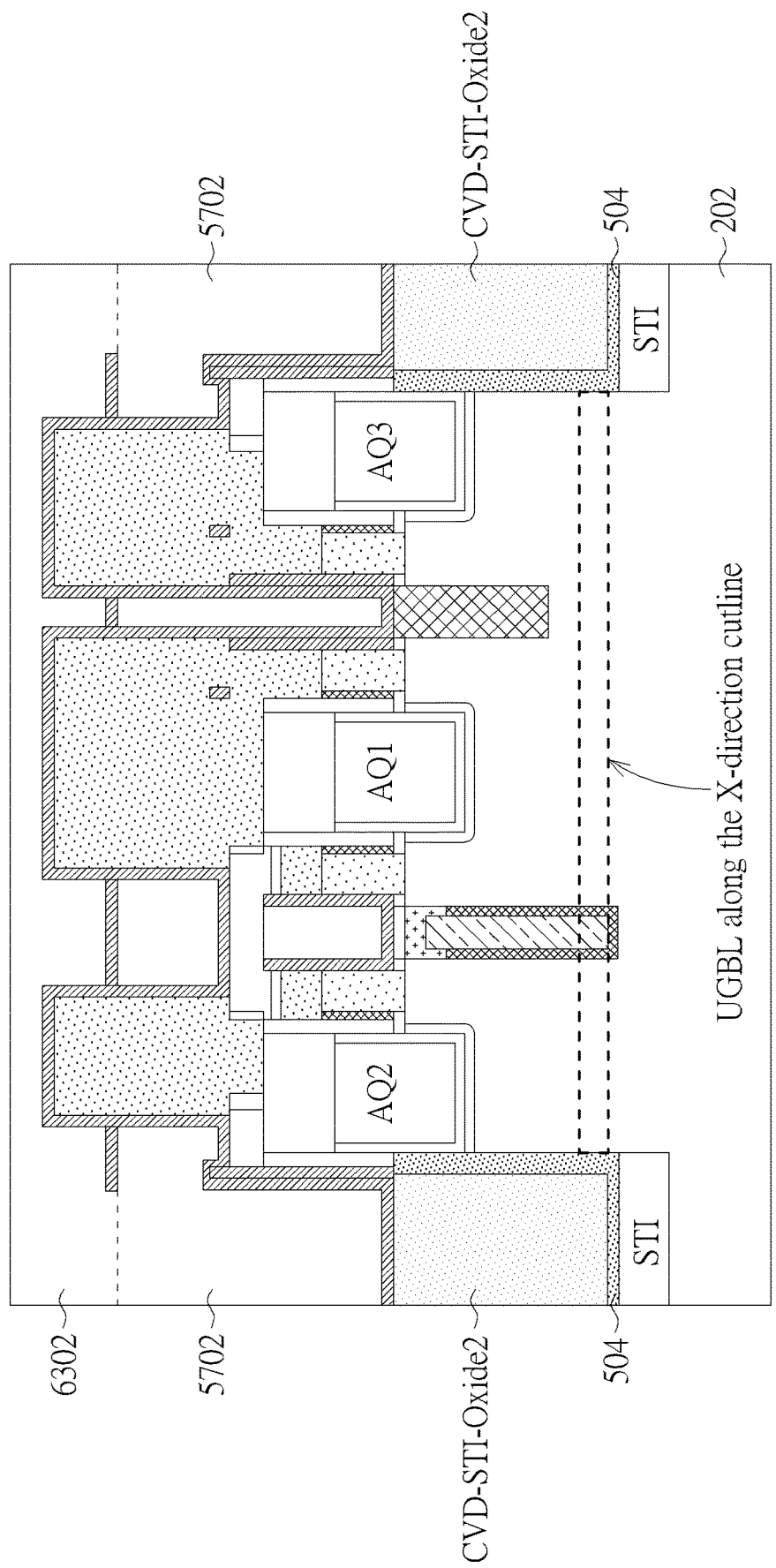
FIG. 63 is a diagram illustrating the thick metal layer being deposited to complete the counter-electrode plate of the storage capacitor.

Step 198: Deposit thick metal layer 6302 (FIG. 63).

Detailed description of the aforesaid manufacturing method is as follows. Start with a p-type silicon wafer (i.e. the p-type substrate 202). In Step 102, as shown in FIG. 2(*a*), the pad-oxide layer 204 is formed above a horizontal surface 208 (i.e. named as a horizontal silicon surface (HSS) or original silicon surface (OSS) if the substrate is silicon substrate, hereinafter the horizontal silicon surface or HSS is used as example) and then the pad-nitride layer 206 is deposited above the pad-oxide layer 204.

In Step 104, the active regions of the DRAM cell array can be defined by the photolithographic mask technique, wherein as shown in FIG. 2(*a*), the active regions of the DRAM cell array correspond to the pad-oxide layer 204 and the pad-nitride layer 206, and the horizontal silicon surface 208 outside an active region pattern is exposed accordingly. Because the horizontal silicon surface 208 outside the active region pattern is exposed, the parts of the silicon material corresponding to the horizontal silicon surface 208 outside the active region pattern can be removed by an anisotropic etching technique to create the trench (or canal) 210, wherein for example, the trench 210 can be 250 nm deep below the HSS.

In Step 106, the oxide layer 214 is deposited to fully fill the trench 210 and then the oxide layer 214 is etched back such that the STI inside the trench 210 is formed below the HSS. In addition, FIG. 2 (*b*) is a top view corresponding to FIG. 2 (*a*), wherein FIG. 2 (*a*) is a cross-section view along an X direction shown in FIG. 2 (*b*). In addition, as shown in FIG. 2 (*a*), for example, the STI has a thickness about 50 nm and a top surface of the STI is about 200 nm deep below the HSS if the trench 210 is 250 nm deep below the HSS.

In Step 108, as shown in FIG. 3 (*a*), the nitride-1 layer is deposited and etched back by the anisotropic etching so as to create the nitride-1 spacers along both edges (i.e. an upper edge and a lower edge) of the trench 210. In Step 110, as shown in FIG. 3 (*a*), the SOD 304 is deposited in the trench 210 above the STI to fill the trench 210. Then, the SOD 304 is planarized by the CMP technique to make a top surface of the SOD 304 as high as a top surface of the pad-nitride layer 206.

In Step 112, as shown in FIG. 3 (*a*), lower edge nitride-1 spacers of the nitride-1 spacers along the lower edge of the trench 210 are protected by utilizing the photolithographic mask technique through the photoresist layer 306, but upper edge nitride-1 spacers of the nitride-1 spacers along the upper edge of the trench 210 are unprotected. That is, after the photoresist layer 306 is deposited above the SOD 304 and the pad-nitride layer 206, because a part of the photoresist layer 306 above the upper edge nitride-1 spacer is removed but a part of the photoresist layer 306 above the lower edge nitride-1 spacer is kept, the lower edge nitride-1 spacer can be protected and the upper edge nitride-1 spacer can be removed later. In addition, FIG. 3 (*b*) is a top view corresponding to FIG. 3 (*a*), wherein FIG. 3 (*a*) is a cross-section view along a cut line of a Y direction shown in FIG. 3 (*b*). In Step 114, as shown in FIG. 4, the upper edge nitride-1 spacer and the SOD 304 not covered by the photoresist layer 306 are etched away by etching process.

In Step 116, as shown in FIG. 5, both the photoresist layer 306 and the SOD 304 are stripped off, wherein the SOD 304 has much higher etching rate than that of thermal oxide and some deposited oxide. Then, the oxide-1 layer 502 is grown thermally to form oxide-1 spacer to cover the upper edge of the trench 210, wherein the oxide-1 layer 502 is not grown over the pad-nitride layer 206, and the STI may have only much thinner oxide layer (called as an oxide-1/STI layer 504) added over it. As shown in FIG. 5, Step 116 results in asymmetric spacers (the lower edge nitride-1 spacer and the oxide-1 spacer) on two symmetrical edges (the upper edge and the lower edge) of the trench 210, respectively. For example, a thickness of the oxide-1 spacer is 4 nm and a thickness of the lower edge nitride-1 spacer is 3 nm. In other words, the asymmetric spacers are formed along the sidewalls of active regions. A structure of the asymmetric spacers (shown in FIG. 5) and the above-mentioned related steps are key invention of the present invention, which is named as asymmetric spacers on two symmetrical edges of a trench or a canal (ASoSE).

In Step 118, as shown in FIG. 6, the metal layer 602 (or a conductive material which needs to sustain the subsequent processing conditions) is deposited to fully fill the trench 210 and planarized by the CMP technique to make a top surface of the metal layer 602 be leveled off equally with the top surface of the pad-nitride layer 206 (shown in FIG. 6). In addition, in one embodiment of the present invention, the metal layer 602 can be Tungsten which is abbreviated as W.

In Step 120, as shown in FIG. 7, the photoresist layer 702 is deposited cover both the lower edge nitride-1 spacer and the oxide-1 spacer but to expose two edges of the lower edge nitride-1 spacer and the oxide-1 spacer corresponding to the ends of the active region.

In Step 122, as shown in FIG. 8, the metal layer 602 corresponding to the ends of the active region is etched until a top surface of the oxide-1/STI layer 504 is exposed to separate the multiple conductive lines (i.e. the metal layer 602).

In Step 124, as shown in FIG. 9 (a), after the photoresist layer 702 is removed, the metal layer 602 is etched back but left only a reasonable thickness inside the trench 210 to form the conductive line or the underground bit line (UGBL) 902, wherein a top surface of the underground bit line 902 is much lower than the HSS (e.g., a thickness of the underground bit line 902 is about 40 nm). In addition, as shown in FIG. 9 (a), the underground bit line (UGBL) 902 is on the top surface of the STI and both sidewalls of the underground bit line (UGBL) 902 are bounded by the asymmetric spacers, that is, the lower edge nitride-1 spacer and the oxide-1 spacer, respectively. In addition, FIG. 9 (a) is a cross-section view along the Y direction shown in FIG. 9 (b).

In Step 126, as shown in FIG. 10 (the cross-section view along the Y direction shown in FIG. 9 (b)), the oxide-2 layer 1002 (called as CVD-STI-oxide2) needs to be thick enough to fill the trench 210 over the underground bit line 902, and then the oxide-2 layer 1002 is polished back to reserve some part which is leveled as high as the top surface of the pad-nitride layer 206, and covers both the lower edge nitride-1 spacer and the oxide-1 spacer. As shown in FIG. 10, Step 126 can make the underground bit line 902 (i.e. an interconnection line) embedded and bounded by all insulators (i.e. an isolation region) inside the trench 210 (and later the underground bit line 902 will be connected to drains of access transistors of the DRAM cell array) which is named as underground bit-lines (UGBL) surrounded by insulators. The UGBL is another key invention of the present invention.

The following descriptions introduce how to form both the access transistors and word lines of the DRAM cell (1T1C cell) array and the word lines connect all associated gate structures of the access transistors simultaneously by a self-alignment method and thus both the gate structures and the word lines are connected as one body of metal such as Tungsten (W).

In Step 128, as shown in FIG. 11 (a), first, the thick oxide-3 layer 1102, the thick nitride-2 layer 1104, and the patterned photoresist 1106 are deposited. Then, the unnecessary parts of the oxide-3 layer 1102 and the nitride-2 layer 1104 are removed by using etching technique. A transistor/word line pattern will be defined by the composite layers of the oxide-3 layer 1102 and the nitride-2 layer 1104, wherein the composite layers of the oxide-3 layer 1102 and the nitride-2 layer 1104 consists of multiple stripes in a direction perpendicular to a direction of the active region. Therefore, as shown in FIG. 11 (a) and FIG. 11 (b), longitudinal (the Y direction) stripes (the oxide-3 layer 1102 and the nitride-2 layer 1104) for defining the access transistors and word lines are formed, wherein the active region is located at cross-point square between the longitudinal stripes, wherein FIG. 11 (a) is across-section view along the X direction shown in FIG. 11 (b).

As shown in FIG. 11 (b), a top view reveals fabric-like checkerboard patterns with the longitudinal stripes of the oxide-3 layer 1102 and the nitride-2 layer 1104 over the pad-nitride layer 206 and the pad-oxide layer 204, and both the active region and the STI are in a horizontal direction (i.e. the X direction shown in FIG. 11 (b)). The active region allows the access transistors to be made by a kind of a self-alignment technique. Such a checkerboard fabric proposal for making self-aligned structures of making the gate structures of the access transistors and the word lines in one processing step is another key invention of the present invention.

In Step 130, as shown in FIG. 12 (a), the photoresist layer 1106 is kept so as to the pad-nitride layer 206 is etched but the pad-oxide layer 204 is retained, and as shown in FIG. 12 (b), both the photoresist layer 1106 and the pad-oxide layer 204 are removed. As a result, the horizontal silicon surface 208 (i.e. the HSS) is exposed at the cross-point squares (shown in FIG. 12 (b)) corresponding to the active regions.

In Step 132, as shown in FIG. 13, the HSS exposed at the cross-point squares is etched by the anisotropic etching technique to create the concave (such as U-shape), wherein the U-shaped concave is for a U-shaped channel 1302 of the access transistor, and for example, a vertical depth of the U-shaped concave can be around 60 nm from the HSS. Since the U-shaped concave of the access transistor is exposed, a channel doping design can be achieved by somewhat well-designed boron (p-type dopant) concentration to dope the U-shaped channel 1302 of the U-shaped concave for a desired threshold voltage of the access transistor after a subsequent high-k metal-gate structure formation. The suitable high-k insulator layer 1304 is formed as a gate dielectric layer of the access transistor, wherein a top surface of two edges of the high-k insulator layer 1304 is higher than the HSS. Afterwards select a suitable gate material 1306 that is appropriate for a word line conductance and can achieve a targeted work-function performance for the access transistor to have a lower threshold voltage (a goal of selecting the suitable gate material is to reduce a boosted word line voltage level to be as low as possible but provide sufficient device drive in completing enough amount of charges to be restored into the capacitor and, on the other hand, in facilitating faster charge transfer for signal sensing).

The gate material 1306 is thick enough to fill in the U-shape concaves (shown in FIG. 13) between two adjacent longitudinal stripes (the oxide-3 layer 1102 and the nitride-2 layer 1104). Then, the gate material 1306 is etched back to result in a longitudinal (the Y direction) word line which is sandwiched between two adjacent longitudinal stripes (the oxide-3 layer 1102 and the nitride-2 layer 1104). For example, the gate material 1306 can be Tungsten (W) of forming the high-k metal-gate structure which allows a design of desired lower threshold voltage of the access transistor if with a suitable channel doping concentration.

The newly proposed access transistor (hereafter called as U-transistor) with the U-shaped channel 1302 is different from a recessed transistor commonly used in the state-of-the-art buried word line design. The U-transistor has its body with two sides bounded by the CVD-STI-oxide2 along the Y direction (i.e. a channel width direction) and its channel length including a depth of one edge of the U-shaped channel 1302 on a side corresponding to a drain of the U-transistor, a length of a bottom of the U-shaped channel 1302, and a depth of another edge of the U-shaped channel 1302 on a side corresponding to a source of the U-transistor. For example, if the vertical depth of the U-shaped concave is around 60 nm and a U opening of the U-shaped concave is around 7 nm along the X direction (i.e. a channel-length direction), a total channel length of the U-transistor is around 127 nm. In contrast, a channel length of the recessed transistor must be more dependent on how deep a gate material of the recessed transistor be recessed and how deep a source and a drain junctions of the recessed transistor be formed.

Due to a structure difference between the U-transistor and the recessed transistor, the channel length of the U-transistor can be much better controlled especially when the channel length of the U-transistor does not depend on a height of the gate of the U-transistor. In addition, since the HSS is fixed, the dopant concentration profiles of the drain and the source of the U-transistor, respectively, are much more controllable with less device-design-parameter variations as revealed more clearly as to be described later about how to complete the drain and the source of the U-transistor. In addition, forming simultaneously the gate structure of the U-transistor and the word line in the longitudinal direction by self-alignment between the two adjacent longitudinal stripes (the oxide-3 layer 1102 and the nitride-2 layer 1104) is such a way that the word line is not below the HSS, wherein that the word line is not below the HSS presents quite different design and performance parameters from the commonly used buried word line. In addition, a height of the word line (i.e. the gate material 1306) is designed to be lower than that of the composite layers (composed of the oxide-3 layer 1102 and the nitride-2 layer 1104) by using the etching-back technique (shown in FIG. 13). A structure design of the gate structure of the U-transistor connected in self-alignment to the word line is another key invention of the present invention.

In Step 134, as shown in FIG. 14, the nitride-3 layer 1402 (i.e. dielectric cap) is deposited and the oxide-4 layer 1404 is subsequently deposited, wherein the nitride-3 layer 1402 and the oxide-4 layer 1404 are stacked up with total thickness being large enough to fill the vacancy between the two adjacent longitudinal stripes (the oxide-3 layer 1102 and the nitride-2 layer 1104). Then, the oxide-4 layer 1404 and the nitride-3 layer 1402 are etched back (or polished back) to be leveled off to a top surface of the nitride-2 layer 1104 so as to form a composite stack composed of the oxide-4 layer 1404 and the nitride-3 layer 1402 directly above the word line (i.e. the gate material 1306).

In Step 136, as shown in FIG. 15, the nitride-2 layer 1104 is etched away by the anisotropic etching technique and the oxide-4 layer 1404/the nitride-3 layer 1402 are left above the word line. Then, the oxide-3 layer 1102 is also etched away by the anisotropic etching to expose the pad-nitride layer 206. The gate structure (such as, the oxide-4 layer 1404/the nitride-3 layer 1402/the gate material 1306) is achieved for both the gate of the U-transistor inside the U-shaped concave and the word line in the longitudinal direction (i.e. the Y direction).

In Step 138, as shown in FIG. 16, the pad-nitride layer 206 is removed everywhere to leave the pad-oxide layer 204. The CVD-STI-oxide2 (i.e., the oxide-2 layer 1002) is etched back to be leveled as high as the top surface of the pad-oxide layer 204.

In Step 140, as shown in FIG. 16, the nitride-4 layer 1602 is deposited and etched by the anisotropic etching technique to create nitride-4 spacer with well-designed suitable thickness. Then, the oxide-5 layer 1604 is deposited and etched by the anisotropic etching technique to create oxide-5 spacer. Then, the polysilicon-1 layer 1606 (intrinsic and undoped) is deposited over the entire surface and etched by the anisotropic etching technique to create polysilicon-1 spacer to make the surround word lines (e.g. word line-1, word line-2, word line-3). Therefore, in summary, there are the polysilicon-1 spacer is outside the oxide-5 spacer, and the oxide-5 spacer is outside the nitride-4 spacer and all the above-mentioned spacers are surrounded and along the gate structure (such as, the oxide-4 layer 1404/the nitride-3 layer 1402/the gate material 1306).

As shown in FIGS. 16, 17, for convenience and clarity of describing the DRAM cell array with word lines and bit lines, the word line located at a center is labeled the word line-1 (corresponding to the access transistor AQ1), the word line next to a left side of the word line-1 is labeled the word line-2 (corresponding to an access transistor AQ2 next to a left side of the access transistor AQ1), and drain region (drain-1 and drain-2) between the word line-1 and the word line-2 still covered by the pad-oxide layer 204 are reserved for the drain of the access transistor AQ1 and a drain of the access transistor AQ2. The word line next to a right side of the word line-1 is labeled the word line-3 (corresponding to an access transistor AQ3 next to a right side of the access transistor AQ1), and source region (source-1 and source-3) between the word line-1 and the word line-3 still covered by the pad-oxide layer 204 are reserved for the source of the access transistor AQ1 and a source of the right access transistor AQ3.

In Step 142, as shown in FIG. 17, the SOD 1702 is deposited, wherein the SOD 1702 is thick enough to fill into the vacancies (corresponding to the drain region and the source region) among the word lines and then the SOD 1702 is polished to a flat level with a top surface of the oxide-4 layer 1404 by the CMP technique. Then, some upper part of the polysilicon-1 layer 1606 is etched by the anisotropic etching technique. Then, the cap-oxide-1 layer 1704 is deposited to fill in vacancies on top surface of the polysilicon-1 spacer and then planarized by the CMP technique to be leveled as high as to a top surface of the oxide-4 layer 1404.

In Step 144, as shown in FIG. 18, the SOD 1702 is etched away, wherein the SOD 1702 has a much higher etching rate than that of deposited or thermally grown oxide layers for them to be kept well. Then, the nitride-5 layer 1802 is deposited over an entire surface shown in FIG. 18.

In Step 146, as shown in FIG. 19, the SOD 1902 is deposited which is thick enough to fill into the vacancies among all word lines and then the SOD 1902 is polished back to a flat level with a top surface of the nitride-5 layer 1802. Then, the photoresist 1904 is deposited on the flat surface to cover an area reserved for the drain region (i.e. the drain-1 and the drain-2) and to expose an area reserved for the source region (i.e. the source-1 and the source-3). Then, the SOD 1902 corresponding to the areas reserved for the source region is removed by utilizing the nitride-5 layer 1802 surrounding all word lines as a self-alignment mask. All the unnecessary photoresist are removed as the desired pattern has been transferred to the SOD 1902 and thus the SOD 1902 is planarized as shown in FIG. 19.

In Step 148, as shown in FIG. 20, the exposed nitride-5 layer 1802 and the pad-oxide layer 204 at a center of the source region between two word lines (the word line-1 and the word line-3) are etched away so as to expose the HSS. Because the exposed HSS is located between the source-1 of the access transistor AQ1 and the source-3 of the access transistor AQ3, the exposed HSS between the source-1 and the source-3 can be called as HSS-1/3. As shown in FIG. 20, the HSS-1/2 between the word line-1 and the word line-2 will be used as a location for the drain-1 (i.e. the drain of the access transistor AQ1) and the drain-2 (i.e. the drain of the access transistor AQ2), and also as a location for connecting the access transistors AQ1, AQ2 vertically to the UGBL. In addition, on the other right side of the word line-1, the HSS-1/3 between the word line-1 and the word line-3 will be used for the source-1 (i.e. the source of the access transistor AQ1) and the source-3 (i.e. the source of the access transistor AQ3), but the source-1 and the source-3 are separate and cannot be connected as the source-1 and the source-3 will later be connected to extra cell storage nodes CSN1, CSN3, respectively.

In addition, in summary, the photolithographic mask technique is used above to cover the HSS-1/2, but a mask utilized by the photolithographic mask technique is not a critical mask and the only function is to allow treating the HSS-1/3 separately from processing over the HSS-1/2. As stated in the above, the SOD 1902 is deposited to be thick enough for making a smooth surface topography and then the photoresist 1904 is deposited to act as mask material to protect the SOD 1902 covering the drain region but expose the source region. In addition, using a SOD is because SOD has very high etching rate to be removed without hurting other existing materials and the SOD is resistant to other thermal processes than photoresist.

As shown in FIG. 20, the silicon material (corresponding to the center of the source region) below the HSS-1/3 is dug by the anisotropic etching technique to generate the hole-1/3 which is surrounded by the lower edge nitride-1 spacer and the oxide-1 spacer on two opposite sides (not shown in FIG. 20) and by the silicon substrate 202 on the other two opposite sides, respectively.

In Step 150, as shown in FIG. 21, then the photoresist 1904 is removed, the oxide-7 layer 2102 is grown thermally to fill the hole-1/3, and the oxide-7 layer 2102 is grown partially on a top surface of the cap-oxide-1 layer 1704 and not elsewhere because of no growth of oxide on the nitride-5 layer 1802. The oxide-7 layer 2102 filling the hole-1/3 is called as oxide-7 plug which has a smooth surface leveled as high as the top surface of the pad-oxide layer 204.

In Step 152, as shown in FIG. 22, the another SOD layer 2202 is deposited, wherein the another SOD layer 2202 is thick enough to fill into the vacancy on a top surface of the oxide-7 layer 2102 in the hole-1/3, and top material of the another SOD layer 2202 is removed by the CMP technique until a top surface of the another SOD layer 2202 is leveled off as high as a top surface of the nitride-5 layer 1802.

In Step 154, as shown in FIG. 23, the photoresist 2302 is deposited to cover the area corresponding to the source region and to expose the area reserved for the drain region, wherein a mask utilized in Step 154 is not a critical mask and the only function is to allow processing on the HSS-1/2 separately from the processing over the HSS-1/3). Then, the exposed SOD 1902, the exposed nitride-5 layer 1802, and the exposed pad-oxide layer 204 underneath are removed in order to expose the HSS (i.e. the HSS-1/2). Then, the silicon material corresponding to the HSS-1/2 is dug and removed by the anisotropic etching to generate the hole-1/2, wherein the hole-1/2 is physically surrounded by two opposite sides of the silicon substrate 202, respectively, the third side by the lower edge nitride-1 spacer, and the fourth side by the oxide-1 spacer, and both the third side and the fourth side are further bounded outside by the CVD-STI-oxide2 (not shown in FIG. 23).

In Step 156, as shown in FIG. 24, the photoresist 2302 is removed and the oxide-8 layer 2402 is thermally grown to generate an oxide-8 spacer to cover three inner sidewalls of four sidewalls of the hole-1/2 and a bottom of the hole-1/2 except the third sidewall covered by the lower edge nitride-1 spacer. In addition, the oxide-8 layer 2402 is grown partially on the top surface of the cap-oxide-1 layer 1704. FIG. 25 is a diagram illustrating a cross-section view of the DRAM cell array along a Y2 direction which is extended along the center of the hole-1/2 and perpendicular to the X direction, wherein as shown in FIG. 25, the active region is sandwiched by the CVD-STI-oxide2, the bit line (UGBL), the oxide-1 spacer, and the lower edge nitride-1 spacer.

In Step 158, as shown in FIGS. 26, 27, the lower edge nitride-1 spacer on the third sidewall inside the hole-1/2 is removed by the isotropic etching technique and the nitride-5 layer 1802 is removed at the same time (as shown in FIG. 27, since the lower edge nitride-1 spacer is so thin so that the isotropic etching technique should not hurt the other structures over the HSS, and should neither remove the oxide-8 layer 2402 inside the hole-1/2).

In Step 160, as shown in FIG. 28, the metal layer (e.g. Tungsten) 2802 is deposited, wherein the metal layer 2802 is thick enough to fill in the hole-1/2 and then all the metal layer 2802 over the HSS is etched back by the isotropic etching technique to leave Tungsten plug inside the hole-1/2, and the Tungsten plug is connected with the UGBL through its opening at the third sidewall of the hole-1/2 which was originally covered by the lower edge nitride-1 spacer. Then, the nitride-6 layer 2804 is deposited and etched by the anisotropic etching technique to create a nitride-6 spacer surrounding the polysilicon-1 spacer corresponding to the reserved drain regions.

In Step 162, as shown in FIG. 29, some upper portion of the Tungsten plug below the HSS is etched back, wherein as shown in FIG. 30, the Tungsten plug is connected to the UGBL from its sidewall of the Tungsten plug to a sidewall of the UGBL inside the hole-1/2.

In Step 164, as shown in FIG. 31, the upper portion of the oxide-8 layer 2402 is removed by a well-designed amount through the anisotropic etching technique, resulting in the oxide-8 spacer having a lower height than a height of the Tungsten plug accordingly. Some of the cap-oxide-1 layer 1704 maybe etched as well, as shown in FIG. 31.

In Step 166, as shown in FIG. 32, the n+ in-situ doped silicon layer 3202 is grown laterally from the two exposed silicon edges (above and adjacent to the oxide-8 layer 2402 and the Tungsten plug) by utilizing the selective epitaxy growth (SEG) technique, thus resulting in a necklace-type conductive n+ silicon drain (named as n+ silicon drain-collar) connecting to the HSS on two sides of the hole-1/2 as the drain-1 and the drain-2 of the access transistors AQ1, AQ2, respectively, and also as a conductive bridge (i.e. bridge contact) between the UGBL and the access transistors AQ1, AQ2.

In Step 168, as shown in FIG. 33, the oxide-9 layer 3302 with a well-designed thickness is thermally grown locally over the n+ silicon drain-collar to cap the HSS-1/2 (and such oxide-9 layer 3302 may cover the cap-oxide-1 layer 1704). The above connection method of making an underlined bridge contact between the UGBL and the drain-1 (the drain-2) is another key invention of the present invention, wherein the drain-1 and the drain-2 are oxide-capped n+ drains.

Figure 35:
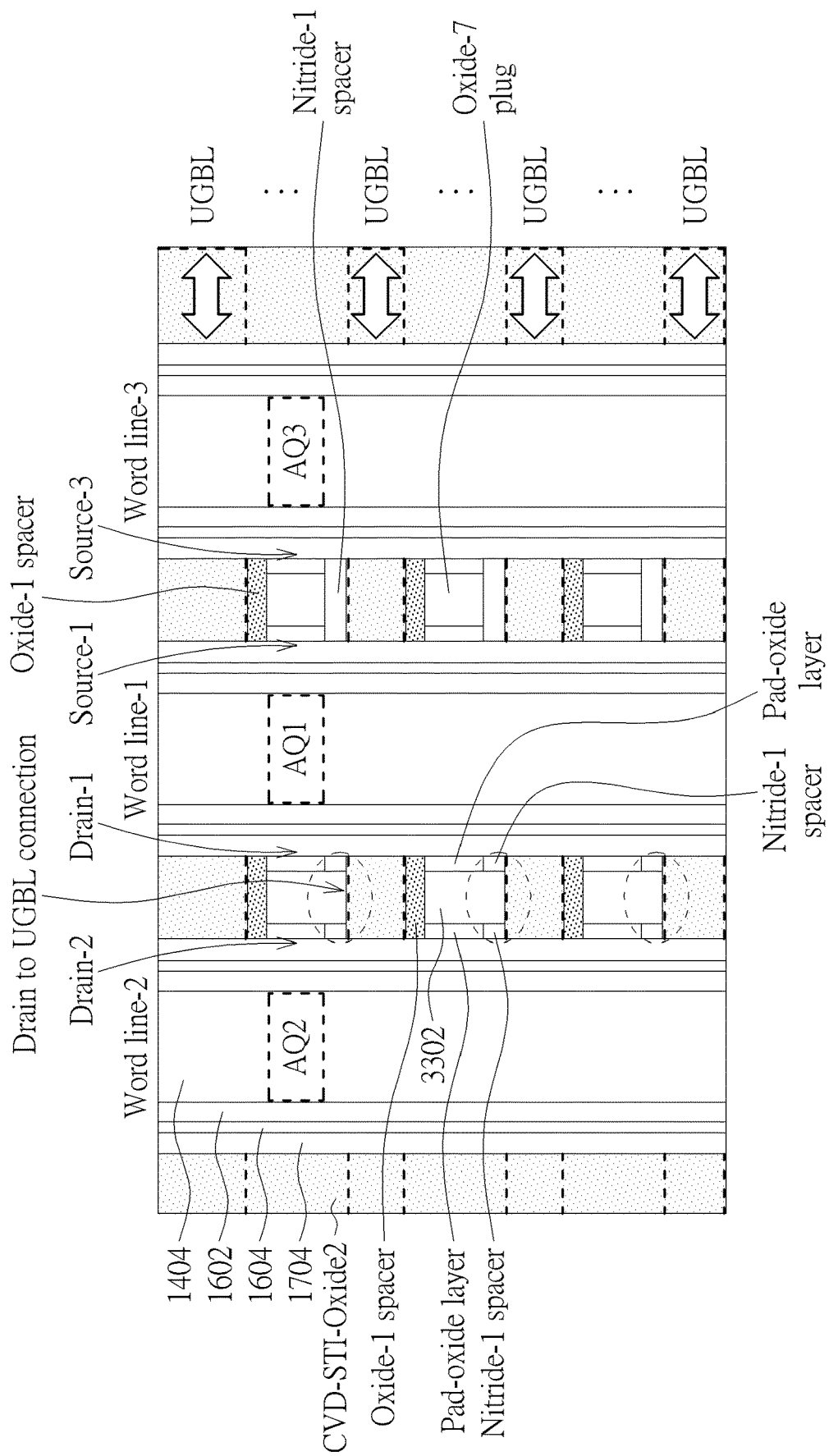
FIG. 35 is a diagram illustrating a top view of the structure of the DRAM cell array.

In Step 170, as shown in FIG. 34, all the SODs (i.e. the SOD layer 1902 and the another SOD layer 2202) are removed and the nitride-5 layer 1802 and the nitride-6 layer 2804 are removed by the isotropic etching technique (the portion of the oxide-9 layer 3302 covering the cap-oxide-1 layer 1704 may be removed as well). In addition, FIG. 35 shows a top view of the structure of the DRAM cell array which is up to the stage, especially on the geometric arrangement of the word lines (the word line-1, the word line-2, the word line-3), underground bit lines (UGBL), the source region (the source-1 and the source-3) of the access transistors AQ1, AQ3, and the drain region (the drain-1 and the drain-2) of the access transistors AQ1, AQ2.

In Step 171, as shown in FIG. 36, the metal layer (e.g. Tungsten) 3602 is deposited and etched back with its residues in a thickness well-designed to a height that is somewhat lower than the height of the composite stack (composed of the oxide-4 layer 1404 and the nitride-3 layer 1402), wherein as shown in FIG. 36, the prevailing W material pillars existing in vacancies are called as W-Buffer-Walls (WBW).

In Step 172, as shown in FIG. 37, the cap-oxide-1 layer 1704 over the polysilicon-1 spacer 1606 is removed. Then, the Polysilcon-1 spacer 1606 is etched away and further the pad-oxide layer 204 underneath the polysilicon-1 spacer is removed, and thus the HSS corresponding to the source region and the drain region (called as the seeding HSS area for source and drain regions, SHAR) is exposed, respectively.

In Step 173, as shown in FIG. 38, by using the SHAR as the seed, the selective epitaxy silicon growth technology is used to grow both the elevated source electrode EH-1S and the elevated drain electrode EH-1D, respectively, in a vertical direction above the HSS, wherein the elevated source electrode EH-1S and the elevated drain electrode EH-1D are grown to a specified height. The elevated source electrode EH-1S and the elevated drain electrode EH-1D could be the pure silicon material rather than polycrystalline or amorphous silicon materials since they are well grown gradually by using the SHAR as the seed. Both the elevated source electrode EH-1S and the elevated drain electrode EH-1D are surrounded by WBW and the oxide-5 spacer 1604 on the left sidewall and the right sidewall along the X-direction. Although the other two sidewalls along the Y-direction are widely opened, the CVD-STI-oxide2 cannot provide the seeding function for growing up the selective epitaxial silicon and therefore the selective epitaxy silicon growth should result in having some laterally over-grown pure-silicon materials which stop on the edges of CVD-STI-oxide2 and have no possibility of causing connections of the neighboring electrodes (the can be referenced to some experimental results of selective epitaxy growth of silicon materials: "A Buried Trench DRAM Cell Using a Self-Aligned Epitaxy over Trench Technology," 1988 IEEE IEDM Dig. tech. Papers, pp. 588-591, N. Lu, et al, the whole content of which is incorporated by reference herein; especially under a new step-wise growth method of achieving the elevated source electrode EH-1S and the elevated drain electrode EH-1D as will be described in the following).

The new processing design of accomplishing the elevated source electrode EH-1S and the elevated drain electrode EH-1D is described as follows: (1) By using the SHAR as the seed for growing the elevated source electrode EH-1S and the elevated drain electrode EH-1D by the selective epitaxy growth technique, it is important to design a suitable in-situ n-type doping concentration during the silicon growth to achieve a proper interface conductance of the channel region of the access transistor (which includes those conductances of the silicon surface directly underneath the gate dielectric, the HSS under the nitride-4/oxide-5 spacers and the elevated source electrode EH-1S or the elevated drain electrode EH-1D, respectively) and to achieve lower leakage currents especially on gate induced drain leakage (GIDL), drain induced barrier lowering (DIBL), sub-threshold leakage due to the short-channel effect, and junction leakages.

(2) In Step 174, as shown in FIG. 39, the oxide-5 spacer 1604 is etched by the isotopic etching technique to leave a seam between the nitride-4 spacer 1602 and the elevated drain electrode EH-1D (and between the nitride-4 spacer 1602 and the elevated source electrode EH-1S). The oxide-a layer 3902 is thermally grown to cover the elevated drain electrode EH-1D (or the elevated source electrode EH-1S) on the three side walls and its top (called as oxide-a-cap layer) except that the last fourth sidewall is bounded by the WBW. The purpose of executing such a delicate step-wise source-electrode-formation process as described in the following is to ensure a top surface of the source electrode EH-1S (or a top surface of the drain electrode EH-1D) having a high-performance oxide-silicon interface to be achieved because of the thermal oxide-a layer having very high-quality silicon-dioxide-to-silicon-electrode bonds (with no doubt any suspicion to have instead either an amorphous or a low-quality silicon material derived from the selective-epitaxy-silicon growth process which might degrade the silicon source electrode's quality of having caused either a reduced carrier mobility that might not deliver enough On-current when the access transistor is turned on or an extra amount of defects that might increase the leakage currents when the access transistor is turned off). The cap portion of the oxide-a layer 3902 then is etched by the anisotropic etching technique and to leave some oxide-a layer existing between the nitride-4 spacer and the source electrode EH-1S (or between the nitride-4 spacer and the drain electrode EH-1D).

(3) In Step 175, as shown in FIG. 40, by using the exposed silicon surfaces of the source electrode EH-1S and the drain electrode EH-1D as high-quality silicon seeds to carry out the second selective epitaxial silicon growth to grow the elevated source electrode EH-2S and the elevated drain electrode EH-2D, respectively. During the second selective epitaxial silicon growth, a well-designed heavier in-situ n+ doping concentration can be achieved in the elevated source electrode EH-2S and the elevated drain electrode EH-2D in order to be prepared for a low-resistivity connection between the elevated source electrode EH-2S (or the elevated drain electrode EH-2D) and the signal electrode of the stacked storage capacitor (SSC) which will be made later. The combination of the elevated source electrode EH-1S and the elevated source electrode EH-2S is called as the elevated source electrode EH-1+2S (similarly, the combination of the elevated drain electrode EH-1D and the elevated drain electrode EH-2D is called as the elevated drain electrode EH-1+2D). In addition, taking the elevated source electrode EH-1+2S as an example, as shown in FIG. 40, the upper portion of the elevated source electrode EH-1+2S, i.e. the elevated source electrode EH-2S, has some high-quality, n+ doped silicon material directly abutted to the nitride-4 spacer 1602 on one sidewall and the opposite sidewall is abutted to WBW, and the other two sidewalls are widely open on the Y-direction along the longitudinal word line. The height of the elevated source electrode EH-1+2S (the height of the elevated drain electrode EH-1+2D) is well designed to be lower than that of the nitride-4 spacer.

In summary, the elevated source electrode EH-1+2S has been formed with its lower portion EH-1S having an appropriate n-type doping concentration to form, vertically to the HSS (or SHAR), a self-aligned n-to-p junction which establishes a horizontal channel connection to the channel region under the gate structure of the access transistor (likewise for the elevated drain electrode EH-1+2D on the other side of the channel region). The elevated source electrode EH-1+2S has its upper portion EH-2S grown with a heavier n+ doping concentration so as to complete a self-aligned, vertical low-resistance interconnection to the storage-signal-electrode of the storage capacitor (also likewise for the elevated drain electrode EH-1+2D). Since the elevated source (or drain) electrode EH-1+2S (or EH-1+2D) is formed by selective epitaxial silicon growth, the doping concentration is easily controlled, such as gradually increase or decrease, stepwise increased or decreased, etc. Furthermore, it is unnecessary to use ion implantation for doping. In Step 176, as shown in FIG. 41, the WBW is etched away on the entire wafer surface (without hurting other materials over the surface topography and some other materials embedded underneath either surface oxide layers and surface nitride layers as protection layers).

In Step 177, as shown in FIG. 42, the composite layer of the high-K dielectric insulator material for the storage capacitor (called as the high-K-dielectric-insulator-1 4202 for-capacitor) is formed on surfaces of the exposed bare silicon areas which include the three sidewalls of the EH-2 electrodes (i.e. the elevated source electrode EH-2S and the elevated drain electrode EH-2D) of all EH-1+2 electrodes (i.e. the elevated source electrode EH-1+2S and the elevated drain electrode EH-1+2D) and one sidewall (that was blocked by the WBW and is now exposed together with the extension on the EH-2 electrodes) of all EH-1 electrodes (i.e. the elevated source electrode EH-1S and the elevated drain electrode EH-1D), respectively, as well as on the top surfaces of the EH-2 electrodes (called high-K-cap-1). As shown in FIG. 42, the high-K-dielectric-insulator-1 4202 includes horizontal high-K-cap-1 4204 (could include high-K-cap-1-source which is over the elevated source electrode EH-2S or high-K-cap-1-drain which is over the elevated drain electrode EH-2D) and vertical spacer portion 4206 (such as high-K-dielectric-insulator-1 spacer).

In Step 178, as shown in FIG. 43, the thick metal layer (such as Tungsten) 4302 is deposited and etched back to remain with its residues of some thickness well-designed to result in a height as slightly taller than the EH-1+2 electrodes (i.e. the elevated source electrode EH-1+2S and the elevated drain electrode EH-1+2D) but about the height like the nitride-4 spacer. The metal layer 4302 prevailing on the wafer surface is called as metal-counter-electrode-plate&wall-1 (MCEPW-1). The MCEPW-1 covers the high-K-cap-1 of the high-K-dielectric-insulator-1 4202 over the EH-1+2 electrodes but may cover the top surfaces of the oxide-4 layer 1404 of the composite stack and the nitride-4 spacer.

In Step 179, as shown in FIG. 44, the high-K-dielectric-insulator-1 over the oxide-4 layer 1404 is removed by the anisotropic etching technique and then the oxide-4 layer 1404 which is the top layer of the composite stack is etched away without damaging the high-K-cap-1 and the high-K-dielectric-insulator-1 covered by the MCEPW-1. So there exists a canal-like concave region above the composite word line that has nitride-4 spacers on two sides which have their upper portions with heights above the thickness of the nitride-3 layer 1402 and are standing taller like fences but exposed on the direction of facing the concave regions.

In Step 180, as shown in FIG. 45, some well-designed thickness of the upper portion of the nitride-3 layer 1402 above the composite word line is removed by the isotropic etching technique. At the same time the upper portion of the nitride-4 spacer 1602 is also removed by the isotropic etching technique so that the remaining top surface of the nitride-4 spacer 1602 and the top surface of the nitride-3 Layer 1402 are made to be leveled equally with a horizontal flat surface of both the nitride-3 Layer 1402 and the nitride-4 spacer 1602. A silicon sidewall of the upper portion of the EH-2 electrodes facing to the nitride-4 spacer is exposed due to the isotropic etching technique which causes that the height of the nitride-4 spacer 1602 was lowered after the nitride-4 spacer 1602 lost its upper portion.

In Step 181, as shown in FIG. 46, by using the exposed silicon sidewall of the EH-2 electrodes (i.e. the elevated source electrode EH-2S and the elevated drain electrode EH-2D) facing to the word line direction, the selective epitaxial silicon growth technique is used to grow the n+ in-situ heavily-doped silicon material both laterally over the nitride-3 layer 1402 (the reason for only having a lateral growth is that the MCEPW-1 covers the high-K-cap-1 and other areas outside the word line with the nitride-4 spacer). By taking the word line-1 as a reference, there are the elevated source electrode EH-1+2S on one side of the word line-1 and the elevated drain electrode EH-1+2D on the other side of the word line-1, respectively. Under a well calculated design, both the laterally grown epitaxial silicon from the elevated source electrode EH-2S (called as LGS-2S) and the laterally grown epitaxial silicon from the elevated drain electrode EH-2D (called as LGS-2D) meet each other at the center of the word line-1. This entire laterally grown epitaxial silicon layer on the top surface of the nitride-3 layer 1402 forms a base of the signal electrode of the SSC (called as seeding base for growing storage-electrode tower, SBSET) which is connected to both the elevated source electrode EH-2S and the elevated drain electrode EH-2D and provides the best seeds for further silicon growth to a tall signal electrode.

As shown in FIG. 46, after the LGS-2D and LGS-2S (or SBSET) are formed, on top surface of the elevated source electrode EH-1+2S and the elevated drain electrode EH-1+2D, respectively, there are MCEPW-1 covering high-K-cap-1 and other areas except the LGS-2D and LGS-2S (or SBSET). In Step 182, as shown in FIG. 47, the thin oxide-b layer 4702 is grown thermally on top surface of the SBSET since the rest of the wafer surface which is covered by the nitride-3 layer 1402 over the longitudinal word lines and by MCEPW-1 could not be able to grow thermally any extra oxide layer; then the oxide-10 layer 4704 is deposited and etched back to have a flat planar surface as shown in FIG. 47.

In Step 183, as shown in FIG. 48, use a photolithography masking technique to deposit the photoresist layer 4802 to cover some part of the oxide-b layer 4702 adjacent to the side of the LGS-2S and the high-K-cap-1-source (which is part of the high-K-dielectric-insulator-1 4202) on top surface of the elevated source electrode EH-2S but to expose three other regions labeled as the high-K-cap-1-drain (which is part of the high-K-dielectric-insulator-1 4202) over the elevated drain electrode EH-2D, the MCEPW-1 on top surface of the elevated drain electrode EH-2D and some oxide-b layer on top surface of the silicon seeding areas adjacent to the side of the LGS-2D of both the access transistor AQ1 and the access transistor AQ2, respectively.

In Step 184, as shown in FIG. 49, the exposed MCEPW-1 on the drain region is partially etched to result in the Tungsten plug (called as the Tungsten-a 4902) and some high-K-dielectric-insulator-1 4202 is also to etched away to result in the high-K-dielectric-insulator-1*a* spacer 4904 leveled in the height as that of the Tungsten-a 4902 by some specially-designed etching technique, wherein Step 184 results in exposing the upper portions of the elevated drain electrode EH-1+2D, which have exposed silicon material of the LG-2D.

In Step 185, as shown in FIG. 50, some upper part of the elevated drain electrode EH-2D which is silicon material below the bottom edge of the SESBT is etched away by the anisotropic etching technique to etch away. Then, the photoresist 4802 is removed and then the thin oxide-c layer 5002 is thermally grown over the top surface of the elevated drain electrode EH-2D in order to form an insulator which can avoid any electrical connection from the elevated drain electrode EH-2D to the SBSET (since after forming an opening portion on top surface of the elevated drain electrode EH-2D to expose n+ doped silicon material, a thermal oxidation to react with silicon creates a high-quality silicon dioxide film, the oxide-c layer 5002, which does fully seal any possible connection of the elevated drain electrode EH-2D to the SBSET). Afterwards the oxide-c1 layer 5004 is deposited and etched back to be leveled in the height as that of the oxide-b layer 4702.

In Step 186, as shown in FIG. 51, the MCEPW-1 4302 is removed wherever it is exposed except the Tungsten-a 4902 well protected by the oxide-c1 layer 5004.

In Step 187, as shown in FIG. 52, then the exposed high-K-dielectric-insulator-1 4202 on all planar surfaces is etched away by the anisotropic etching technique but leave the high-K-dielectric-insulator-1 spacer.

In Step 188, as shown in FIG. 53, the SOD layer 5302 is deposited to fill in the vacancy on the side above the oxide-7 plug and then the SOD layer 5302 is etched back to achieve planar areas.

In Step 189, as shown in FIG. 54, the upper parts of the oxide-b layer 4702, the oxide-10 layer 4704, and the oxide-c1 layer 5004 over the height of the SBSET are removed by the anisotropic etching technique to expose the remaining SBSET, and the SOD layer 5302 is etched away.

In Step 190, as shown in FIG. 55, by taking both the SBSET and the exposed silicon on the upper portion of the EH-2 electrodes (i.e. the elevated source electrode EH-2S) as seeds, the sufficiently tall, the heavily n+ in-situ-doped silicon tower 5502 is grown by utilizing the selective epitaxial silicon growth technique, wherein the heavily n+ in-situ-doped silicon tower 5502 acts as a signal-tower storage electrode of the storage capacitor (called as STSEC-1).

In Step 191, as shown in FIG. 56, then the high-K-dielectric-insulator-2 5602 (such as by an Atomic layer deposition (ALD) method) is formed to cover all sidewalls and the top surface of the STSEC-1 without allowing any possible electrical connection or leakage mechanisms from the exposed n+ doped silicon signal electrodes to the metal counter-electrode plate which will be formed soon.

In Step 192, as shown in FIG. 57, the thick metal (e.g. Tungsten W) layer 5702 is deposited, wherein the metal layer 5702 wraps up all STSEC-1 sidewalls and other valley-like areas over the HSS into a planar plateau and is called as MCEPW-2. The MCEPW-2 5702 can serve as not only a counter-electrode plate biased at a constant voltage level such as half-VCC but also a metal shielding plate which can also achieve better thermal dissipation like a metal heat sink and further reduce noises or improve noise immunity away from the word lines and the gate structures of the access transistors since the electric fields can be more evenly distributed and shielded across the capacitor plates. FIG. 57 shows the newly invented DRAM cell of a vertically integrated 1C-over-1T structure by self-alignment processes as described above, which creates one of world's most dense and effective DRAM cell structure of using a more effective planar silicon-die area and simultaneously optimizing the volume integration of the 1T1C function by overlapping the tower-like storage capacitor over the access transistor (named as ToT Cell, i.e. Tower-like capacitor over Transistor Cell). Because of very effectively adopting both vertical and horizontal self-alignment techniques of structuring and shaping the geometries of the essential micro-structures built inside the ToT Cell to meet such requirements as word line, bit line, transistor (gate, source, drain, and substrate), storage capacitor (signal electrode and counter-electrode plate) and all contact holes and interconnections among these micro-structures, the new ToT Cell structure can reserve the merit of at least 6 to 10 square units (each square unit is a unit length times a unit width measured as so-called each unit as the allowed minimum feature size which can be printed on a planar silicon surface, for example, 5 nanometers even when the minimum feature size is much less than 10 nanometers, which distinguishes the ToT Cell from the state-of-the-art cell structures.

Some additional inventive points on structure enhancements and processing methods thereof can be added in the following. That is, if the storage capacitance is needed to be further increased, then some extra steps can be used to increase the height of the STSEC. In Step 193, starting from the structure show in FIG. 58, the MCEPW-2 5702 is etched back to a height lower than that of the storage electrode (i.e. the STSEC-1 5502). Then the high-K-dielectric-insulator-2 5602 on the top surface of the STSEC-1 5502 is etched away by the anisotropic etching technique and only the high-K-dielectric-insulator-2 5602 surrounding the STSEC-1 5502 is kept.

In Step 194, as shown in FIG. 59, by taking the exposed silicon material on top surface of the STSEC-1 5502 as seeds, the taller, heavily n+ in-situ-doped silicon tower 5902 (called as STSEC-2) as a signal electrode of the storage capacitor is grown by utilizing the selective epitaxial silicon growth technique. Then the high-K-Dielectric-Insulator-3 5904 is formed to cover all sidewalls and the top surface of the STSEC-2 5904 without allowing any possible electrical connection or leakage mechanisms from the exposed n+ doped silicon signal electrodes to the MCEPW-2.

In Step 195, as shown in FIG. 60, the photoresist 6002 is formed to cover all the cell array area except exposing the edge areas of the MCEPW-2 5702. In Step 196, as shown in FIG. 61, then the high-K-dielectric-insulator-3 5904 on the exposed edge areas of the MCEPW-2 5702 is etched away. In Step 197, as shown in FIG. 62, then the photoresist 6002 is removed.

In Step 198, as shown in FIG. 63, the thick metal (e.g. Tungsten W) layer 6302 is deposited, wherein the metal layer 6302 wraps up all STSEC-2 sidewalls and other valley-like areas over the silicon surface into a planar plateau and is called as MCEPW-3. The MCEPW-3 6302 plus the existing MCEPW-2 5702 with their edge areas all connected can serve well not only as a counter-electrode plate (of the storage capacitor) biased at a constant voltage level such as half-VCC but also a metal shielding plate which can achieve better thermal dissipation like a metal heat sink and can reduce noises or improve noise immunity away from the word lines and the gate structures of the access transistors since the electric fields can be more evenly diversified and distributed and shielded across the capacitor plates. FIG. 63 shows the newly invented ToT DRAM cell of a vertically integrated 1C-over-1T structure with a taller capacitor to enlarge the storage capacitance.

In summary, the invention presents a new architecture of DRAM cell which not only compacts the size of the DRAM cell but also enhances the signal-to-noise ratio during the DRAM operation. Since the capacitor is located over the access transistor and largely encompasses the access transistor as well as inventing both vertical and horizontal self-alignment techniques of arranging and connecting the geometries of these essential micro-structures in the DRAM cell, the new ToT DRAM cell architecture can reserve the merit of at least 6 to 10 square units even when the minimum physical feature size is much less than 10 nanometers.

Furthermore, the metal electrode of the capacitor in the new DRAM cell architecture offers an efficient route for heat dissipation and so the temperature of the DRAM cell during the operation could be lower accordingly, such lower temperature will then reduce both the leakage currents from the capacitor and the thermal/operational noises. Additionally, the metal electrode further encompasses the word line passing through the access transistor, and the combination of such encompassed word lines with the underground bit lines (UGBLs) made below the silicon surface could effectively shield the cross-coupling noises among different word lines/bit lines, and thus the problematic pattern sensitivity issue in traditional DRAM cell array operations could be dramatically reduced.

Moreover, the GIDL leakage could also be reduced due to the well-designed transistor structure, and the combination of such reduced GIDL leakage with the reduced leakage derived from the lower operation temperature could further enlarge the signal-to-noise ratio and effectuate the possibility of using a much smaller size of the capacitor in the ToT DRAM cell without negatively impacting the reliability of the stored data.

Besides, the UGBL below the silicon surface of the present invention can flexibly lower the resistivity and capacitance of the bit lines, therefore, the signal sensitivity during the charge sharing period between the capacitor and the bit line could be improved and thus the operation speed of the new architecture of ToT DRAM cell could be enhanced as well.

Figure 64:
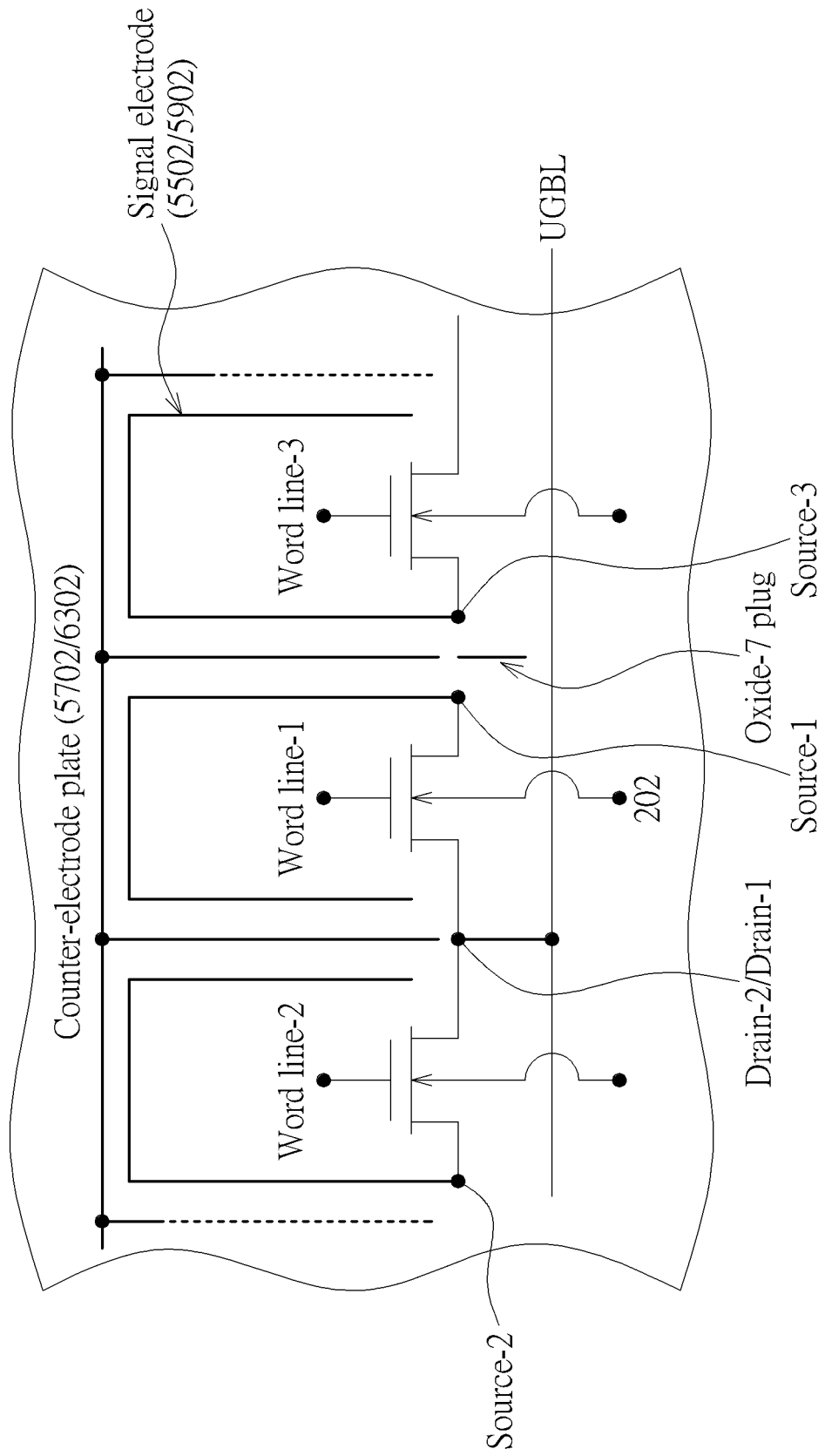
FIG. 64 is a diagram illustrating a sketched structure of the new ToT Cell.

In summary, the present invention of the new ToT Cell is sketched in FIG. 64, wherein FIG. 64 corresponds to FIG. 63. In contrast to the-state-of-art DRAM cell structure, the new ToT Cell structure reveals the following features to help achieve a cell size about 6 to 10 square units (or 6~10 $\lambda^2$) when $\lambda$ is equal to or below 10 nanometers: (1) the signal electrode of the storage capacitor encompassing the access transistor, (2) the counter-electrode plate encompassing the access transistor and covering the entire cell array, (3) an underground bit line below the HSS to reduce the cell topography, (4) self-aligned elevated source electrode with adjustable conductance to the edge of the channel for minimizing cell leakages, (5) self-aligned signal electrode extended from the elevated source and riding over the access transistor like a saddle with self-aligned capacitor tower, (6) most cell features scalable with proven materials and processing steps with sufficient reliability and quality.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A memory cell structure comprising:
a silicon substrate with a silicon surface;
a transistor coupled to the silicon surface; comprising a gate structure, a first conductive region, and a second conductive region;
a bit line electrically coupled to the first conductive region of the transistor and positioned under the silicon surface;
a capacitor over the transistor and electrically coupled to the second conductive region of the transistor, wherein a lower electrode of the capacitor directly covers a top side of the gate structure of the transistor; and
a first spacer covering a first side of the gate structure and positioned above the silicon surface; and a second spacer covering a second side of the gate structure and positioned above the silicon surface; wherein the first conductive region of the transistor extends upward from the silicon surface and abuts against the first spacer, and the second conductive region of the transistor extends upward from the silicon surface and abuts against the second spacer.

2. The memory cell structure of claim 1, wherein the capacitor encompasses at least a top side and a sidewall of the transistor.

3. The memory cell structure of claim 1, wherein the bit line is electrically coupled to the first conductive region of the transistor through a bridge contact, the bridge contact is positioned under the silicon surface and a first sidewall of the bridge contact is aligned with an edge of the bit line, and the bridge contact comprises an upper portion and a lower portion, the upper portion of the bridge contact abuts against the silicon substrate, and the lower portion of the bridge contact is separated from the silicon substrate by a first isolating layer.

4. The memory cell structure of claim 1, further comprising:
a word line extended beyond the transistor and coupled to the gate structure of the transistor, wherein the word line comprises an upper portion which is above the silicon surface, and a sidewall of the upper portion of the word line is aligned with a sidewall of the gate structure.

5. The memory cell structure of claim 4, wherein the transistor further comprises a dielectric layer encompassing the word line and the gate structure.

6. The semiconductor device structure of claim 5, wherein at least part of the gate structure extends downward from the silicon surface.

7. A memory cell structure comprising:
a silicon substrate with a silicon surface;
a transistor coupled to the silicon surface; comprising a gate structure, a first conductive region, a second conductive region;
a bit line electrically coupled to the first conductive region of the transistor, wherein the bit line is positioned under the silicon surface and electrically coupled to the first conductive region of the transistor through a bridge contact, and the bridge contact is positioned under the silicon surface and a first sidewall of the bridge contact is aligned with an edge of the bit line; and
a capacitor electrically coupled to the second conductive region of the transistor and encompassing the transistor.

8. The memory cell structure of claim 7, wherein the capacitor comprises a first portion vertically stacked above a top side of the transistor and second portion abutted against a sidewall of the transistor.

9. The memory cell structure of claim 7, wherein the bridge contact comprises an upper portion and a lower portion, the upper portion of the bridge contact abuts against the silicon substrate, and the lower portion of the bridge contact is separated from the silicon substrate by a first isolating layer.

10. The memory cell structure of claim 9, wherein the first isolating layer at least covers a first sidewall, a second sidewall and a bottom of the lower portion of the bridge contact.

11. The memory cell structure of claim 9, wherein the upper portion of the bridge contact comprises a metal region and a doped semiconductor region surrounding the metal region, and the doped semiconductor region abuts against the silicon substrate.

12. The memory cell structure of claim 7, wherein the bridge contact is positioned under the silicon surface and a first dielectric cap covers a top surface of the bridge contact.

13. The memory cell structure of claim 12, wherein the transistor further comprises a first spacer and a second spacer, the first spacer covering a first side of the gate structure and positioned above the silicon surface, and the second spacer covering a second side of the gate structure and positioned above the silicon surface; wherein the first conductive region of the transistor extends upward from the silicon surface and abuts against the first spacer, and the second conductive region of the transistor extends upward from the silicon surface and abuts against the second spacer.

14. The memory cell structure of claim 13, further comprising:
a second dielectric cap covering a top surface of the first conductive region of the transistor.

15. A memory cell structure comprising:
a silicon substrate with a silicon surface;
a transistor coupled to the silicon surface; comprising a gate structure, a first conductive region, a second conductive region, a dielectric cap, and a spacer, wherein the dielectric cap is vertically stacked on the gate structure, the spacer covers a side wall of the gate structure, and the second conductive region of the transistor extends upward from the silicon surface and abuts against the spacer; and
a capacitor over the transistor and coupled to the second conductive region of the transistor, wherein the capacitor comprises a first portion and a second portion, the first portion of the capacitor is vertically positioned on the dielectric cap and the second portion of the capacitor abuts against the second conductive region;
wherein a planar size of the memory cell structure is smaller than 10 times $\lambda^2$, wherein $\lambda$ is a minimum feature size and the minimum feature size is equal to or below 10 nm.

16. A memory cell structure formed between a bridge contact and an isolation trench, the bridge contact and at least a portion of the isolation trench being under a silicon surface of a silicon substrate, and the memory cell structure coupled to a word line and a bit line, the memory cell structure comprising:
a transistor coupled to the silicon surface; comprising a gate structure, a first conductive region, a second conductive region; and
a capacitor over the transistor and coupled to the second conductive region of the transistor;
wherein the bit line is disposed under the silicon surface and a lower portion of the bridge contact abuts against the bit line, an upper portion of the bridge contact abuts against portion of the silicon substrate, and a first sidewall of the bridge contact is aligned with a lateral edge of the bit line.

17. The memory cell structure of claim 16, wherein the word line extends beyond the transistor and coupled to the gate structure of the transistor, the word line comprises an upper portion which is above the silicon surface and a sidewall of an upper portion of an interconnection line is aligned with a sidewall of the gate structure.

18. The memory cell structure of claim 17, wherein the capacitor further comprises a metal electrode, a first portion of the metal electrode is vertically positioned on the isolation trench.

19. The memory cell structure of claim 18, wherein the capacitor further comprises a dielectric layer encompassed by the metal electrode, a first portion of the dielectric layer abuts against the second conductive region and the first portion of the metal electrode.

20. The memory cell structure of claim 19, wherein an extension direction of the first portion of the metal electrode is parallel to a normal direction of the silicon substrate, an extension direction of the first portion of the dielectric layer is parallel to the normal direction of the silicon substrate, and an extension direction of the second conductive region is parallel to the normal direction of the silicon substrate.

* * * * *